(12) United States Patent
Wang et al.

(10) Patent No.: US 9,644,939 B2
(45) Date of Patent: May 9, 2017

(54) SINGLE-POSITION HALL EFFECT MEASUREMENTS

(75) Inventors: Fei Wang, Soborg (DK); Dirch Hjorth Petersen, Dyssegard (DK); Ole Hansen, Horsholm (DK)

(73) Assignee: CAPRES A/S, Lyngby (DK)

( * ) Notice: Subject to any disclaimer, the term of this patent is extended or adjusted under 35 U.S.C. 154(b) by 571 days.

(21) Appl. No.: 13/996,968

(22) PCT Filed: Dec. 21, 2011

(86) PCT No.: PCT/DK2011/000156
§ 371 (c)(1),
(2), (4) Date: Sep. 27, 2013

(87) PCT Pub. No.: WO2012/083955
PCT Pub. Date: Jun. 28, 2012

(65) Prior Publication Data
US 2014/0015552 A1 Jan. 16, 2014

(30) Foreign Application Priority Data

Dec. 21, 2010 (EP) .................................... 10196137
Mar. 8, 2011 (EP) .................................... 11157330

(51) Int. Cl.
*G01B 7/14* (2006.01)
*G01R 31/26* (2014.01)
(Continued)

(52) U.S. Cl.
CPC ........... *G01B 7/14* (2013.01); *G01R 31/2648* (2013.01); *G01R 31/2831* (2013.01); *H01L 22/14* (2013.01); *H01L 22/34* (2013.01)

(58) Field of Classification Search
None
See application file for complete search history.

(56) References Cited

U.S. PATENT DOCUMENTS 3,735,254 A   5/1973   Severin
4,857,839 A   8/1989   Look et al.
(Continued)

FOREIGN PATENT DOCUMENTS

CH         682017           6/1993
WO     WO2007/045246        4/2007
(Continued)

OTHER PUBLICATIONS

Osterberg, F. W. et al.; "Accurate micro Hall Effect measurements on scribe line pads"; Advanced Thermal Processing of Semiconductors, 2009; Rtp. '09; 17$^{th}$ International Conference On, IEEE, Piscataway, NJ, USA; Sep. 29, 2009; pp. 1-6; XP031595915.
(Continued)

*Primary Examiner* — Melissa Koval
*Assistant Examiner* — Felicia Farrow
(74) *Attorney, Agent, or Firm* — Klein, O'Neill & Singh, LLP

(57) ABSTRACT

A method for determining an electrical property of a test sample having a conductive surface portion with an electrical boundary includes (a) determining a first distance between the single position and the boundary by (1) contacting the test sample with a first four-contact configuration of a multi-contact probe at the single position; (2) applying a magnetic field at the single position; (3) measuring first and second resistances from which to calculate a first resistance difference; (4) measuring third and fourth resistances from which to calculate a second resistance difference; (5) defining a first relation including parameters representing the first and second resistance differences and the first distance; (6) determining the first distance by using the first and second resistance differences in the first relation; (b) repeating steps (1)-(6) with a second four-contact configuration to determine a second distance between the single (Continued)

position and the boundary; (c) defining a second relation including the electrical property and a fourth parameter representing the second distance; and (d) employing the second distance as the fourth parameter in the second relation for determining the electrical property.

10 Claims, 12 Drawing Sheets

(51) Int. Cl.
   *G01R 31/28* (2006.01)
   *H01L 21/66* (2006.01)

(56) References Cited

U.S. PATENT DOCUMENTS

| 5,150,042 A | 9/1992 | Look et al. |
| 5,797,114 A | 8/1998 | Roberts et al. |
| D614,151 S | 4/2010 | Petersen |
| 2005/0052191 A1 | 3/2005 | Prussin |

FOREIGN PATENT DOCUMENTS

| WO | WO2007/051471 | 5/2007 |
| WO | WO2009030230 | 3/2009 |

OTHER PUBLICATIONS

Petersen, Dirch H. et al.; "Micro-four-point probe Hall effect measurement method"; Journal of Applied Physics, American Institute of Physics; New York, US; vol. 104, No. 1, pp. 13710-13710; Jul. 11, 2008; XP012116326.

Stojanovic G. et al.; "Important Role of the Hall Effect Measurement System in a Modified Course of Materials in Electrical Engineering"; IEEE Transactions on Education, IEEE Service Center, Piscataway, NJ, US; vol. 52, No. 3, pp. 297-304; Aug. 1, 2009; XP011268639.

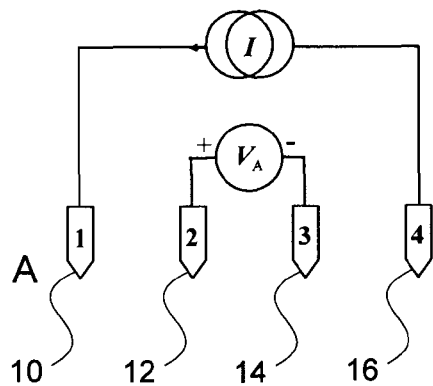
FIG.3A(1)
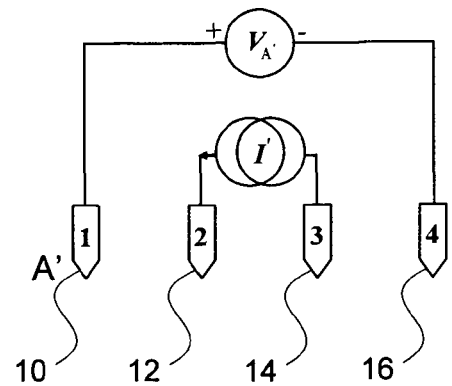
FIG.3A(2)
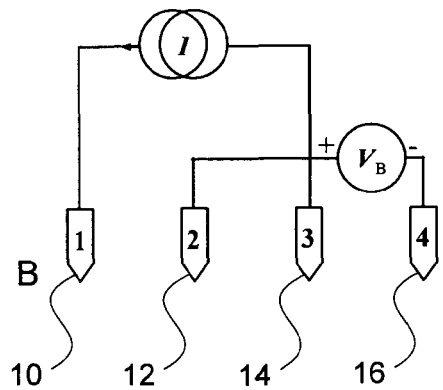
FIG.3B(1)
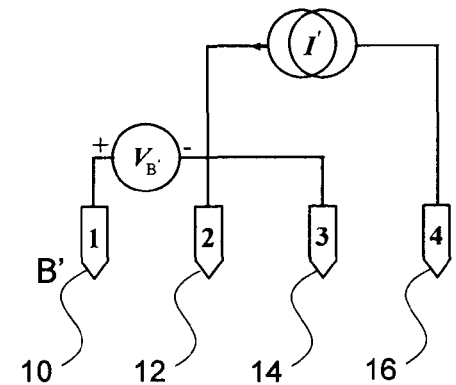
FIG.3B(2)
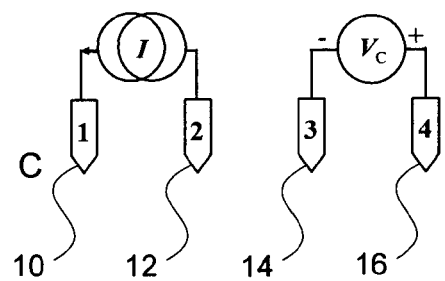
FIG.3C(1)
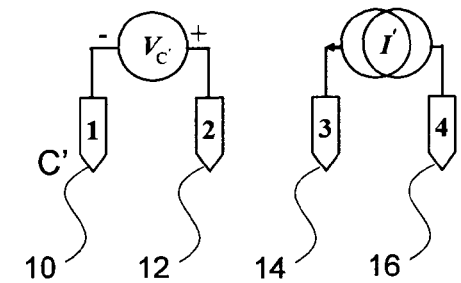
FIG.3C(2)

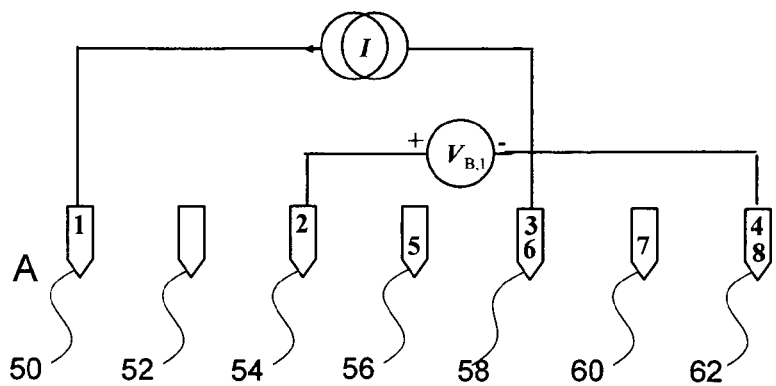
FIG.8A(1)
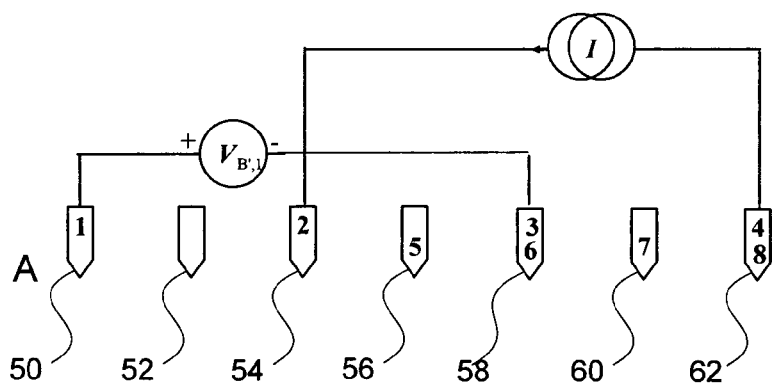
FIG.8A(2)
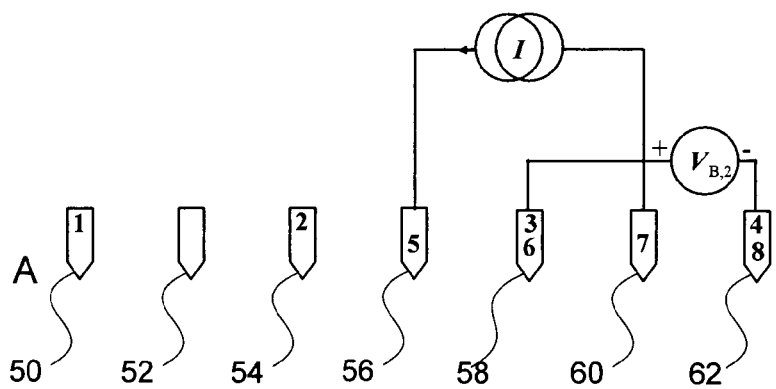
FIG.8A(3)
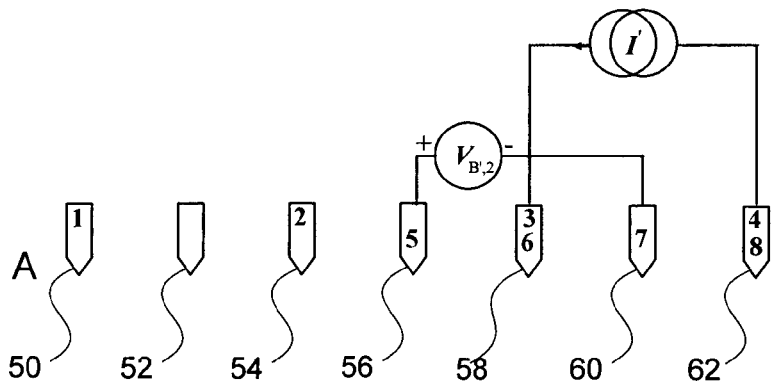
FIG.8A(4)

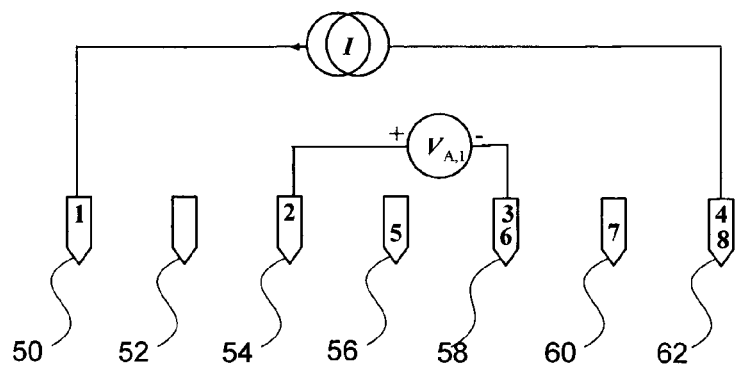
FIG.8B(1)
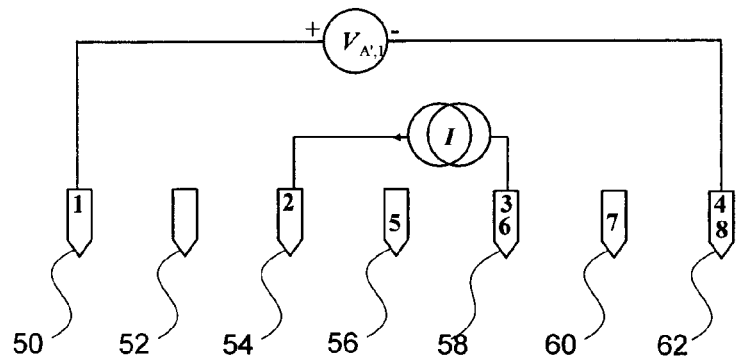
FIG.8B(2)
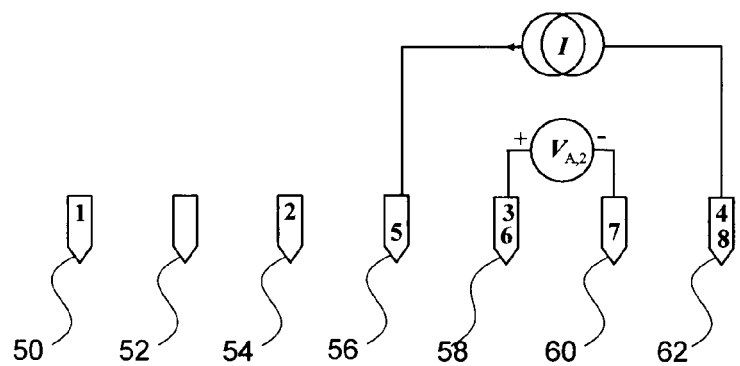
FIG.8B(3)
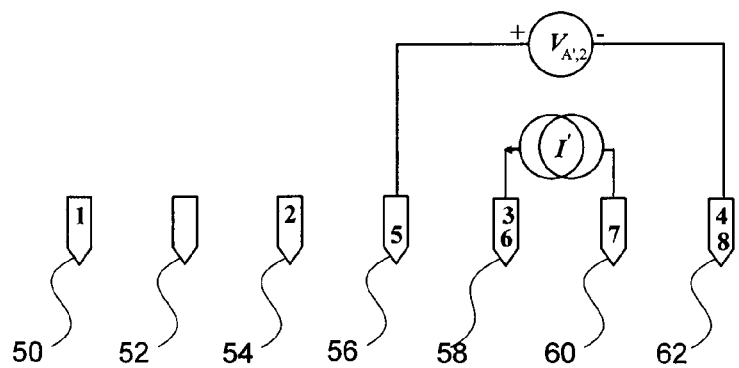
FIG.8B(4)

SINGLE-POSITION HALL EFFECT MEASUREMENTS

CROSS-REFERENCE TO RELATED APPLICATION

This application is a national phase filing, under 35 U.S.C. §371(c), of International Application No. PCT/DK2011/000156, filed on Dec. 21, 2011, the disclosure of which is hereby incorporated by reference in its entirety.

FEDERALLY SPONSORED RESEARCH OR DEVELOPMENT

Not Applicable

BACKGROUND

In semiconductor processing, it has become more and more important and also difficult to characterize material properties along with the continuous down-scaling of the critical dimensions. Sheet materials such as ultra-shallow junctions are widely used, and sheet resistance measurement has been developed for the study of these. In addition to the sheet resistance of film materials, the sheet carrier density and the mobility are also important properties for the performance of semiconductor device, e.g. in complementary metal-oxide-semiconductor (CMOS) transistors. However, most of the present measurement methods for determining the sheet resistance, the sheet carrier density, and the sheet carrier mobility require either special sample preparation or destructive machining of the sample. Some measurement methods also require several engagements between a probe and a test sample, which impairs the efficiency of the methods.

In order to characterize the sheet carrier density and the mobility of sheet materials, a fast, cheap, and non-destructive method is therefore desired. There are several methods employing microscopic multi-point probes produced by silicon-based micro-fabrication technology that can be used for the sheet resistance measurements. In WO2007045246A1 it has been shown that Hall effect measurement can be made with an in-line micro four-point probe to measure the sheet resistance, the sheet carrier density, and the Hall mobility. However, the method demands two measurement points, i.e. two different engagements between probe and test sample, which can cause large measurement errors when the electrical property is not ideally homogeneous across the sample under test.

It is an object of the present invention to improve the accuracy and reduce the time of determining an electrical property of a test sample. In particular, it is an object of the present invention to improve the accuracy and reduce the time of determining an electrical property that depends on the distance to an electrical boundary of the test sample. According to the present invention, only one measurement point, i.e. one engagement between probe and test sample, is necessary in a Hall effect measurement. This will reduce the measuring time significantly and provide more accurate results for electrical transport properties of thin films.

The object of the invention is achieved according to a first aspect of the invention by a first position on an electrically conducting surface portion of a test sample and an electrical boundary of the electrically conducting surface portion by a multi-point probe comprising a first contact element, a second contact element, a third contact element, and a fourth contact element, each contact element defining a contact point for establishing an electrical contact with the test sample, the method comprising: (i.i) contacting the test sample with the first contact element, the second contact element, the third contact element, and the fourth contact element at the first position on the electrically conducting surface portion, (i.ii) applying a magnetic field having a major field component perpendicular to the electrically conducting surface portion at the first position, (i.iii) applying a first electrical potential across the first and third contact elements for generating a first current in the surface portion at the first position, (i.iv) measuring the first current through the first or the third contact element, (i.v) measuring a first voltage across the second and fourth contact elements, (i.vi) calculating a first resistance value ($R_B$) based on the first current and the first voltage, (i.vii) applying a second electrical potential across the second and fourth contact elements for generating a second current in the surface portion at the first position, (i.viii) measuring the second current through the second or the fourth contact element, (i.ix) measuring a second voltage across the first and third contact elements, (i.x) calculating a second resistance value ($R_{B'}$) based on the second current and the second voltage, (i.xi) calculating a first resistance difference ($\Delta R_{BB'}$) based on the difference between the first resistance value and the second resistance value, (i.xii) applying a third electrical potential across the first and second contact elements for generating a third current in the surface portion at the first position, (i.xiii) measuring the third current through the first or the second contact element, (i.xiv) measuring a third voltage across the third and fourth contact elements, (i.xv) calculating a third resistance value ($R_C$) based on the third current and the third voltage, (i.xvi) applying a fourth electrical potential across the third and fourth contact elements for generating a fourth current in the surface portion at the first position, (i.xvii) measuring the fourth current through the third or the fourth contact element, (i.xviii) measuring a fourth voltage across the first and second contact elements, (i.xix) calculating a fourth resistance value ($R_{C'}$) based on the fourth current and the fourth voltage, and (i.xx) calculating a second resistance difference ($\Delta R_{CC'}$) based on the difference between the third resistance value and the fourth resistance value, or in an alternative replacing steps (i.xii) to (i.xx) with: the multi-point probe comprising a plurality of contact elements, each contact element defining a contact point for establishing an electrical contact with the test sample, the plurality of contact elements comprising the first contact element, the second contact element, the third contact element, the fourth contact element and one or more additional contact elements, (ii.xii) defining a first configuration of contact elements of the plurality of contact elements, the first configuration of contact elements being composed of the first contact element, the second contact element, the third contact element, and the fourth contact element, (ii.xiii) defining a second configuration of contact elements of the plurality of contact elements, the second configuration of contact elements being composed of a fifth contact element, a sixth contact element, a seventh contact element, and an eighth contact element, at least one contact element of the second configuration of contact elements being a contact element of the one or more additional contact elements, (ii.xiv) contacting the test sample with the contact elements of the second configuration of contact elements at the first position on the electrically conducting surface portion at the same time as contacting the test sample with the contact elements of the first configuration of contact elements, (ii.xv) applying a third electrical potential across the fifth and seventh contact elements for generating a third current in the surface portion at the first position, (ii.xvi) measuring the third current through the fifth or the seventh contact element, (ii.xvii) measuring a third voltage across the sixth and eighth contact elements, (ii.xviii) calculating a third resistance value ($R_{B,2}$) based on the third current and the third voltage, (ii.xix) applying a fourth electrical potential across the sixth and eighth contact elements for generating a fourth current in the surface portion at the first position, (ii.xx) measuring the fourth current through the sixth or the eighth contact element, (ii.xxi) measuring a fourth voltage across the fifth and seventh contact elements, (ii.xxii) calculating a fourth resistance value ($R_{B',2}$) based on the fourth current and the fourth voltage, and (ii.xxiii) calculating a second resistance difference ($\Delta R_{BB',2}$) based on the difference between the third resistance value and the fourth resistance value, and both the alternative including the steps (i.xii) to (i.xx) and the alternative including the steps (ii.xii) to (ii.xxiii) further comprising: (i.xxi) defining a first relation (f) including a first, a second, and a third parameter representing the first resistance difference, the second resistance difference, and the distance between the first position and the electrical boundary, respectively, and (i.xxii) employing the first and second resistance differences ($\Delta R_{BB'}$, $\Delta R_{CC'}$, $\Delta R_{BB',2}$) as the first and second parameters, respectively, in the first relation for determining the third parameter representing the distance (y) between the first position and the electrical boundary.

The method according to the first aspect of the present invention and the alternative replacing steps (i.xii) to (i.xx) may further comprise: (iii.xxiv) calculating a first resistance mean ($\overline{R_{BB',1}}$) of the first resistance value ($R_B$) and the second resistance value ($R_{B'}$), (iii.xxv) calculating a second resistance mean ($\overline{R_{BB',2}}$) of the third resistance value ($R_{B,2}$) and the fourth resistance value ($R_{B',2}$), and (iii.xxvi) applying a fifth electrical potential across the first and fourth contact elements for generating a fifth current in the surface portion at the first position, (iii.xxvii) measuring the fifth current through the first or the fourth contact element, (iii.xxviii) measuring a fifth voltage across the second and third contact elements, (iii.xxix) calculating a fifth resistance value ($R_{A,1}$) based on the fifth current and the fifth voltage, (iii.xxx) applying a sixth electrical potential across the second and third contact elements for generating a sixth current in the surface portion at the first position, (iii.xxxi) measuring the sixth current through the second or the third contact element, (iii.xxxii) measuring a sixth voltage across the first and fourth contact elements, (iii.xxxiii) calculating a sixth resistance value ($R_{A',1}$) based on the sixth current and the sixth voltage, (iii.xxxiv) calculating a third resistance mean ($\overline{R_{AA',1}}$) of the fifth resistance value ($R_{A,1}$) and the sixth resistance value ($R_{A',1}$), and (iii.xxxv) applying a seventh electrical potential across the fifth and eighth contact elements for generating a seventh current in the surface portion at the first position, (iii.xxxvi) measuring the seventh current through the fifth or the eighth contact element, (iii.xxxvii) measuring a seventh voltage across the sixth and seventh contact elements, (iii.xxxviii) calculating a seventh resistance value ($R_{A,2}$) based on the seventh current and the seventh voltage, (iii.xxxix) applying an eighth electrical potential across the sixth and seventh contact elements for generating an eighth current in the surface portion at the first position, (iii.xl) measuring the eighth current through the sixth or the seventh contact element, (iii.xli) measuring an eighth voltage across the fifth and eighth contact elements, (iii.xlii) calculating an eighth resistance value ($R_{A',2}$) based on the eighth current and the eighth voltage, (iii.xliii) calculating a fourth resistance mean ($\overline{R_{AA',2}}$) of the seventh resistance value ($R_{A,2}$) and the eighth resistance value ($R_{A',2}$), (iii.xliv) defining a second relation including a fourth, fifth, and sixth parameter representing the first resistance mean ($\overline{R_{BB',1}}$), the third resistance mean ($\overline{R_{AA',1}}$), and a first pseudo sheet resistance ($R_{P,1}$), respectively, (iii.xlv) employing the first resistance mean ($\overline{R_{BB',1}}$) and the third resistance mean ($\overline{R_{AA',1}}$) as the fourth parameter and the fifth parameter, respectively, in the second relation for determining the sixth parameter representing the first pseudo sheet resistance ($R_{P,1}$), (iii.xlvi) defining a third relation including a seventh, eighth, and ninth parameter representing the second resistance mean ($\overline{R_{BB',2}}$), the fourth resistance mean ($\overline{R_{AA',2}}$), and a second pseudo sheet resistance ($R_{P,2}$), respectively, (iii.xlvii) employing the second resistance mean ($\overline{R_{BB',2}}$) and the fourth resistance mean ($\overline{R_{AA',2}}$) as the seventh parameter and the eighth parameter, respectively, in the third relation for determining the ninth parameter representing the second pseudo sheet resistance ($R_{P,2}$), (iii.xlviii) defining a fourth relation ($g_D$) including a tenth, an eleventh, and a twelfth parameter representing the first pseudo sheet resistance ($R_{P,1}$), the second pseudo sheet resistance ($R_{P,2}$), and the distance between the first position and the electrical boundary, respectively, and (iii.xlix) employing the first and the second pseudo sheet resistances ($R_{P,1}$, $R_{P,2}$) as the tenth and eleventh parameter, respectively, in the fourth relation ($g_D$) for determining the twelfth parameter representing an additional distance (y) between the first position and the electrical boundary, or in an alternative replacing step (iii.xlix) with: the contact elements of the second configuration representing an additional distance ($y_2$) between the first position on the electrically conducting surface portion of the test sample and the electrical boundary of the electrically conducting surface portion, the first relation ($f_D$) further including a thirteenth parameter representing the additional distance between the first position and the electrical boundary, the fourth relation ($g_D$) further including a fourteenth parameter representing the additional distance between the first position and the electrical boundary, and the method further comprising: (iv.xlix) employing the first and the second pseudo sheet resistances ($R_{P,1}$, $R_{P,2}$) as the tenth and eleventh parameter, respectively, in the fourth relation ($g_D$) for simultaneously determining the thirteenth parameter and the fourteenth parameter representing the distance (y) and the additional distance ($y_2$) between the first position and the electrical boundary, respectively.

In the alternative including step (iii.xlix) the fourth relation may be equivalent to $R_{P,1}/R_{P,2}=g_D(y)$, where $R_{P,1}$ represents the first pseudo sheet resistance, $R_{P,2}$ represents the second pseudo sheet resistance, and $g_D$ represents a function including the distance y as a parameter, the function $g_D$ defining a peak value at a specific distance, and the function $g_D$ increasing as a function of the distance below the specific distance and decreasing as a function of the distance above the specific distance, the method may further comprise: (iii.xlx) comparing the distance and the specific distance to determine if the additional distance ($y_2$) is below or above the specific distance in the fourth relation. The additional distance ($y_2$) determined this way is typically more accurate than the distance (y), since it is derived from resistance means instead of resistance differences.

The additional distance may replace the distance for any purpose, e.g. for determining an electrical property of a test sample.

The objects are according to a second aspect of the present invention obtained by a method for determining a distance between a first position on an electrically conducting surface portion of a test sample and an electrical boundary of the electrically conducting surface portion by a multi-point probe comprising a plurality of contact elements, each contact element defining a contact point for establishing an electrical contact with the test sample, the plurality of contact elements comprising a first contact element, a second contact element, a third contact element, a fourth contact element and one or more additional contact elements, the method comprising: (v.i) defining a first configuration of contact elements of the plurality of contact elements, the first configuration of contact elements being composed of the first contact element, the second contact element, the third contact element, and the fourth contact element, (v.ii) defining a second configuration of contact elements of the plurality of contact elements, the second configuration of contact elements being composed of a fifth contact element, a sixth contact element, a seventh contact element, and an eighth contact element, at least one contact element of the second configuration of contact elements being a contact element of the one or more additional contact elements, (v.iii-iv) contacting the test sample with the contact elements of the first and second configurations of contact elements at the first position on the electrically conducting surface portion, (v.v) applying a magnetic field having a major field component perpendicular to the electrically conducting surface portion at the first position (v.vi) applying a first electrical potential across the first and third contact elements for generating a first current in the surface portion at the first position, (v.vii) measuring the first current through the first or the third contact element, (v.viii) measuring a first voltage across the second and fourth contact elements, (v.ix) calculating a first resistance value ($R_B$) based on the first current and the first voltage, (v.x) applying a second electrical potential across the second and fourth contact elements for generating a second current in the surface portion at the first position, (v.xi) measuring the second current through the second or the fourth contact element, (v.xii) measuring a second voltage across the first and third contact elements, (v.xiii) calculating a second resistance value ($R_{B'}$) based on the second current and the second voltage, (v.xiv) calculating a first resistance mean ($\overline{R_{BB',1}}$) of the first resistance value ($R_B$) and the second resistance value ($R_{B'}$), (v.xv) applying a third electrical potential across the fifth and seventh contact elements for generating a third current in the surface portion at the first position, (v.xvi) measuring the third current through the fifth or the seventh contact element, (v.xvii) measuring a third voltage across the sixth and eighth contact elements, (v.xviii) calculating a third resistance value ($R_{B,2}$) based on the third current and the third voltage, (v.xix) applying a fourth electrical potential across the sixth and eighth contact elements for generating a fourth current in the surface portion at the first position, (v.xx) measuring the fourth current through the sixth or the eighth contact element, (v.xxi) measuring a fourth voltage across the fifth and seventh contact elements, (v.xxii) calculating a fourth resistance value ($R_{B',2}$) based on the fourth current and the fourth voltage, (v.xxv) calculating a second resistance mean ($\overline{R_{BB',2}}$) of the third resistance value ($R_{B,2}$) and the fourth resistance value ($R_{B',2}$), and (v.xxvi) applying a fifth electrical potential across the first and fourth contact elements for generating a fifth current in the surface portion at the first position, (v.xxvii) measuring the fifth current through the first or the fourth contact element, (v.xxviii) measuring a fifth voltage across the second and third contact elements, (v.xxix) calculating a fifth resistance value ($R_{A,1}$) based on the fifth current and the fifth voltage, (v.xxx) applying a sixth electrical potential across the second and third contact elements for generating a sixth current in the surface portion at the first position, (v.xxxi) measuring the sixth current through the second or the third contact element, (v.xxxii) measuring a sixth voltage across the first and fourth contact elements, (v.xxxiii) calculating a sixth resistance value ($R_{A',1}$) based on the sixth current and the sixth voltage, (v.xxxiv) calculating a third resistance mean ($\overline{R_{AA',1}}$) of the fifth resistance value ($R_{A,1}$) and the sixth resistance value ($R_{A',1}$), and (v.xxxv) applying a seventh electrical potential across the fifth and eighth contact elements for generating a seventh current in the surface portion at the first position, (v.xxxvi) measuring the seventh current through the fifth or the eighth contact element, (v.xxxvii) measuring a seventh voltage across the sixth and seventh contact elements, (v.xxxviii) calculating a seventh resistance value ($R_{A,2}$) based on the seventh current and the seventh voltage, (v.xxxix) applying an eighth electrical potential across the sixth and seventh contact elements for generating an eighth current in the surface portion at the first position, (v.xl) measuring the eighth current through the sixth or the seventh contact element, (v.xli) measuring an eighth voltage across the fifth and eighth contact elements, (v.xlii) calculating an eighth resistance value ($R_{A',2}$) based on the eighth current and the eighth voltage, (v.xliii) calculating a fourth resistance mean ($\overline{R_{AA',2}}$) of the seventh resistance value ($R_{A,2}$) and the eighth resistance value ($R_{A',2}$), (v.xliv) defining a second relation including a fourth, fifth, and sixth parameter representing the first resistance mean ($\overline{R_{BB',1}}$), the third resistance mean ($\overline{R_{AA',1}}$), and a first pseudo sheet resistance ($R_{P,1}$), respectively, (v.xlv) employing the first resistance mean ($\overline{R_{BB',1}}$) and the third resistance mean ($\overline{R_{AA',1}}$) as the fourth parameter and the fifth parameter, respectively, in the second relation for determining the sixth parameter representing the first pseudo sheet resistance ($R_{P,1}$), (v.xlvi) defining a third relation including a seventh, eighth, and ninth parameter representing the second resistance mean ($\overline{R_{BB',2}}$), the fourth resistance mean ($\overline{R_{AA',2}}$), and a second pseudo sheet resistance ($R_{P,2}$), respectively, (v.xlvii) employing the second resistance mean ($\overline{R_{BB',2}}$) and the fourth resistance mean ($\overline{R_{AA',2}}$) as the seventh parameter and the eighth parameter, respectively, in the third relation for determining the ninth parameter representing the second pseudo sheet resistance ($R_{P,2}$), (v.xlviii) defining a fourth relation ($g_D$) including a tenth, an eleventh, and a twelfth parameter representing the first pseudo sheet resistance ($R_{P,1}$), the second pseudo sheet resistance ($R_{P,2}$), and the distance between the first position and the electrical boundary, respectively, and (v.xlix) employing the first and the second pseudo sheet resistances ($R_{P,1}$, $R_{P,2}$) as the tenth and eleventh parameter, respectively, in the fourth relation ($g_D$) for determining the twelfth parameter representing a value of the distance (y) between the first position and the electrical boundary.

The fourth relation may be equivalent to $R_{P,1}/R_{P,2}=g_D(y)$, where $R_{P,1}$ represents the first pseudo sheet resistance, $R_{P,2}$ represents the second pseudo sheet resistance, and $g_D$ represents a function including the distance y as a parameter, the function $g_D$ defining a peak value at a specific distance, and the function $g_D$ increasing as a function of the distance below the specific distance and decreasing as a function of the distance above the specific distance, and the method may further comprise: (v.xlx) determining a distance by the method according to the first aspect of the present invention for representing an auxiliary distance, and (v.xlxi) comparing the auxiliary distance and the specific distance to determine if the distance is below or above the specific distance in the fourth relation.

The methods according to the first and second aspects of the present invention require only a single engagement between the probe and the test sample for accurately determining the distance.

An electrical boundary is to be understood as a boundary preventing a current from leaving the electrically conducting surface portion. Relation is here meant to encompass a single equation, a set of equations, a function, a set of functions, or any appropriate mathematical model of the setup used in the method that involves the specified parameters. The determining of the distance may encompass equation solving, regression analysis, comparisons with modelled or calibrated parameters, or any other mathematical technique appropriate for the specified relation.

The multi-point probe may have any number of contact elements equal to or greater than four, e.g. the multi-point probe may have twelve contact elements. However, four contact elements are employed independent on the total number of contact elements. A contact elements that is not used in the method may be positioned between two contact elements that are used in the method. The multi-point probe may be a probe described in any of WO2010115771A1, WO2010000265A1, WO2008110174A1, WO2007051471A1, WO005124371A1, or WO0003252A2. The contact elements may be in the form of cantilevers that extend from a probe body, e.g. as is shown in WO0003252A2. The test sample may be silicon wafer with a doped surface portion or a thin metal film defining the electrically conductive surface portion. The electrical boundary may be defined by a portion of the physical boundary of the electrically conductive surface portion, with a non-conducting region outside the boundary. Alternatively, the electrical boundary may be defined by a portion of the physical boundary of the test sample as a whole, provided the electrically conductive surface portion extends to the physical boundary.

The magnetic field may be generated by an electromagnet or a permanent magnet positioned on the opposite side of the test sample from the electrically conducting surface portion. The first, second, third, and fourth contact elements may be coupled to a multiplexer, which in turn is coupled to a current source for generating an electrical potential across two of the contact elements, an ammeter for measuring a current through the contact elements, and a voltmeter for measuring the voltage across two of the contact elements. A control unit may be coupled to the multiplexer to automatically control the multiplexer such that the currents can be generated and measured, and the voltages measured, as specified in the method.

The features described below may be employed for both the first and second aspects of the present invention.

The contact points may define a first line intersecting each of the contact points. The contact points of the first contact element, the second contact element, the third contact element, the fourth contact element, and the one or more additional contact elements may define a first line intersecting each of the contact points prior to the contact points contacting the test sample. The contact points of the first contact element, the second contact element, the third contact element, and the fourth contact element, may be located in the given order along the first line. The contact points of the fifth contact element, the sixth contact element, the seventh contact element, and the eighth contact element, may be located on and/or in the given order along the first line.

The spacing between the contact points of the first and second contact elements, the second and third contact elements, and the third and fourth contact elements may be approximately equal to a first spacing value ($s_1$). The spacing between the contact points of the fifth and sixth contact elements, the sixth and seventh contact elements, and the seventh and eighth contact elements may be approximately equal to a second spacing value ($s_2$).

In the alternative replacing steps (i.xii) to (i.xx) the first relation may be equivalent to $\Delta R_{BB'}/\Delta R_{BB',2}=f_D(y,s_1,s_2)$, where $\Delta R_{BB'}$ represents the first resistance difference, $\Delta R_{BB',2}$ represents the second resistance difference, and $f_D$ is a function including the distance y between the first position and the electrical boundary, the first spacing value $s_1$, and the second spacing value $s_2$.

The function $f_D(y,s_1,s_2)$ in said first relation $\Delta R_{BB'}/\Delta R_{BB',2}=f_D(y,s_1,s_2)$ may be equivalent to $(3*\arctan(s_1/2y)-\arctan(3s_1/2y))/(3*\arctan(s_2/2y)-\arctan(3s_2/2y))$.

The second relation may be equivalent to $\exp(2\pi \cdot \overline{R_{AA',1}}/R_{P,1})-\exp(2\pi \cdot \overline{R_{BB',1}}/R_{P,1})=1$, where $R_{P,1}$ is the first pseudo sheet resistance, $\overline{R_{BB',1}}$ is the first resistance mean, and $\overline{R_{AA',1}}$ is the third resistance mean; and the third relation may be equivalent to $\exp(2\pi \cdot \overline{R_{AA',2}}/R_{P,2})-\exp(2\pi \cdot \overline{R_{BB',2}}/R_{P,2})=1$, where $R_{P,2}$ is the second pseudo sheet resistance, $\overline{R_{BB',2}}$ is the second resistance mean, and $\overline{R_{AA',2}}$ is the fourth resistance mean.

The contact points may define a first line intersecting each of the contact points, i.e. the contact points are on a common line.

In the alternative including step (iii.xlix) the fourth relation may be equivalent to $R_{P,1}/R_{P,2}=g_D(y,s_1,s_2)$, where $R_{P,1}$ represents the first pseudo sheet resistance, $R_{P,2}$ represents the second pseudo sheet resistance, and go represents a function including the distance y between the first position and the electrical boundary, the first spacing value $s_1$, and the second spacing value $s_2$.

In the alternative replacing step (iii.xlix) the first relation may be equivalent to $\Delta R_{BB'}/\Delta R_{BB',2}=f_D(y,y_2,s_1,s_2)$, where $\Delta R_{BB'}$ represents the first resistance difference, $\Delta R_{BB',2}$ represents the second resistance difference, and $f_D$ is a function including the distance y and the additional distance $y_2$ between the first position and the electrical boundary, the first spacing value $s_1$, and the second spacing value $s_2$.

The function $f_D(y,y_2,s_1,s_2)$ in the first relation $\Delta R_{BB'}/\Delta R_{BB',2}=f_D(y,y_2,s_1,s_2)$ may be equivalent to $(3*\arctan(s_1/2y)-\arctan(3s_1/2y))/(3*\arctan(s_2/2y_2)-\arctan(3s_2/2y_2))$.

In the alternative replacing step (iii.xlix) the fourth relation may be equivalent to $R_{P,1}/R_{P,2}=g_D(y,y_2,s_1,s_2)$, where $R_{P,1}$ represents the first pseudo sheet resistance, $R_{P,2}$ represents the second pseudo sheet resistance, and go represents a function including the distance y and the additional distance $y_2$ between the first position and the electrical boundary, the first spacing value $s_1$, and the second spacing value $s_2$.

The electrical boundary may have an approximately linear portion and the distance between the first position and a point on the linear portion may be smaller than the distance between the first position and any point on the electrical boundary outside the linear portion. This means that the shortest distance from the first position to the electrical boundary is to a point on the linear portion.

The method may further comprise: (vi.i) orienting the multi-point probe to position the first line in a parallel relationship with the linear portion. The spacing between the contact points of the first and second contact elements, the second and third contact elements, and the third and fourth contact elements may be approximately equal.

In the alternative including steps (i.xii) to (i.xx) the first relation may be equivalent to $\Delta R_{CC'}/\Delta R_{BB'}=f(y,s)$, where $\Delta R_{BB'}$ represents the first resistance difference, $\Delta R_{CC'}$ represents the second resistance difference, and f is a function including the distance y between the first position and the electrical boundary and the spacing s between the contact points as parameters.

The first resistance difference $\Delta R_{BB'}$ in the relation $\Delta R_{CC'}/\Delta R_{BB'}=f(y,s)$ may be equivalent to $\Delta R_{BB'}=2R_H/\pi^*(\arctan(a/2y)+\arctan(b/2y)+\arctan(c/2y)-\arctan((a+b+c)/2y))$, where $\Delta R_{BB'}$ represents the additional first difference ($\Delta R_{BB'}$), y represents the distance (y), a represents the spacing between the contact points of the first and second contact elements, b represents the spacing between the contact points of the second and third contact elements, and c represents the spacing between the contact points of the third and fourth contact elements; and the second resistance difference $\Delta R_{CC'}$ in the relation $\Delta R_{CC'}/\Delta R_{BB'}=f(y,s)$ may be equivalent to $\Delta R_{CC'}=2R_H/\pi^*(\arctan((a+b+c)/2y)+\arctan(b/2y)-\arctan((a+b)/2y)-\arctan((b+c)/2y))$ where $\Delta R_{CC'}$ represents the additional second difference ($\Delta R_{CC'}$), y represents the distance (y), a represents the spacing between the contact points of the first and second contact elements, b represents the spacing between the contact points of the second and third contact elements, and c represents the spacing between the contact points of the third and fourth contact elements.

In the alternative including steps (i.xii) to (i.xx) of the first aspect of the present invention the method may further comprise: (i.xxiii) applying a fifth electrical potential across the first and fourth contact elements for generating a fifth current in the surface portion at the first position, (i.xxiv) measuring the fifth current through the first or the fourth contact element, (i.xxv) measuring a fifth voltage across the second and third contact elements, (i.xxvi) calculating a fifth resistance value ($R_A$) based on the fifth current and the fifth voltage, (i.xxvii) applying a sixth electrical potential across the second and third contact elements for generating a sixth current in the surface portion at the first position, (i.xxviii) measuring the sixth current through the second or the third contact element, (i.xxix) measuring a sixth voltage across the first and fourth contact elements, (i.xxx) calculating a sixth resistance value ($R_{A'}$) based on the sixth current and the sixth voltage, (i.xxxi) calculating a third resistance difference ($\Delta R_{AA'}$) based on the difference between the fifth resistance value and the sixth resistance value, (i.xxxii) in defining the first relation (f) the first relation (f) further includes a fourth parameter representing the third resistance difference ($\Delta R_{AA'}$), and (i.xxxiii) in determining the distance (y) between the first position and the electrical boundary, the third resistance difference ($\Delta R_{AA'}$) is used as the fourth parameter in the first relation in addition to the first and the second resistance differences ($\Delta R_{BB'}$, $\Delta R_{CC'}$) may be used as the first and the second parameter, respectively.

This allows for the accurate measurements of the distance y with asymmetric probe that have non-equidistant contact points.

The contact points may be positioned in-line and the spacing between the contact points of the first and second contact elements and the spacing between the contact points of the second and third contact elements may be approximately equal. The contact points may be positioned in-line and the spacing between the contact points of the third and fourth contact elements may be different from the spacing between the contact points of the first and second contact elements. It has been found in simulations that this particular relative spacing of the contact probes gives accurate determinations of the distance to the electrical boundary.

The spacing between the contact points of the third and fourth contact element may be greater than the spacing between the contact points of the first and second contact element by a factor in one or more of the ranges 1.1-3.7, 1.2-3.3, 1.3-2.9, 1.4-2.5, 1.5-2.1, and 1.6-1.7, and/or in one of the ranges 1.2-1.3, 1.3-1.4, 1.4-1.5, 1.5-1.6, 1.6-1.7, 1.7-1.8, 1.8-1.9, 1.9-2.0, 2.0-2.2, 2.2-2.4, 2.4-2.6, 2.6-2.8, 2.8-3.0, 3.0-3.3, 3.3-3.6, 3.6-3.9, and/or approximately five divided by three, or by a factor in one or more of the ranges 1.2-3.8, 1.6-3.4, 1.8-3.2, 2.0-3.0, 2.2-2.8, and 2.4-2.6, and/or in one of the ranges 1.2-1.3, 1.3-1.4, 1.4-1.5, 1.5-1.6, 1.6-1.7, 1.7-1.8, 1.8-1.9, 1.9-2.0, 2.0-2.2, 2.2-2.4, 2.4-2.6, 2.6-2.8, 2.8-3.0, 3.0-3.3, 3.3-3.6, 3.6-3.9, and/or approximately five divided by two. It has been found in simulations that these particular relations give accurate determinations of the distance to the electrical boundary.

The spacing between the contact points of the first and second contact elements may be in one of the ranges 1-5 μm, 5-10 μm, 10-15 μm, 15-20 μm, 20-25 μm, 25-30 μm, 30-40 μm, 40-50 μm, 50-500 μm, and/or in one or more of the ranges 1-50 μm, 5-40 μm, 10-30 μm, 15-25 μm.

The first relation may be equivalent to $(\Delta R_{AA'}+\alpha\Delta R_{CC'})/\Delta R_{BB'}=f(y,a,b,c)$, where $\Delta R_{BB'}$ is the first resistance difference, $\Delta R_{CC'}$ is the second resistance difference, $\Delta R_{AA'}$ is the third resistance difference, α is a tuning factor in the range −10 to 10; and f is a function including the distance y between the first position and the electrical boundary and a the spacing between the contact points of the first and second contact elements, b the spacing between the contact points of the second and third contact elements, and c the spacing between the contact points of the third and fourth contact elements.

The tuning factor α may be approximately 1 or approximately −1.

The first resistance difference $\Delta R_{BB'}$ in the relation $(\Delta R_{AA'}+\alpha\Delta R_{CC'})/\Delta R_{BB'}=f(y,a,b,c)$ may be equivalent to $\Delta R_{BB'}=2R_H/\pi^*(\arctan(a/2y)+\arctan(b/2y)+\arctan(c/2y)-\arctan((a+b+c)/2y))$, where $\Delta R_{BB'}$ represents the additional first difference ($\Delta R_{AA'}$), y represents the distance (y), a represents the spacing between the contact points of the first and second contact elements, b represents the spacing between the contact points of the second and third contact elements, and c represents the spacing between the contact points of the third and fourth contact elements; the second resistance difference $\Delta R_{CC'}$ in the relation $(\Delta R_{AA'}+\alpha\Delta R_{CC'})/\Delta R_{BB'}=f(y,a,b,c)$ may be equivalent to $\Delta R_{CC'}=2R_H/\pi^*(\arctan((a+b+c)/2y)+\arctan(b/2y)-\arctan((a+b)/2y)-\arctan((b+c)/2y))$, where $\Delta R_{CC'}$ represents the additional second difference ($\Delta R_{CC'}$), y represents the distance (y), a represents the spacing between the contact points of the first and second contact elements, b represents the spacing between the contact points of the second and third contact elements, and c represents the spacing between the contact points of the third and fourth contact elements; and the third resistance difference $\Delta R_{AA'}$ in the relation $(\Delta R_{AA'}+\alpha\Delta R_{CC'})/\Delta R_{BB'}=f(y,a,b,c)$ may be equivalent to $\Delta R_{AA'}=2R_H/\pi^*(\arctan((a+b)/2y)-\arctan(a/2y)-\arctan((b+c)/2y)+\arctan(c/2y))$, where $\Delta R_{AA'}$ represents the additional third resistance difference ($\Delta R_{AA'}$), y represents the distance (y), a represents the spacing between the contact points of the first and second contact elements, b represents the spacing between the contact points of the second and third contact elements, and c represents the spacing between the contact points of the third and fourth contact elements. It has been found that this particular modelling gives accurate results over a wide range of measurement conditions.

The spacing between the contact points of the first and second contact elements may be in one or more of the ranges 0.1-100 μm, 1-90 μm, 10-80 μm, 20-70 μm, 30-60 μm, and 40-50 µm; and/or in one of the ranges 0.1-1 µm, 1-10 µm, 10-20 µm, 20-30 µm, 30-40 µm, 40-50 µm, 50-60 µm, 60-70 µm, 70-80 µm, 80-90 µm, 90-100 µm, or 100-500 µm.

The object of the invention is achieved according to a third aspect of the invention by a method for determining an electrical property at a first position on an electrically conducting surface portion of a test sample, the electrically conducting surface portion having an electrical boundary and the method comprising: (a) determining a distance (y) between the first position on the electrically conducting surface portion of the test sample and the electrical boundary of the electrically conducting surface portion according to any of the points 1 to 32, (b) defining a fifth relation including the electrical property and a fifteenth parameter representing the distance (y), and (c) employing the distance (y) as the fifteenth parameter in the fifth relation for determining the electrical property, or alternatively the method comprising: (a) determining an additional distance ($y_2$) between the first position on the electrically conducting surface portion of the test sample and the electrical boundary of the electrically conducting surface portion according to any of the points 2 to 32, (b) defining a fifth relation including the electrical property and a fifteenth parameter representing the additional distance ($y_2$), and (c) employing the additional distance ($y_2$) as the fifteenth parameter in the fifth relation for determining the electrical property.

According to this method, only a single engagement is necessary between the probe and the test sample for accurately determining the electrical property.

An electrical boundary is to be understood as a boundary preventing a current from leaving the electrically conducting surface portion. Relation is here meant to encompass a single equation, a set of equations, a function, a set of functions, or any appropriate mathematical model of the setup used in the method that involves the specified parameters. The determining of the electrical property may encompass equation solving, regression analysis, comparisons with modelled or calibrated parameters, or any other mathematical technique appropriate for the specified relation.

The fifth relation may further including the spacing between the contact points of the first contact element, the second contact element, the third contact element, and/or the fourth contact element, and: (b') in defining the fifth relation, the fifth relation may further include a sixteenth parameter representing the spacing between the contact points of the first contact element, the second contact element, the third contact element, and/or the fourth contact element, and (c') in determining the electrical property, the spacing may be used as the sixteenth parameter in the fifth relation in addition to the distance (y) or the additional distance ($y_2$).

The electrical property may be the Hall sheet resistance ($R_H$) and the fifth relation ($f_1, f_2$) may further include a seventeenth parameter representing an additional first resistance difference ($\Delta R_{BB'}$), the method may further comprise: (d) applying an additional first electrical potential across the first and third contact elements for generating an additional first current in the surface portion at the first position, (e) measuring the additional first current through the first or the third contact element, (f) measuring an additional first voltage across the second and fourth contact elements, and (g) calculating an additional first resistance value ($R_B$) based on the additional first current and the additional first voltage, or (g') retaining the first resistance value ($R_B$) from the determining of the distance as an additional first resistance value ($R_B$), and (h) applying an additional second electrical potential across the second and fourth contact elements for generating an additional second current in the surface portion at the first position, (i) measuring the additional second current through the second or the fourth contact element, (j) measuring an additional second voltage across the first and third contact elements, and (k) calculating an additional second resistance value ($R_{B'}$) based on the additional second current and the additional second voltage, or (k') retaining the second resistance value ($R_{B'}$) from the determining of the distance as an additional second resistance value ($R_{B'}$), and (l) calculating the additional first resistance difference ($\Delta R_{BB'}$) based on the difference between the additional first resistance value and the additional second resistance value, or (l') retaining the first resistance difference ($\Delta R_{BB'}$) from the determining of the distance as the additional first resistance difference ($\Delta R_{BB'}$).

The fifth relation may be equivalent to $\Delta R_{BB'} = 2R_H/\pi *$ (arctan(a/2y)+arctan(b/2y)+arctan(c/2y)−arctan((a+b+c)/2y)) where $\Delta R_{BB'}$ represents the additional first difference ($\Delta R_{BB'}$), y represents the distance (y) or additional distance ($y_1$), a represents the spacing between the contact points of the first and second contact elements, b represents the spacing between the contact points of the second and third contact elements, and c represents the spacing between the contact points of the third and fourth contact elements.

The electrical property may be the Hall sheet resistance ($R_H$) and the fifth relation ($f_2, f_3$) may further include a seventeenth parameter representing an additional second resistance difference ($\Delta R_{CC'}$), the method may further comprise: (d) applying an additional third electrical potential across the first and second contact elements for generating an additional third current in the surface portion at the first position, (e) measuring the additional third current through the first or the second contact element, (f) measuring an additional third voltage across the third and fourth contact elements, and (g) calculating an additional third resistance value ($R_C$) based on the additional third current and the additional third voltage, or in the alternative including steps (i.xii) to (i.xx): (g') retaining the third resistance value ($R_C$) from the determining of the distance as an additional third resistance value ($R_C$), and (h) applying an additional fourth electrical potential across the third and fourth contact elements for generating an additional fourth current in the surface portion at the first position, (i) measuring the additional fourth current through the third or the fourth contact element, (j) measuring an additional fourth voltage across the first and second contact elements, and (k) calculating an additional fourth resistance value ($R_{C'}$) based on the additional fourth current and the additional fourth voltage, or in the alternative including steps (i.xii) to (i.xx): (k') retaining the fourth resistance value ($R_{C'}$) from the determining of the distance as an additional fourth resistance value ($R_{C'}$), and (l) calculating the additional second resistance difference ($\Delta R_{CC'}$) based on the difference between the additional third resistance value and the additional forth resistance value, or in the alternative including steps (i.xii) to (i.xx): (l') retaining the second resistance difference ($\Delta R_{CC'}$) from the determining of the distance as the additional second resistance difference ($\Delta R_{CC'}$).

The fifth relation may be equivalent to $\Delta R_{CC'} = 2R_H/\pi *$ (arctan((a+b+c)/2y)+arctan(b/2y)−arctan((a+b)/2y)−arctan((b+c)/2y)), where $\Delta R_{CC'}$ represents the additional second difference ($\Delta R_{CC'}$), y represents the distance (y) or additional distance ($y_1$), a represents the spacing between the contact points of the first and second contact elements, b represents the spacing between the contact points of the second and third contact elements, and c represents the spacing between the contact points of the third and fourth contact elements.

The electrical property may be the Hall sheet resistance ($R_H$) and the fifth relation ($f_1$) may further include a seventeenth parameter representing an additional third resistance difference ($\Delta R_{AA'}$), the method may further comprise: (d) applying an additional fifth electrical potential across the first and fourth contact elements for generating an additional fifth current in the surface portion at the first position, (e) measuring the additional fifth current through the first or the fourth contact element, (f) measuring an additional fifth voltage across the second and third contact elements, and (g) calculating an additional fifth resistance value ($R_A$) based on the additional fifth current and the additional fifth voltage, or (g') retaining the fifth resistance value ($R_A$) from the determining of the distance as an additional fifth resistance value ($R_A$), and (h) applying an additional sixth electrical potential across the second and third contact elements for generating an additional sixth current in the surface portion at the first position, (i) measuring the additional sixth current through the second or the third contact element, (j) measuring an additional sixth voltage across the first and fourth contact elements, and (k) calculating an additional sixth resistance value ($R_{A'}$) based on the additional sixth current and the additional sixth voltage, or (k') retaining the sixth resistance value ($R_{A'}$) from the determining of the distance as an additional fifth resistance value ($R_{A'}$), and (l) calculating the additional third resistance difference ($\Delta R_{AA'}$) based on the difference between the additional fifth resistance value and the additional sixth resistance value, or (l') retaining the third resistance difference ($\Delta R_{AA'}$) from the determining of the distance as the additional third resistance difference ($\Delta R_{AA'}$).

The fifth relation may be equivalent to $\Delta R_{AA'} = 2R_H/\pi *$ (arctan((a+b)/2y)−arctan(a/2y)−arctan((b+c)/2y)+arctan(c/2y)), where $\Delta R_{AA'}$ represents the additional third resistance difference ($\Delta R_{AA'}$), y represents the distance (y) or additional distance ($y_1$), a represents the spacing between the contact points of the first and second contact elements, b represents the spacing between the contact points of the second and third contact elements, and c represents the spacing between the contact points of the third and fourth contact elements.

The electrical property may be the sheet resistance ($R_0$) and the fifth relation (g) may further include a seventeenth parameter representing a pseudo sheet resistance ($R_P$), the method may further comprise: (d) applying an additional fifth electrical potential across the first and fourth contact elements for generating an additional fifth current in the surface portion at the first position, (e) measuring the additional fifth current through the first or the fourth contact element, (f) measuring an additional fifth voltage across the second and third contact elements, (g) calculating an additional fifth resistance value ($R_A$) based on the additional fifth current and the additional fifth voltage, or (g') retaining the fifth resistance value ($R_A$) from the determining of the distance as an additional fifth resistance value ($R_A$), and (h) applying an additional sixth electrical potential across the second and third contact elements for generating an additional sixth current in the surface portion at the first position, (i) measuring the additional sixth current through the second or the third contact element, (j) measuring an additional sixth voltage across the first and fourth contact elements, (k) calculating an additional sixth resistance value ($R_{A'}$) based on the additional sixth current and the additional sixth voltage, or (k') retaining the sixth resistance value ($R_{A'}$) from the determining of the distance as an additional fifth resistance value ($R_{A'}$), and (l) calculating a fifth resistance mean ($\overline{R_{AA'}}$) of the additional fifth resistance value ($R_A$) and the additional sixth resistance value ($R_{A'}$), and (d") applying an additional first electrical potential across the first and third contact elements for generating an additional first current in the surface portion at the first position, (e") measuring the additional first current through the first or the third contact element, (f") measuring an additional first voltage across the second and fourth contact elements, (g") calculating an additional first resistance value ($R_B$) based on the additional first current and the additional first voltage, or (g''') retaining the first resistance value ($R_B$) from the determining of the distance as an additional first resistance value ($R_B$), and (h") applying an additional second electrical potential across the second and fourth contact elements for generating an additional second current in the surface portion at the first position, (i") measuring the additional second current through the second or the fourth contact element, (j") measuring an additional second voltage across the first and third contact elements, (k") calculating an additional second resistance value ($R_{B'}$) based on the additional second current and the additional second voltage, or (k''') retaining the second resistance value ($R_{B'}$) from the determining of the distance as an additional second resistance value ($R'_B$), and (l") calculating a sixth resistance mean ($\overline{R_{BB'}}$) of the additional first resistance value ($R_B$) and the additional second resistance value ($R_{B'}$), and (m) defining a sixth relation including a eighteenth, nineteenth, and twentieth parameter representing the fifth resistance mean ($\overline{R_{AA'}}$), the sixth resistance mean ($\overline{R_{BB'}}$), and the pseudo sheet resistance ($R_P$), respectively, (n) determining the pseudo sheet resistance ($R_P$) by using the fifth resistance mean ($\overline{R_{AA'}}$) and the sixth resistance mean ($\overline{R_{BB'}}$) as the eighteenth parameter and the nineteenth parameter, respectively, in the sixth relation.

The sixth relation may be equivalent to $\exp(2\pi \cdot \overline{R_{AA'}}/R_P) - \exp(2\pi \cdot \overline{R_{BB'}}/R_P) = 1$, where $R_P$ is the pseudo sheet resistance, $\overline{R_{AA'}}$ is the first resistance mean, and $\overline{R_{BB'}}$ is the second resistance mean.

The Hall sheet carrier density $N_{HS}$ may be calculated as: $N_{HS} = B/(ZeR_H)$, where B is the magnetic field component perpendicular to the electrically conducting surface portion, Ze is the carrier charge ($Z = \pm 1$), and $R_H$ the Hall sheet resistance. The mean Hall carrier mobility $\mu_H$ may be calculated as: $\mu_H = (ZR_H)/(R_0 B)$, where $Z = \pm 1$ depending on the type of carrier charge, $R_H$ the Hall sheet resistance, $R_0$ the sheet resistance, and B is the magnetic field component perpendicular to the electrically conducting surface portion. If the magnetic field is generated by an electromagnet, the magnetic field component B may be calculated theoretically from the current through the electromagnet. If the magnetic field is generated by a permanent magnet, the magnetic field component B may be pre-determined by a suitable calibration.

The object of the invention is achieved according to a fourth aspect of the invention by an apparatus for determining a distance between a first position on an electrically conducting surface portion of a test sample and an electrical boundary of the electrically conducting surface portion, the apparatus comprising: a multi-point probe comprising a first contact element, a second contact element, a third contact element, a fourth contact element, contact element defining a contact point for establishing an electrical contact with the test sample, or a multi-point probe comprising a plurality of contact elements, and a control unit adapted for performing the method for determining a distance according to the first or second aspects of the present invention.

The object of the invention is achieved according to a fifth aspect of the invention by an apparatus for determining an electrical property at a first position on an electrically conducting surface portion of a test sample comprising: a multi-point probe comprising a first contact element, a second contact element, a third contact element, and a fourth contact element, each contact element defining a contact point for establishing an electrical contact with the test sample, or a multi-point probe comprising a plurality of contact elements, and a control unit adapted for performing the method for determining an electrical property at a first position on an electrically conducting surface portion of a test sample according to the third aspect of the present invention.

DESCRIPTION OF FIGURES

A number of embodiments of the different aspects of the present invention are described below, where.

DETAILED DESCRIPTION

Figure 1:
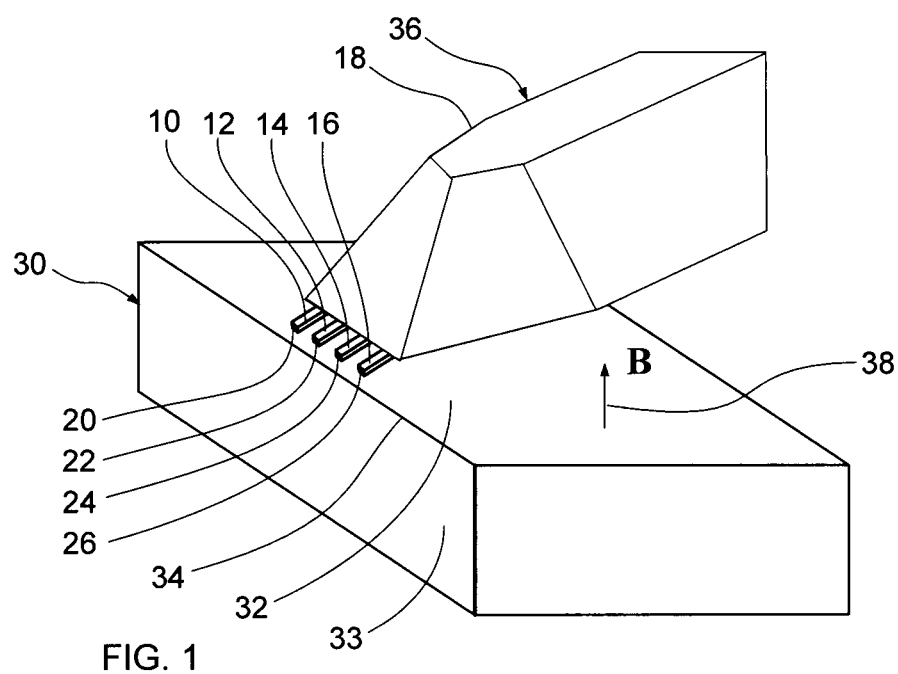
FIG. 1 illustrates a four-point probe in contact with an electrically conducting surface portion of a test sample.

FIG. 1 illustrates a multi-point probe 36 contacting a test sample 30. The test sample 30 has an electrically conducting surface portion 32 and a boundary 34 physically defined by the edge between the surface portion 32 corresponding to the top surface of the test sample 30 and the side surface 33 of the test sample 30. The side surface 33 is not electrically conducting and the boundary is therefore an electrical boundary preventing currents from leaving the electrically conducting surface portion 32.

The multi-point probe 36 has a probe body 18 from which a first contact element 10, a second contact element 12, a third contact element 14, and a fourth contact element 16 extend. Each of the contact elements 10-16 is cantilever with one end connected to the probe body 18 and the other end defining a contact point 20-26. The contact points 20-26 of the setup in FIG. 1 are in contact with the electrically conducting surface portion 32. The contact elements 10-16 are electrically conducting. Thus, a current can pass through each of the contact elements into the electrically conducting surface portion 32. A constant magnetic field B is applied to the test sample 30 such that it has a field component 38 that is perpendicular to the electrically conducting surface portion 32.

Figure 2A:
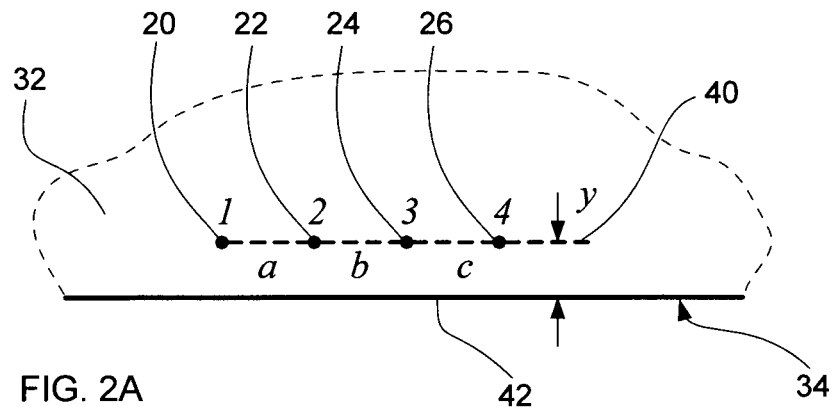
FIG. 2A illustrates the equidistant spacing between the contact points of the contact elements of a probe in a preferred embodiment.
Figure 2B:
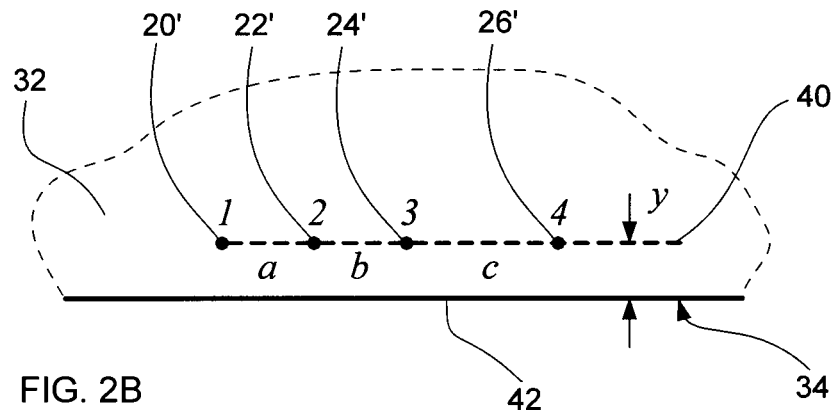
FIG. 2B illustrates the asymmetric spacing between the contact points of the contact elements of a probe in an alternative embodiment.
Figure 2C:
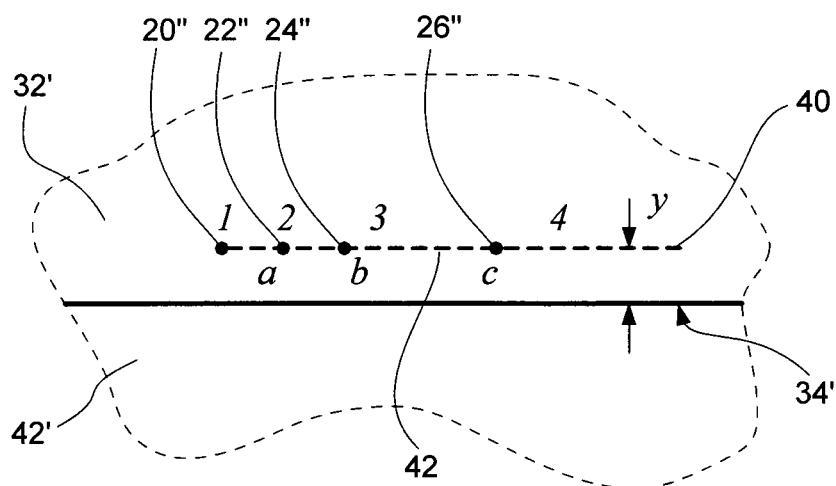
FIG. 2C illustrates the asymmetric spacing between the contact points of the contact elements of a probe in another alternative embodiment, FIGS. 3A(1)-(2) illustrate current-source and voltage-measurement configurations of the contact elements according to an alternative embodiment, FIGS. 3B(1)-(2) and FIGS. 3C(1)-(2) illustrate current-source and voltage-measurement configurations of the contact elements according to the preferred embodiment.

The contact points 20-26 of the contact elements 10-16 all lay on a common line 40, as is shown in FIGS. 2A-C. The electrical boundary 34 has a linear portion 42 and the contact elements 10-16 are oriented so that the common line 40 is parallel to the linear portion 42. The distance or spacing between the contact points 20-22 of the first and second contact elements is denoted a, the distance or spacing between the contact points 22-24 of the second and third contact elements is denoted b, and the distance or spacing between the contact points 24-26 of the third and fourth contact elements is denoted c. The distance or spacing between the common line 40 and the linear portion 42 is denoted y. In the preferred embodiment shown in FIG. 2A the distances a-c between the contact points 20-26 of the contact elements are approximately equal to 21 μm. In the alternative embodiment shown in FIG. 2B the distance a between the contact points 20'-22' of the first and second contact elements is approximately 21 μm, the distance b between the contact points 22'-24' of the second and third contact elements is approximately 21 μm, and the distance c between the contact points 24'-26' of the third and fourth contact elements is approximately 35 μm. In another alternative embodiment shown in FIG. 2C the distance a between the contact points 20"-22" of the first and second contact elements is approximately 14 μm, the distance b between the contact points 22"-24" of the second and third contact elements is approximately 14 μm, and the distance c between the contact points 24"-26" of the third and fourth contact elements is approximately 35 μm.

The test sample described in relation to the preferred embodiment of FIG. 2A and the test sample described in relation to the alternative embodiment of FIG. 2B are the same. In these embodiments the electrical boundary 34 is defined as described in relation to FIG. 1. In the alternative embodiment described in relation to FIG. 2C the electrical boundary 34' is defined as a transition between an electrically conducting surface portion 32' and an electrically non-conducting surface portion 44 on the top surface of a test sample, which means that the two surface portions 34' 44 are essentially parallel.

Different electrical properties of the electrically conductive surface portion can be determined. In a preferred embodiment the Hall sheet resistance and the sheet resistance are measured with a four-point probe having contact points as shown in FIG. 2A.

The positioning of the contact points 20-26 defines a first position on the electrically conducting surface portion 32 at a distance y from the electrical boundary 34. An electrical potential is applied across the first 10 and third 14 contact elements such that a current I is injected in the surface portion through the first contact element 10, and at least some of the current is drained through the third contact element 14, as is shown in FIG. 3B(1). The current I through the first contact element 10 and the voltage $V_A$ across the second 12 and fourth 16 contact elements are measured, and a first resistance value ($R_B$) is calculated as the voltage $V_A$ divided by the current I. Subsequently, an electrical potential is applied across the second 12 and fourth 14 contact elements such that a current I is injected in the surface portion through the second element 12, and at least some of the current is drained through the fourth contact element 14, as is shown in FIG. 3B(2). The current I through the second contact element 12 and the voltage $V_{A'}$ across the first 10 and third 14 contact elements are measured, and a second resistance value ($R_{B'}$) is calculated as the voltage $V_{A'}$ divided by the current I. A first resistance difference ($\Delta R_{BB'}$) defined as the difference between the first resistance value ($R_B$) and the second resistance value ($R_{B'}$) is then calculated:

$$\Delta R_{BB'} = R_B - R_{B'} \qquad \text{(Eq. 1.1)}$$

as well as the mean ($\overline{R_{BB'}}$) between the third resistance value ($R_B$) and the fourth resistance value ($R_{B'}$):

$$\overline{R_{BB'}} = (R_B + R_{B'})/2. \qquad \text{(Eq. 1.2)}$$

An electrical potential is applied across the first and second contact elements such that a current I is injected in the surface portion through the first contact element 10, and at least some of the current is drained through the second contact element 12, as is shown in FIG. 3C(1). The current I through the first contact 10 element and the voltage $V_C$ across the third 14 and fourth 16 contact elements are measured, and a third resistance value ($R_C$) is calculated as the voltage $V_C$ divided by the current I. Subsequently, an electrical potential is applied across the third 14 and fourth 16 contact elements such that a current I is injected in the surface portion through the third element 14, and at least some of the current is drained through the fourth contact element 16, as is shown in FIG. 3B(2). The current I through the third contact element 14 and the voltage $V_{C'}$ across the first 10 and second 12 contact elements are measured, and a fourth resistance value ($R_{C'}$) is calculated as the voltage $V_{C'}$ divided by the current I. A second resistance difference ($\Delta R_{CC'}$) defined as the difference between the third resistance value ($R_C$) and the fourth resistance value ($R_{C'}$) is then calculated:

$$\Delta R_{CC'} = R_C - R_{C'} \qquad \text{(Eq. 1.3)}$$

as well as the mean ($\overline{R_{CC'}}$) between the third resistance value ($R_C$) and the fourth resistance value ($R_{C'}$):

$$\overline{R_{CC'}} = (R_C + R_{C'})/2, \qquad \text{(Eq. 1.4)}$$

A number of relations are defined corresponding to a mathematical model of a four-point probe contacting a test sample as shown in FIG. 2A:

$$f_1 = \Delta \frac{R_{BB'}}{R_H} = \frac{2}{\pi}\left(3\arctan\frac{s}{2y} - \arctan\frac{3s}{2y}\right), \text{ and} \qquad \text{(Eq. 1.5)}$$

$$f_2 = -\Delta \frac{R_{CC'}}{R_H} = -\frac{2}{\pi}\left(\arctan\frac{3s}{2y} + \arctan\frac{s}{2y} - 2\arctan\frac{s}{y}\right). \qquad \text{(Eq. 1.6)}$$

Where s represents the spacing between neighbouring probe arms, which is the same for all pairs of neighbouring probe arms, i.e. s=a=b=c, $\Delta R_{BB'}$ represents the first resistance difference, y represents the distance between the contact points 20-26 and the electrical boundary 34, $\Delta R_{CC'}$ represents the second resistance difference, $R_H$ represents the Hall sheet resistance at the first position of the electrically conducting surface portion 32 where contact is established by the four-point probe 36. In FIG. 4C the relation $f_1$ (Eq. 1.5) is shown as a dotted line and $f_2$ (Eq. 1.6) is shown is a dashed line.

The ratio between the two relations above (Eq. 1.4 and 1.3) is employed for defining a first relation:

$$f = \frac{f_2}{f_1}, \qquad \text{(Eq. 1.7)}$$

which can also be written as:

$$\frac{\Delta R_{CC'}}{\Delta R_{BB'}} = f\left(\frac{y}{s}\right), \qquad \text{(Eq. 1.8)}$$

i.e. the first relation is a function of the distance y normalized with the nominal spacing s. This relation (Eq. 1.7 and 1.8) is shown as a solid line in the graph of FIG. 4C. The measured first ($\Delta R_{BB'}$) and the second ($\Delta R_{CC'}$) resistance differences are then used with the first relation (Eq. 1.8) to derive the normalized distance y/s. For example, a ratio $\Delta R_{CC'}/\Delta R_{BB'}$ of 0.2 would give a normalized distance y/s of approximately 2, and a ratio $\Delta R_{CC'}/\Delta R_{BB}$ of 0.4 would give a normalized distance y/s of approximately 5.5, which can be read from FIG. 4C. The nominal spacing s is known and the distance y is therefore readily determined from the normalized distance y/s. A normalized distance y/s of 2 would give a value of the function $f_1$ of approximately 0.5, and a normalized distance y/s of 5.5 would give a value of the function $f_1$ of approximately 0.08. The measured first resistance difference ($\Delta R_{BB'}$) together with the relation in Eq. 1.3 then gives the Hall sheet resistance $R_H$. The function $f_2$ can also be used in a similar fashion.

In order to determine the Sheet resistance of the electrically conductive surface portion, i.e. another electrical property than the Hall sheet resistance, a first resistance mean $\overline{R_{AA'}}$ is calculated as the sum of the resistance means $\overline{R_{BB'}}$ and $\overline{R_{CC'}}$ defined by Eqs. 1.2 and 1.4:

$$\overline{R_{AA'}} = \overline{R_{BB'}} + \overline{R_{CC'}}. \qquad \text{(Eq. 1.9)}$$

The pseudo sheet resistance $R_P$ is then determined from the van der Pauw equation:

$$\exp\left(\frac{2\pi R_{AA'}}{R_P}\right) - \exp\left(\frac{2\pi R_{BB'}}{R_P}\right) = 1, \qquad \text{(Eq. 1.10)}$$

A second relation is defined for determining the sheet resistance of the electrically conducting surface portion where it is contacted by the four-point probe, namely:

$$\frac{R_P}{R_0} = g\left(\frac{y}{s}\right), \qquad \text{(Eq. 1.11)}$$

where $R_P$ is the pseudo sheet resistance, $R_0$ the sheet resistance, and g is a function of the normalized distance y/s. The function g is geometrical in the sense that it does not depend on the actual size or dimensions of the four-point probe. The function g representing a four-point probe with equidistant contact probes as in FIG. 2A is shown in FIG. 4B. For example, normalized distance y/s of 2 would give a value of the function g, i.e. the ration $R_P/R_0$, of approximately 1.40, and a normalized distance y/s of 5.5 would give the corresponding value, or ratio, of approximately 1.14. With the pseudo sheet resistance $R_P$ determined as described in relation to Eqs. 1.9 and 1.10, the sheet resistance $R_0$ is then readily calculated from Eq. 1.11.

In a second embodiment the Hall sheet resistance and the sheet resistance are measured with an asymmetric four-point probe as shown in FIG. 2B.

The positioning of the contact points 20'-26' defines a first position on the electrically conducting surface portion 32 at a distance y from the electrical boundary 34. An electrical potential is applied across the first 10 and third 14 contact elements such that a current I is injected in the surface portion through the first contact element 10, and at least some of the current is drained through the third contact element 14, as is shown in FIG. 3B(1). The current I through the first contact element 10 and the voltage $V_B$ across the second 12 and fourth 16 contact elements are measured, and a first resistance value ($R_B$) is calculated as the voltage $V_B$ divided by the current. Subsequently, an electrical potential is applied across the second 12 and fourth 14 contact elements such that a current I is injected in the surface portion through the second element 12, and at least some of the current is drained through the fourth contact element 14, as is shown in FIG. 3B(2). The current I through the second contact element 12 and the voltage $V_{B'}$ across the first 10 and third 14 contact elements are measured, and a second resistance value ($R_{B'}$) is calculated as the voltage $V_{B'}$ divided by the current I. A first resistance difference ($\Delta R_{BB'}$) defined as the difference between the first resistance value ($R_B$) and the second resistance value ($R_{B'}$) is then calculated:

$$\Delta R_{BB'} = R_B - R_{B'} \quad \text{(Eq. 2.1)}$$

as well as the mean ($\overline{R_{BB'}}$) between the third resistance value ($R_B$) and the fourth resistance value ($R_{B'}$):

$$\overline{R_{BB'}} = (R_B + R_{B'})/2. \quad \text{(Eq. 2.2)}$$

An electrical potential is applied across the first and second contact elements such that a current I is injected in the surface portion through the first contact element 10, and at least some of the current is drained through the second contact element 12, as is shown in FIG. 3C(1). The current I through the first contact 10 element and the voltage $V_C$ across the third 14 and fourth 16 contact elements are measured, and a third resistance value ($R_C$) is calculated as the voltage $V_C$ divided by the current I. Subsequently, an electrical potential is applied across the third 14 and fourth 16 contact elements such that a current I is injected in the surface portion through the third element 14, and at least some of the current is drained through the fourth contact element 16, as is shown in FIG. 3B(2). The current I through the third contact element 14 and the voltage $V_{C'}$ across the first 10 and second 12 contact elements are measured, and a fourth resistance value ($R_{C'}$) is calculated as the voltage $V_{C'}$ divided by the current I. A second resistance difference ($\Delta R_{CC'}$) defined as the difference between the third resistance value ($R_C$) and the fourth resistance value ($R_{C'}$) is then calculated:

$$\Delta R_{CC'} = R_C - R_{C'}, \quad \text{(Eq. 2.3)}$$

as well as the mean ($\overline{R_{CC'}}$) between the third resistance value ($R_C$) and the fourth resistance value ($R_{C'}$):

$$\overline{R_{CC'}} = (R_C + R_{C'})/2, \quad \text{(Eq. 2.4)}$$

An electrical potential is applied across the first 10 and fourth 16 contact elements such that a current I is injected in the surface portion through the first contact element 10, and at least some of the current is drained through the fourth contact element 16, as is shown in FIG. 3A(1). The current I through the first contact element 10 and the voltage $V_A$ across the second 12 and third 14 contact elements are measured, and a fifth resistance value ($R_A$) is calculated as the voltage $V_A$ divided by the current I. Subsequently, an electrical potential is applied across the second 12 and third 14 contact elements such that a current/is injected in the surface portion through the second element 12, and at least some of the current is drained through the third contact element 14, as is shown in FIG. 3A(2). The current I through the second contact element 12 and the voltage $V_{A'}$ across the first 10' and fourth 16 contact elements are measured, and a sixth resistance value ($R_{A'}$) is calculated as the voltage $V_{A'}$ divided by the current I. A third resistance difference ($\Delta R_{AA'}$) defined as the difference between the fifth resistance value ($R_A$) and the sixth resistance value ($R_{B'}$) is then calculated:

$$\Delta R_{AA'} = R_A - R_{A'} \quad \text{(Eq. 2.5)}$$

as well as the mean ($\overline{R_{AA'}}$) between the fifth resistance value ($R_A$) and the sixth resistance value ($R_{A'}$):

$$\overline{R_{AA'}} = (R_A + R_{A'})/2. \quad \text{(Eq. 2.6)}$$

Figure 5A:
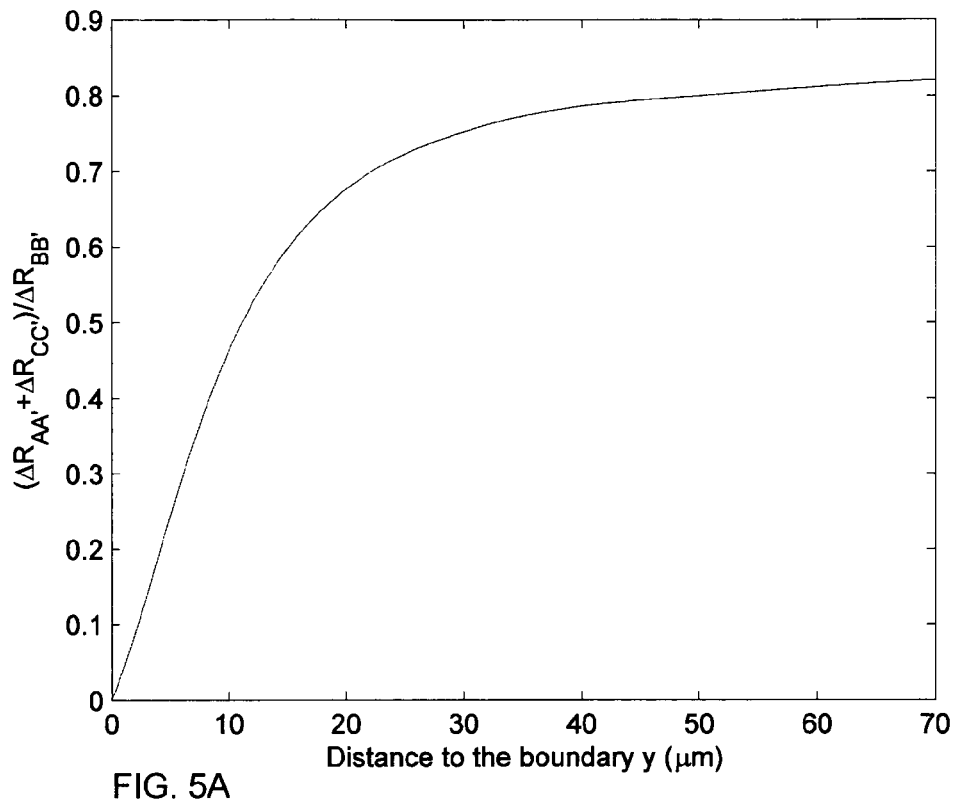
FIGS. 5A-C illustrate relations for determining the distance to an electrical boundary, the Hall sheet resistance, and the sheet resistance according to an alternative embodiment.
Figure 5B:
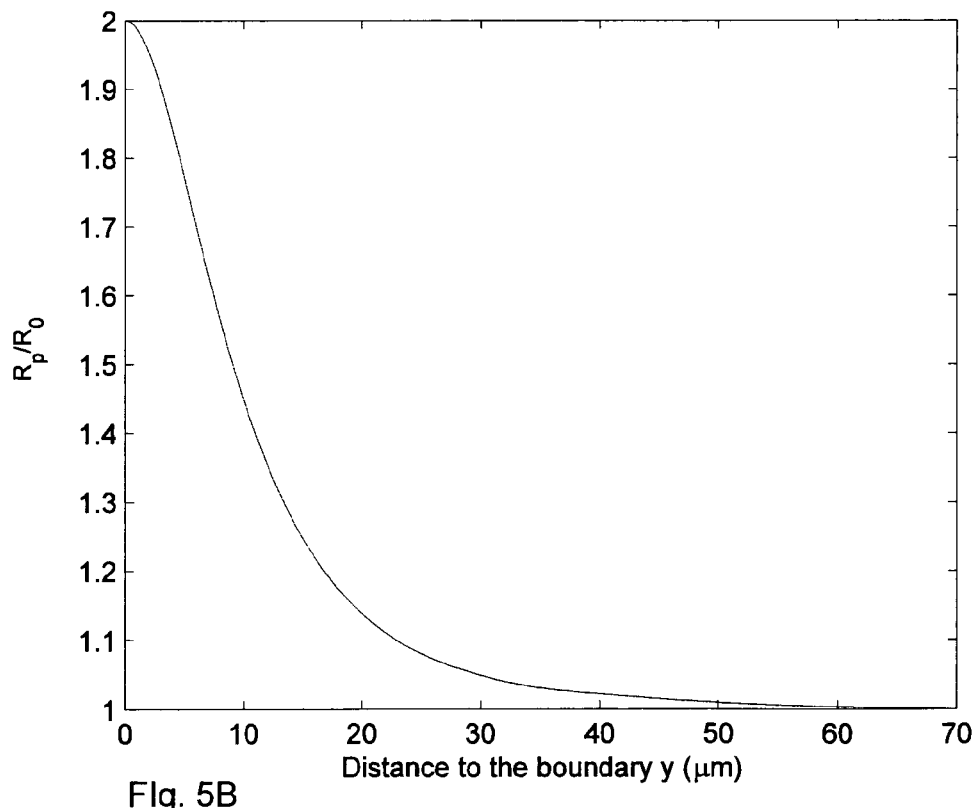
Figure 5C:
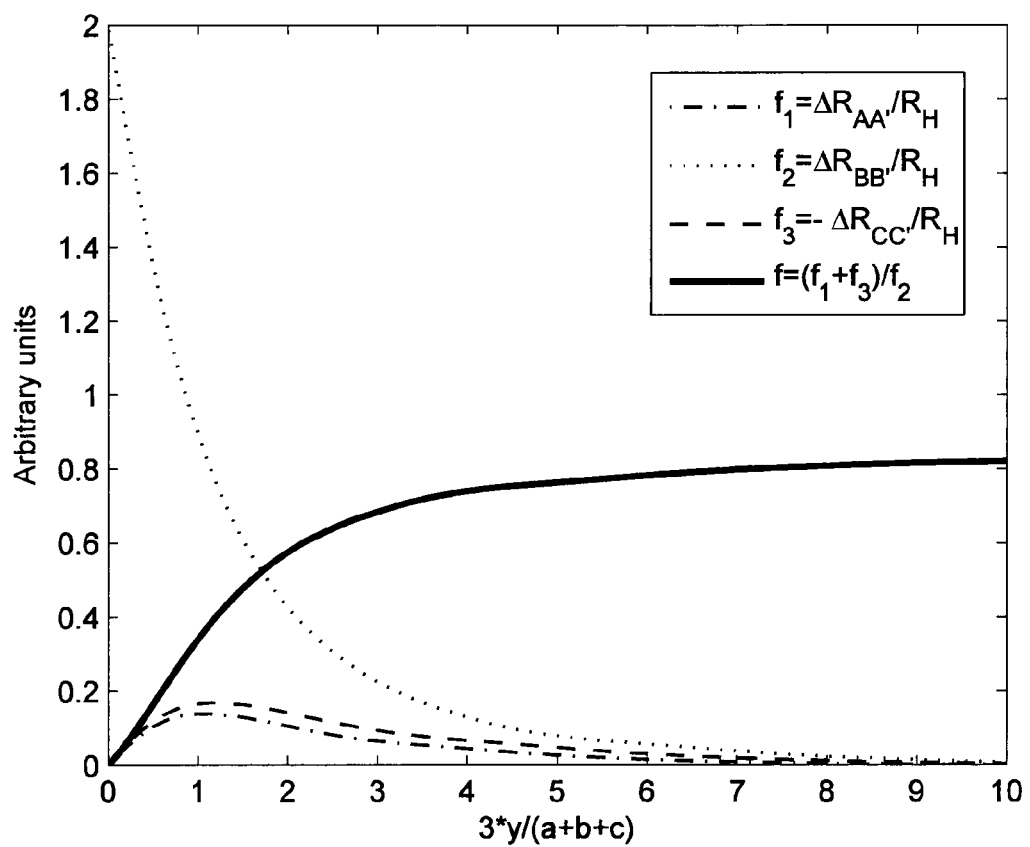

A number of relations are defined corresponding to a mathematical model of a four-point probe contacting a test sample as shown in FIG. 2C, namely:

$$f_1 = \frac{\Delta R_{AA'}}{R_H} = \quad \text{(Eq. 2.7)}$$
$$\frac{2}{\pi}\left(\arctan\frac{a+b}{2y} - \arctan\frac{a}{2y} - \arctan\frac{b+c}{2y} + \arctan\frac{c}{2y}\right),$$

$$f_2 = \frac{\Delta R_{BB'}}{R_H} = \quad \text{(Eq. 2.8)}$$
$$\frac{2}{\pi}\left(\arctan\frac{a}{2y} + \arctan\frac{b}{2y} + \arctan\frac{c}{2y} - \arctan\frac{a+b+c}{2y}\right), \text{ and}$$

$$f_3 = -\frac{\Delta R_{CC'}}{R_H} = -\frac{2}{\pi} \quad \text{(Eq. 2.9)}$$
$$\left(\arctan\frac{a+b+c}{2y} + \arctan\frac{b}{2y} - \arctan\frac{a+b}{2y} - \arctan\frac{b+c}{2y}\right),$$

where a, b, and c, represent the spacings between the contact points as indicated in FIG. 2C, y represents the distance between the contact points 20'-26' and the electrical boundary 34, $\Delta R_{BB'}$ represents the first resistance difference, $\Delta R_{CC'}$ represents the second resistance difference, $\Delta R_{AA'}$ represents the third resistance difference, $R_H$ represents the Hall sheet resistance at the position of the electrically conducting surface portion 32 where contact is established by the four-point probe 36. In FIG. 5C the relation $f_1$ (Eq. 2.7) is shown as a dash-dotted line, the relation $f_2$ (Eq. 2.8) is shown as a dotted line, and the relation $f_3$ (Eq. 2.9) is shown as a dashed line.

A first relation is then defined as:

$$f = \frac{f_1 + f_3}{f_2}, \quad \text{(Eq. 2.10)}$$

which can also be written as:

$$\frac{\Delta R_{AA'} + \alpha \cdot \Delta_{CC'}}{\Delta R_{BB'}} = f(y, a, b, c), \quad \text{(Eq. 2.11)}$$

with α equal to 1, i.e. the first relation is a function of the distance y and the spacings a, b, and c between the contact points. This relation (Eq. 2.10 and 2.11) is shown as a solid line in the graph of FIG. 5C. The measured first ($\Delta R_{BB'}$), second ($\Delta R_{CC'}$), and third ($\Delta R_{AA'}$) resistance differences are then used with the first relation (Eq. 2.11) to derive the normalized distance 3y/(a+b+c). For example, a ratio ($\Delta R_{AA'}+\Delta R_{CC'})/\Delta R_{BB'}$ of 0.2 would give a normalized distance 3y/(a+b+c) of approximately 0.5, and a ratio $\Delta R_{CC'}/\Delta R_{BB'}$ of 0.8 would give a normalized distance 3y/(a+b+c) of approximately 7, which can be read from FIG. 5C. The nominal spacings a, b, and c are known and the distance y is therefore readily determined from the normalized distance 3y/(a+b+c). For example, with the spacing of FIG. 2C, i.e. a=b=14 μm and c=35 μm, a normalized distance 3y/(a+b+c) of 0.5 would give a distance y of approximately 10.5 μm, and a normalized distance 3y/(a+b+c) of 7 would give a distance y of approximately 147 μm. Further, a normalized distance 3y/(a+b+c) of 0.5 would give a value of the function $f_2$ of approximately 1.33, and a normalized distance 3y/(a+b+c) of 7 would give a value of the function $f_2$ of approximately 0.04. The measured first resistance difference ($\Delta R_{BB'}$) together with the relation in Eq. 2.8 then gives the Hall sheet resistance $R_H$. The functions $f_1$ and $f_3$ can also be used in a similar fashion.

In order to determine the Sheet resistance of the electrically conductive surface portion, the pseudo sheet resistance $R_p$ is first determined from the van der Pauw equation:

$$\exp\left(\frac{2\pi \overline{R_{AA'}}}{R_P}\right) - \exp\left(\frac{2\pi \overline{R_{BB'}}}{R_P}\right) = 1, \quad \text{(Eq. 2.12)}$$

Another second relation is then defined for determining the sheet resistance of the electrically conducting surface portion where it is contacted by the four-point probe, namely:

$$\frac{R_P}{R_0} = g(y, a, b, c), \quad \text{(Eq. 2.13)}$$

where $R_p$ is the pseudo sheet resistance, $R_0$ the sheet resistance, and g is a function of the normalized distance y and the spacings a, b, and c between the contact points. The function g representing a four-point probe with asymmetric spacing contact probes as in FIG. 2C is shown in FIG. 5B. For example, distance y of approximately 10.5 μm would give a value of the function g, or of the ration $R_p/R_0$, of approximately 1.44. With the pseudo sheet resistance $R_p$ determined as described in relation to Eq. 2.12, the sheet resistance $R_0$ is then readily calculated from Eq. 2.13.

A more general example for the determination of the Hall sheet resistance and the sheet resistance with a symmetric probe is given here. For a symmetric four-point probe with equidistant contact points. i.e. a=b=c=s, only four measurement configurations B, B', C and C' as shown in FIGS. 3B(1), 3B(2), 3C(1), and 3C(2) giving the resistance values $R_B$, $R_{B'}$, $R_C$, and $R_{C'}$, respectively, are needed in the data treatment. The following is derived from the resistance values:

$$\Delta R_{BB'} = R_B - R_{B'}, \overline{R_{BB'}} = (R_B + R_{B'})/2, \text{ and} \quad (3.1)$$

$$\Delta R_{CC'} = R_C - R_{C'}, \overline{R_{CC'}} = (R_C + R_{C'})/2. \quad (3.2)$$

With the averages, a pseudo sheet resistance $R_p$ is calculated from the van der Pauw equation:

$$\overline{R_{AA'}} = \overline{R_{BB'}} + \overline{R_{CC'}}, \text{ and} \quad (3.3)$$

$$\exp\left(\frac{2\pi \overline{R_{AA'}}}{R_P}\right) - \exp\left(\frac{2\pi \overline{R_{BB'}}}{R_P}\right) = 1. \quad (3.4)$$

The resistance differences $\Delta R_{BB'}$ and $\Delta R_{CC'}$ are expressed with known functions as:

$$\Delta R_{BB'} = R_H f_1\left(\frac{y}{s}\right), \text{ and} \quad (3.5)$$

$$\Delta R_{CC'} = R_H f_2\left(\frac{y}{s}\right). \quad (3.6)$$

Therefore, the ratio of $\Delta R_{BB'}$ and $\Delta R_{CC'}$ can be expressed as a function of y:

$$\frac{\Delta R_{CC'}}{\Delta R_{BB'}} = f\left(\frac{y}{s}\right). \quad (3.7)$$

Figure 4A:
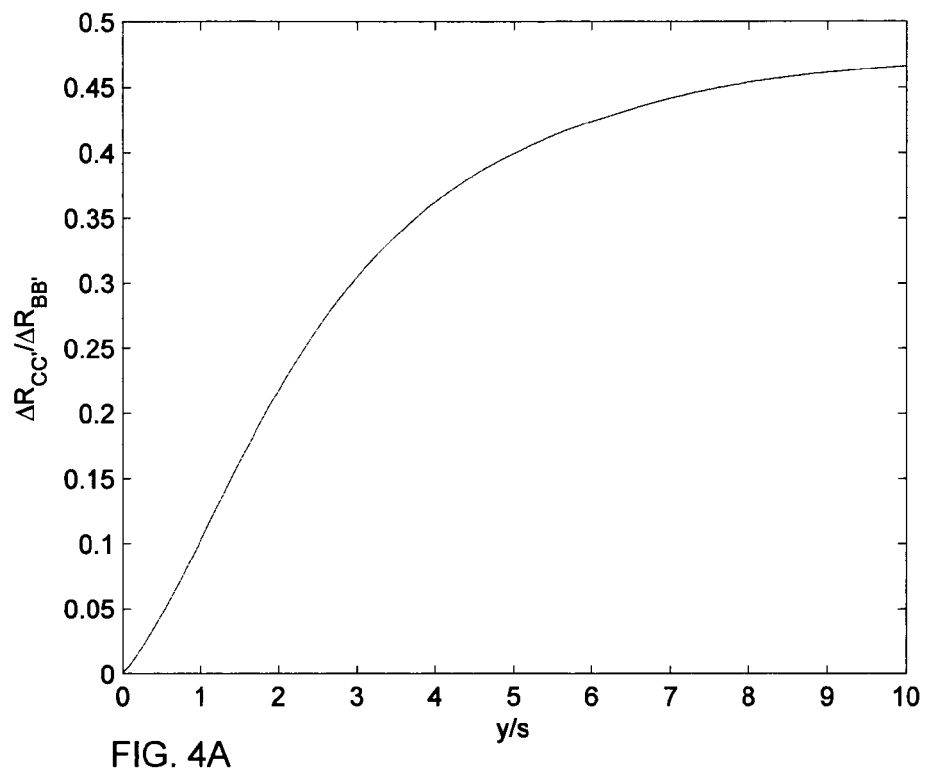
FIGS. 4A-C illustrate relations for determining the distance to an electrical boundary, the Hall sheet resistance, and the sheet resistance according to the preferred embodiment.
Figure 4B:
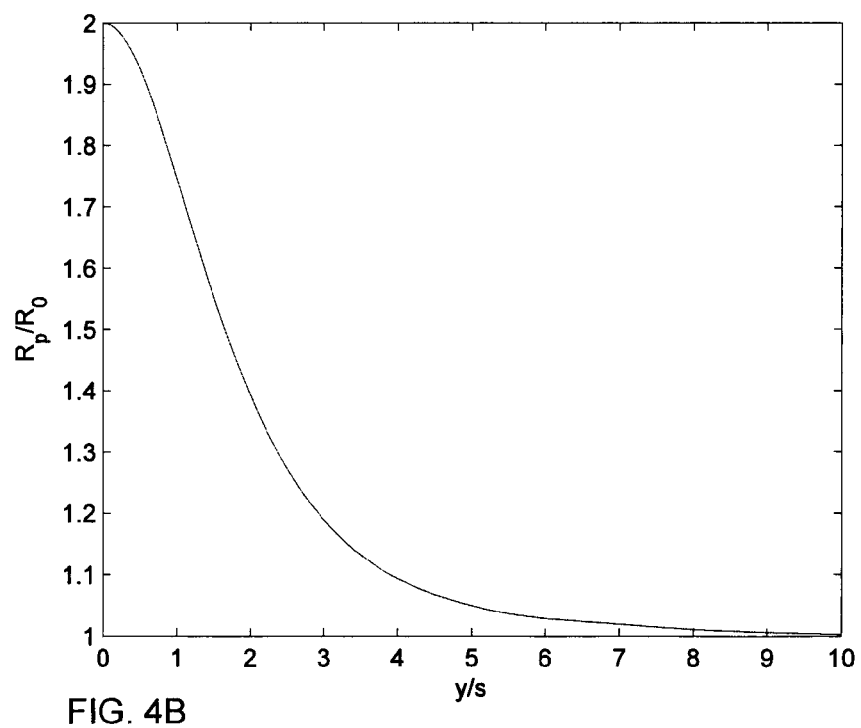
Figure 4C:
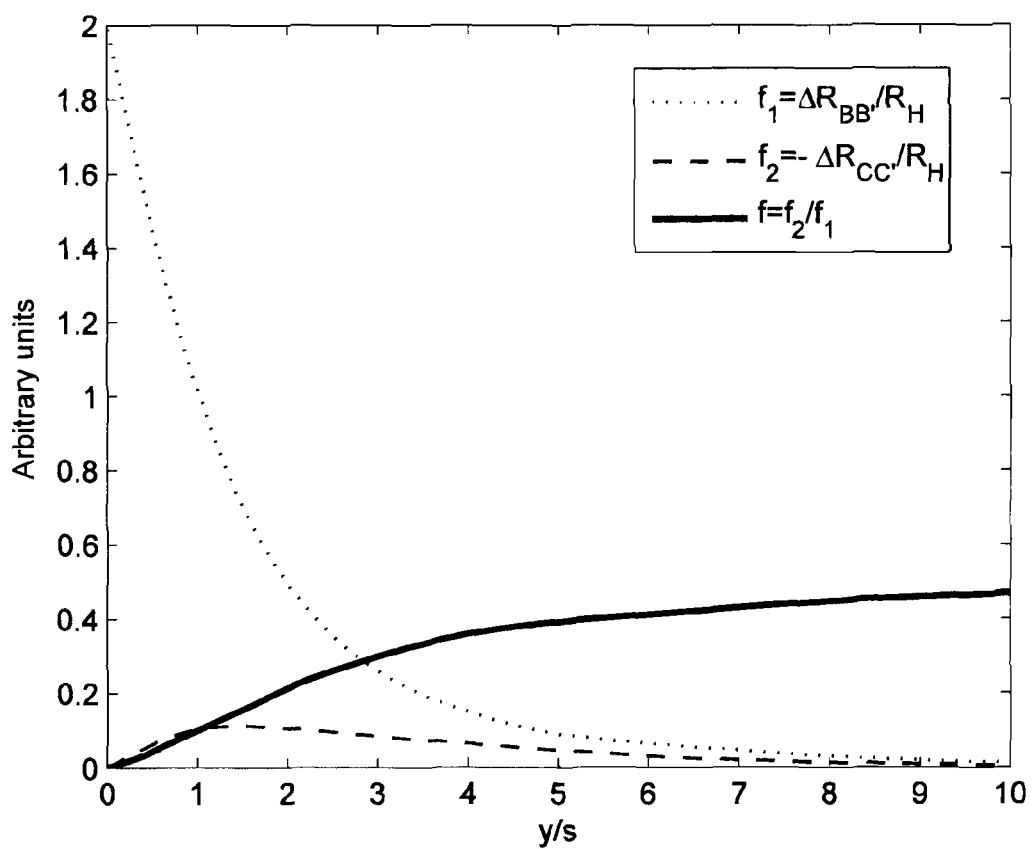

In this equation, the function f can be obtained either with theoretical calculation or with numerical simulation, as is plotted in FIG. 4A. With this plot, the distance y is determined, and the Hall sheet resistance $R_H$ is then solved from either Eq. 3.5 or Eq. 3.6.

The ratio of the pseudo sheet resistance $R_p$ and the sheet resistance $R_0$ could also be expressed as a known function g that is only dependant on y/s:

$$\frac{R_P}{R_0} = g\left(\frac{y}{s}\right). \quad (3.8)$$

The function g can be found either with theoretical calculation or with numerical simulation, and is plotted in FIG. 4B. Finally, with this plot and the pseudo sheet resistance $R_p$ from Eq. 3.4, the sheet resistance $R_0$ is calculated.

A more general example for the determination of the Hall sheet resistance and the sheet resistance with an asymmetric probe is given here. For an asymmetric four-point probe with the spacings a, b, and c, between the contact points of the contact elements, all the six configurations A, A', B, B', C and C' as shown in FIGS. 3A(1), 3A(2), 3B(1), 3B(2), 3C(1), and 3C(2) giving the resistance values $R_A$, $R_{A'}$, $R_B$, $R_{B'}$, $R_C$, and $R_{C'}$, respectively, are needed in the data treatment. Only five of the configurations are independent. Spacings of a=14 um, b=14 um, and c=35 um, as is in FIG. 2C, are used in the following example, where the following is derived from the resistance values:

$$\Delta R_{AA'} = R_A - R_{A'}, \overline{R_{AA'}} = (R_A + R_{A'})/2 \quad (4.1)$$

$$\Delta R_{BB'} = R_B - R_{B'}, \overline{R_{BB'}} = (R_B + R_{B'})/2, \text{ and} \quad (4.2)$$

$$\Delta R_{CC'} = R_C - R_{C'}, \overline{R_{CC'}} = (R_C + R_{C'})/2. \quad (4.3)$$

With the averages, a pseudo sheet resistance $R_P$ is calculated from the van der Pauw equation:

$$\exp\left(\frac{2\pi \overline{R_{AA'}}}{R_P}\right) - \exp\left(\frac{2\pi \overline{R_{BB'}}}{R_P}\right) = 1. \quad (4.4)$$

The resistance differences $\Delta R_{AA'}$, $\Delta R_{BB'}$, and $\Delta R_{CC'}$ are expressed with known functions as:

$$\Delta R_{AA'} = R_H f_1(y,a,b,c), \quad (4.5)$$

$$\Delta R_{BB'} = R_H f_2(y,a,b,c), \text{ and} \quad (4.6)$$

$$\Delta R_{CC'} = R_H f_3(y,a,b,c) \quad (4.7)$$

Therefore, we can define a function of $\Delta R_{AA'}$, $\Delta R_{BB'}$, and $\Delta R_{CC'}$, which is only dependent on the distance y:

$$\frac{\Delta R_{AA'} + \alpha \cdot \Delta R_{CC'}}{\Delta R_{BB'}} = f(y, a, b, c). \quad (4.8)$$

In this equation, the function f can be obtained either with theoretical calculation or with numerical simulation. By tuning the factor $\alpha$, the function f is optimized so that the distance detection could be less sensitive to the probe position errors. When a=14 μm, b=14 μm, and c=35 μm, it has been found that a=1 is a good choice, and the function f can be plotted as is shown in FIG. 5A. With this plot, the distance y is determined, and the Hall sheet resistance $R_H$ is then solved from either of Eq. 4.5, Eq. 4.6, or Eq. 4.7.

The ratio of the pseudo sheet resistance $R_P$ and the sheet resistance $R_0$ could also be expressed as a known function g:

$$\frac{R_P}{R_0} = g(y, a, b, c) \quad (4.9)$$

The function g can be found either with theoretical calculation or with numerical simulation, and is plotted in FIG. 5B. Finally, with this plot and the pseudo sheet resistance $R_P$ from Eq. 4.4, the sheet resistance $R_0$ is calculated.

Figure 6:
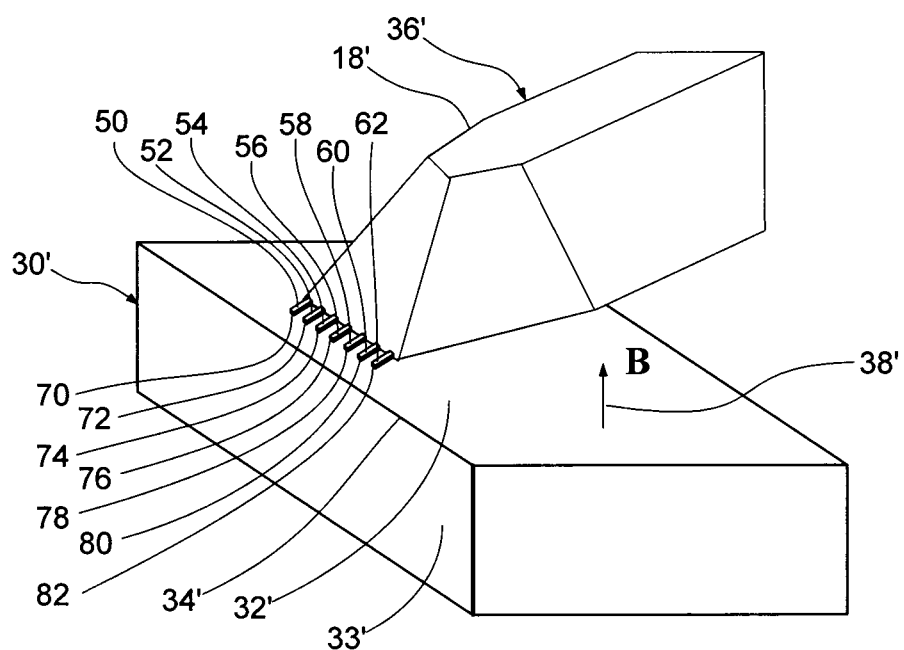
FIG. 6 illustrates a seven-point probe according to an alternative embodiment in contact with an electrically conducting surface portion of a test sample.

FIG. 6 illustrates a multi-point probe 36' contacting a test sample 30'. The test sample 30' has an electrically conducting surface portion 32' and a boundary 34' physically defined by the edge between the surface portion 32 corresponding to the top surface of the test sample 30' and the side surface 33' of the test sample 30'. The side surface 33' is not electrically conducting and the boundary is therefore an electrical boundary preventing currents from leaving the electrically conducting surface portion 32'.

The multi-point probe 36' has a probe body 18' from which seven contact elements 50-62 extend. Each of the contact elements 50-62 is a flexible cantilever with one end connected to the probe body 18' and the other end defining a contact point 70-82. The contact points 70-82 of the setup in FIG. 6 are in contact with the electrically conducting surface portion 32'. The contact elements 50-62 are electrically conducting. Thus, a current can pass through each of the contact elements 50-62 into the electrically conducting surface portion 32'. A constant magnetic field B is applied to the test sample 30' such that it has a field component 38' that is perpendicular to the electrically conducting surface portion 32'.

A first configuration of contact elements is defined that is composed of a first, second, third and fourth contact element corresponding to contact elements 50, 54, 58, and 62, respectively. A second configuration of contact elements is defined that is composed of a fifth, sixth, seventh and eighth contact element corresponding to contact elements 56, 58, 60, and 62, respectively. Here, both the first and the second configurations include the contact elements 58 and 62.

Figure 7A:
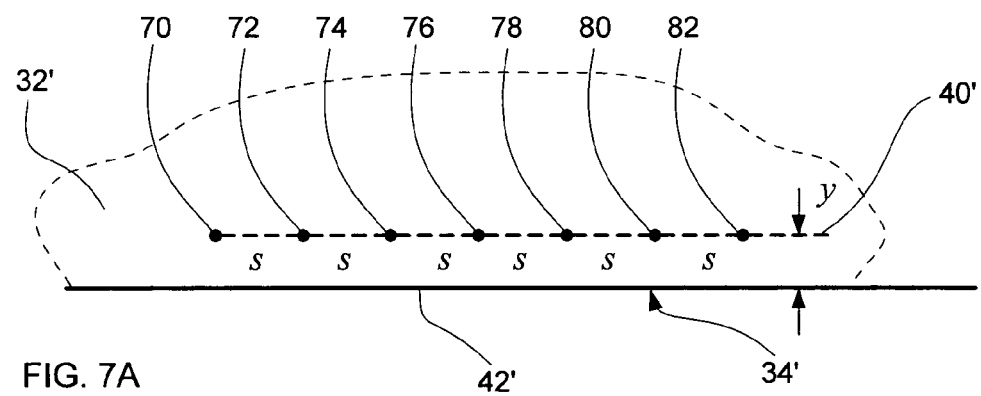
FIG. 7A illustrates the position of the contact points in a contact with the test sample.

The contact points 70-82 of the contact elements 50-62 all lay approximately on a common line 90 when contacting as is shown in FIG. 7A. The electrical boundary 34' has a linear portion 42' and the contact elements 50-62 are oriented so that the common line 40' is parallel to the linear portion 42'. The nominal distance or spacing between the contact points 70-82 is approximately the same and is denoted s. The distance or spacing between the common line 90 and the linear portion 42' is denoted y. In the alternative embodiment shown in FIG. 7A the distance s between the contact points 70-82 of the contact elements is approximately equal to 10 μm. Thus, the contact points of the contact elements of the first configuration define an effective separation or spacing s, of 2 s, i.e. $s_1$ is approximately 20 μm, while the contact points of the contact elements of the second configuration define an effective separation or spacing $s_2$ of 1 s, i.e. $s_2$ is approximately 10 μm.

Figure 7B:
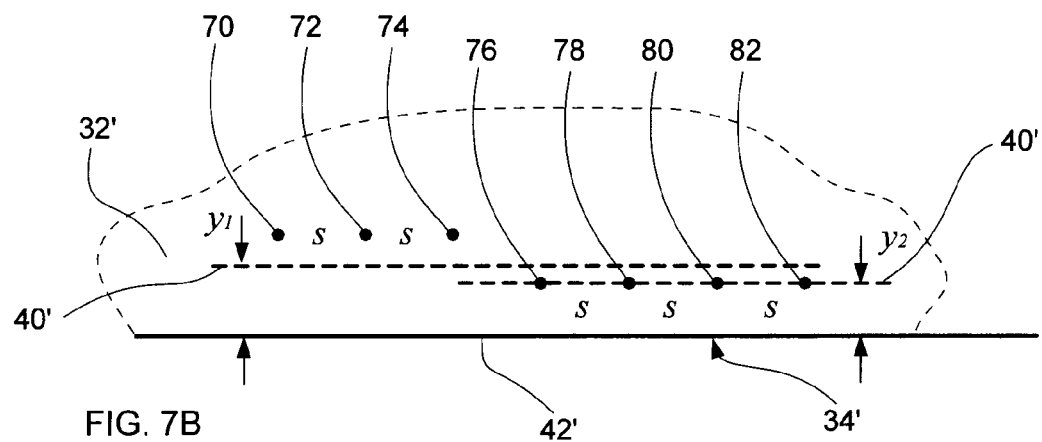
FIG. 7B illustrates the position of the contact points in an alternative contact with the test sample, FIGS. 8A(1)-(4) illustrate current-source and voltage-measurement configurations of the contact elements of the probe described in relation to FIG. 6, FIGS. 8B(1)-(4) illustrate additional current-source and voltage-measurement configurations of the contact elements of the probe described in relation to FIG. 6.

In an alternative contacting shown in FIG. 7B the surface portion 32' is uneven, which has caused three contact elements 70-74 to engage the surface portion 32' differently from the other four contact elements 76-82. Thus the first configuration of contact elements defines a mean distance y, to the linear portion 42' that is different from the corresponding additional mean distance $y_2$ of the second configuration.

In the contacting of FIG. 7A the contact points 70-82 define a distance y to the electrical boundary 34. An electrical potential is applied across the first 50 and third 58 contact elements such that a current I is injected in the surface portion through the first contact element 50, and at least some of the current is drained through the third contact element 58 as is shown in FIG. 8A(1). The current I through the first contact element 50 and the voltage $V_{B,1}$ across the second 54 and fourth 62 contact elements are measured, and a first resistance value ($R_{B,1}$) is calculated as the voltage $V_{B,1}$ divided by the current I. Subsequently, an electrical potential is applied across the second 54 and fourth 62 contact elements such that a current I is injected in the surface portion through the second element 54, and at least some of the current is drained through the fourth contact element 62, as is shown in FIG. 8A(2). The current I through the second contact element 54 and the voltage $V_{B',1}$ across the first 50 and third 58 contact elements are measured, and a second resistance value ($R_{B',1}$) is calculated as the voltage $V_{B',1}$ divided by the current I. A first resistance difference ($\Delta R_{BB',1}$) defined as the difference between the first resistance value ($R_{B,1}$) and the second resistance value ($R_{B',1}$) is then calculated:

$$\Delta R_{BB',1} = R_{B,1} - R_{B',1}, \quad \text{(Eq. 5.1)}$$

as well as a first resistance mean ($\overline{R_{BB',1}}$) between the third resistance value ($R_{B,1}$) and the fourth resistance value ($R_{B',1}$):

$$\overline{R_{BB',1}} = (R_{B,1} + R_{B',1})/2 \quad \text{(Eq. 5.2)}$$

An electrical potential is applied across the fifth 56 and seventh 60 contact elements such that a current I is injected in the surface portion through the fifth contact element 56, and at least some of the current is drained through the seventh contact element 60 as is shown in FIG. 8A(3). The current I through the fifth contact element 56 and the voltage $V_{B,2}$ across the sixth 58 and eight 62 contact elements are measured, and a third resistance value ($R_{B,2}$) is calculated as the voltage $V_{B,2}$ divided by the current I. Subsequently, an electrical potential is applied across the sixth 58 and eighth 62 contact elements such that a current I is injected in the surface portion through the sixth element 58, and at least some of the current is drained through the eighth contact element 62, as is shown in FIG. 8A(4). The current I through the sixth contact element 58 and the voltage $V_{B',2}$ across the fifth 56 and seventh 60 contact elements are measured, and a fourth resistance value ($R_{B',2}$) is calculated as the voltage $V_{B',2}$ divided by the current I. A second resistance difference ($\Delta R_{BB',2}$) defined as the difference between the third resistance value ($R_{B,2}$) and the fourth resistance value ($R_{B',2}$) is then calculated:

$$\Delta R_{BB',2} = R_{B,2} - R_{B',2} \quad \text{(Eq. 5.4)}$$

as well as a second resistance mean ($\overline{R_{BB',2}}$) between the third resistance value ($R_{B,2}$) and the fourth resistance value ($R_{B',2}$):

$$\overline{R_{BB',2}} = (R_{B,2} + R_{B',2})/2 \quad \text{(Eq. 5.5)}$$

Figure 9:
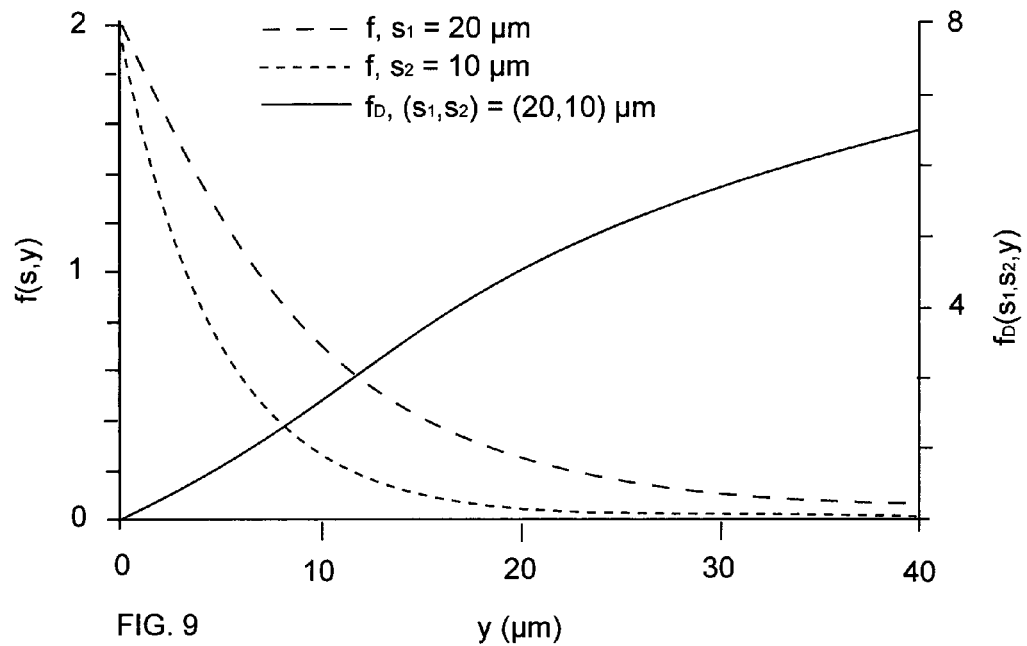
FIG. 9 illustrates relations for determining the distance to an electrical boundary according to the alternative embodiment described in relation to the probe of FIG. 6.

A function is defined corresponding to a mathematical model of a four-point probe:

$$f(s, y) = \frac{\Delta R_{BB'}}{R_H} = \frac{2}{\pi}\left(3\arctan\frac{s}{2y} - \arctan\frac{3s}{2y}\right), \quad \text{(Eq. 5.6)}$$

where s represents the effective spacing between neighbouring probe arms, $\Delta R_{BB'}$ represents the first resistance difference, y represents the distance between the contact points 70-82 and the electrical boundary 34', $\Delta R_{CC'}$ represents the second resistance difference, $R_H$ represents the Hall sheet resistance at the first position of the electrically conducting surface portion 32' where contact is established by the four-point probe 36'. In FIG. 9 the function f(s,y) is shown as function of y for a spacing $s_1$ equal to 20 µm (long dashes) and for a spacing $s_2$ equal to 10 µm (short dashes). A first relation is defined as the ratio between the two functions formed from (Eq. 5.6) by the two different spacings:

$$\frac{\Delta R_{BB',1}}{\Delta R_{BB',2}} = f_D(s_1, s_2, y) = \frac{f(s_1, y)}{f(s_2, y)} = \quad \text{(Eq. 5.7)}$$

$$\frac{\frac{2}{\pi}\left(3\arctan\frac{s_1}{2y} - \arctan\frac{3s_1}{2y}\right)}{\frac{2}{\pi}\left(3\arctan\frac{s_2}{2y} - \arctan\frac{3s_2}{2y}\right)} = \frac{3\arctan\frac{s_1}{2y} - \arctan\frac{3s_1}{2y}}{3\arctan\frac{s_2}{2y} - \arctan\frac{3s_2}{2y}}$$

This relation is shown as a function $f_D(s_1,s_2,y)$ (solid line) of the distance y in the graph of FIG. 9. The measured first ($\Delta R_{BB',1}$) and the second ($\Delta R_{BB',2}$) resistance differences are then used with the first relation (Eq. 5.4) to derive the distance y. For example, a ratio $\Delta R_{CC'}/\Delta R_{BB'}$ of 1 would give a distance y of approximately 19. The measured first resistance difference ($\Delta R_{BB',1}$) and the nominal spacing $s_1=20$ µm together with the relation in Eq. 5.6 then gives the Hall sheet resistance $R_H$. The nominal spacing $s_2=10$ µm can also be used in a similar fashion.

To improve the accuracy of the determining of the distance y, further measurements are made and employed in additional models of the contacting of FIG. 7A. An electrical potential is applied across the first 50 and fourth 62 contact elements such that a current I is injected in the surface portion through the first contact element 50, and at least some of the current is drained through the fourth contact element 62 as is shown in FIG. 8B(1). The current I through the first contact element 50 and the voltage $V_{B,1}$ across the second 54 and third 58 contact elements are measured, and a fifth resistance value ($R_{A,1}$) is calculated as the voltage $V_{A,1}$ divided by the current I. Subsequently, an electrical potential is applied across the second 54 and third 58 contact elements such that a current I is injected in the surface portion through the second element 54, and at least some of the current is drained through the third contact element 58, as is shown in FIG. 8B(2). The current I through the second contact element 54 and the voltage $V_{B',1}$ across the first 50 and fourth 62 contact elements are measured, and a sixth resistance value ($R_{A',1}$) is calculated as the voltage $V_{A',1}$ divided by the current I. A third resistance mean mean ($\overline{R_{AA',1}}$) between the fifth resistance value ($R_{A,1}$) and the sixth resistance value ($R_{A',1}$) is then calculated:

$$\overline{R_{AA',1}} = (R_{A,1} + R_{A',1})/2 \quad \text{(Eq. 5.8)}$$

An electrical potential is applied across the fifth 56 and eighth 62 contact elements such that a current/is injected in the surface portion through the fifth contact element 56, and at least some of the current is drained through the eighth contact element 62 as is shown in FIG. 8B(3). The current I through the fifth contact element 56 and the voltage $V_{B,2}$ across the sixth 58 and seventh 60 contact elements are measured, and a seventh resistance value ($R_{A,2}$) is calculated as the voltage $V_{A,2}$ divided by the current I. Subsequently, an electrical potential is applied across the sixth 58 and seventh 60 contact elements such that a current I is injected in the surface portion through the sixth element 58, and at least some of the current is drained through the seventh contact element 60, as is shown in FIG. 8B(4). The current I through the sixth contact element 58 and the voltage $V_{B',2}$ across the fifth 56 and eighth 62 contact elements are measured, and a eigtth resistance value ($R_{A',2}$) is calculated as the voltage $V_{B',2}$ divided by the current I. A fourth resistance mean ($\overline{R_{AA',2}}$) between the fifth resistance value ($R_{A,1}$) and the sixth resistance value ($R_{A',1}$) is then calculated:

$$\overline{R_{AA',2}} = (R_{A,2} + R_{A',2})/2 \quad \text{(Eq. 5.9)}$$

The van der Pauw equation is defined as:

$$\exp\left(\frac{2\pi \overline{R_{AA'}}}{R_P}\right) - \exp\left(\frac{2\pi \overline{R_{BB'}}}{R_P}\right) = 1, \quad \text{(Eq. 5.10)}$$

where $R_P$ is the pseudo sheet resistance, and the first and third resistance differences ($\overline{R_{BB',1}}$) and ($\overline{R_{AA',1}}$) (Eqs. 5.2 and 5.8) are used in the van der Pauw equation (Eq. 5.10) to derive a first pseudo sheet resistance ($R_{P,1}$). Similarly, the second and fourth resistance differences ($\overline{R_{BB',2}}$) and ($\overline{R_{AA',2}}$) (Eqs. 5.5 and 5.9) are used in the van der Pauw equation (Eq. 5.10) to derive a second pseudo sheet resistance ($R_{P,2}$).

Figure 10:
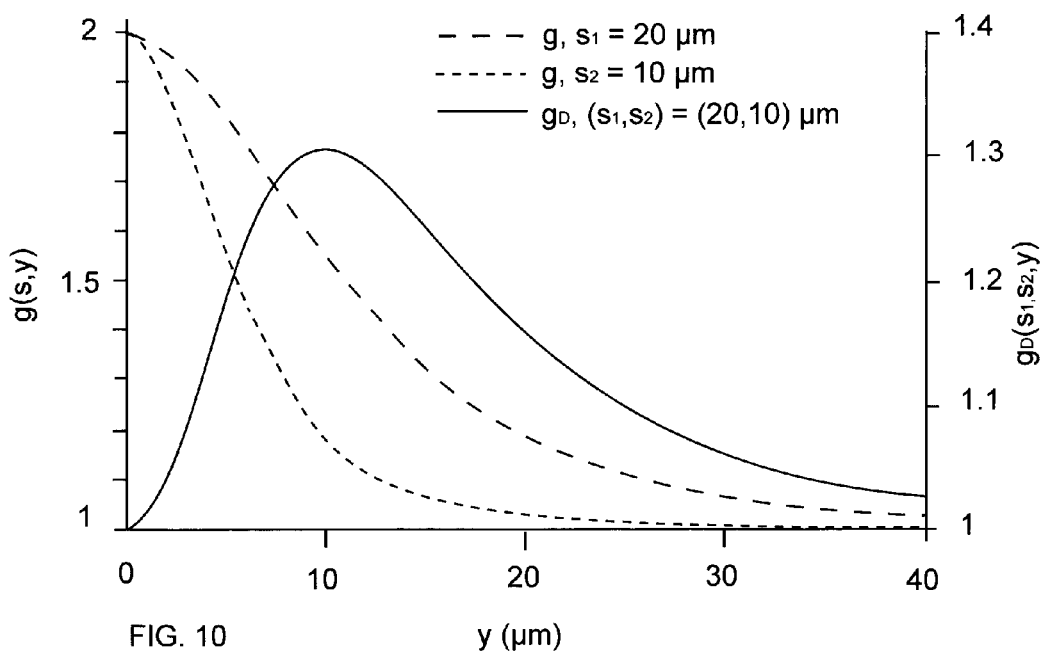
FIG. 10 illustrates additional relations for determining the distance to an electrical boundary according to the alternative embodiment described in relation to the probe of FIG. 6.

A function is defined corresponding to a mathematical model of the four-point probe described in relation to FIG. 6:

$$g(s, y) = \frac{R_P(s, y)}{R_S}, \quad \text{(Eq. 5.11)}$$

where $R_P$ is the pseudo sheet resistance that is regarded as a function of the spacing s between neighbouring probe arms and the distance y between the contact points 70-82 and the electrical boundary 34', and $R_S$ represents the sheet resistance at the contact point. Functions g(s,y) are derived for both the first spacing $s_1=20$ μm and the second spacing $s_2=10$ μm, which are shown in FIG. 10 (long and short dashes, respectively). The two functions are then are used to form a fourth relation:

$$\frac{R_P(s_1, y)}{R_P(s_2, y)} = g_D(s_1, s_2, y) = \frac{g(s_1, y)}{g(s_2, y)}, \quad \text{(Eq. 5.12)}$$

which is also depicted in FIG. 10 (solid line). The first and second pseudo sheet resistances ($R_{P,1}$, $R_{P,2}$) are then used in the fourth relation for deriving a value of the distance y, which can be made graphically from FIG. 10. The function $g_D(s_1,s_2,y)$, which can be derived either analytically or numerically, is not monotone and defines a peak value at a specific distance. Thus, it will not give a unique determination of the distance y. The fourth relation (Eq. 5.12) will typically give a more accurate determination of the distance y than the first relation (Eq. 5.7). The first relation is therefore used to derive an auxiliary distance, which is used to determine which side of the peak value the distance y from the fourth relation, i.e. to uniquely determine the distance y.

In an alternative embodiment, the first relation (Eq. 5.7) and the fourth relation (Eq. 5.12) are modified to take into account a difference in the distance $y_1$ between the first configuration of contact elements and the linear portion 42' and the additional distance $y_2$ between the second configuration of contact elements and the linear portion 42', as described in relation to FIG. 7B. The first relation (Eq. 5.7) is redefined as:

$$\frac{\Delta R_{BB',1}}{\Delta R_{BB',2}} = f_D(s_1, s_2, y_1, y_2) = \quad \text{(Eq. 5.13)}$$

$$\frac{f(s_1, y_1)}{f(s_2, y_2)} = \frac{\frac{2}{\pi}\left(3\arctan\frac{s_1}{2y_1} - \arctan\frac{3s_1}{2y_1}\right)}{\frac{2}{\pi}\left(3\arctan\frac{s_2}{2y_2} - \arctan\frac{3s_2}{2y_2}\right)} =$$

$$\frac{3\arctan\frac{s_1}{2y_1} - \arctan\frac{3s_1}{2y_1}}{3\arctan\frac{s_2}{2y_2} - \arctan\frac{3s_2}{2y_2}},$$

and the fourth relation (Eq. 5.11) is redefined as:

$$\frac{R_P(s_1, y_1)}{R_P(s_2, y_2)} = g_D(s_1, s_2, y_1, y_2) = \frac{g(s_1, y_1)}{g(s_2, y_2)}. \quad \text{(Eq. 5.14)}$$

The two functions $f_D(s_1,s_2,y_1,y_2)$ and $g_D(s_1,s_2,y_1,y_2)$ can be derived analytically or numerically. The derived first (Eq. 5.1) and second (Eq. 5.4) resistance differences together with the first (Eq. 5.2), second (Eq. 5.5), third (Eq. 5.8) and fourth (Eq. 5.9) resistance means and the known nominal spacings $s_1=20$ μm and $s_2=10$ μm are then used in the redefined first (Eq. 5.13) and fourth (Eq. 5.14) relations for simultaneously deriving the distance $y_1$ and the additional distance $y_2$, e.g. by regression analysis.

Points Characterizing the Invention:

1. A method for determining a distance between a first position on an electrically conducting surface portion of a test sample and an electrical boundary of said electrically conducting surface portion by a multi-point probe comprising a first contact element, a second contact element, a third contact element, and a fourth contact element, each contact element defining a contact point for establishing an electrical contact with said test sample, said method comprising:

(i) contacting said test sample with said first contact element, said second contact element, said third contact element, and said fourth contact element at said first position on said electrically conducting surface portion, (ii) applying a magnetic field having a major field component perpendicular to said electrically conducting surface portion at said first position (iii) applying a first electrical potential across said first and third contact elements for generating a first current in said surface portion at said first position, (iv) measuring said first current through said first or said third contact element, (v) measuring a first voltage across said second and fourth contact elements, (vi) calculating a first resistance value ($R_B$) based on said first current and said first voltage, (vii) applying a second electrical potential across said second and fourth contact elements for generating a second current in said surface portion at said first position, (viii) measuring said second current through said second or said fourth contact element, (ix) measuring a second voltage across said first and third contact elements, (x) calculating a second resistance value ($R_{B'}$) based on said second current and said second voltage, (xi) calculating a first resistance difference ($\Delta R_{BB'}$) based on the difference between said first resistance value and said second resistance value, (xii) applying a third electrical potential across said first and second contact elements for generating a third current in said surface portion at said first position, (xiii) measuring said third current through said first or said second contact element, (xiv) measuring a third voltage across said third and fourth contact elements, (xv) calculating a third resistance value ($R_C$) based on said third current and said third voltage, (xvi) applying a fourth electrical potential across said third and fourth contact elements for generating a fourth current in said surface portion at said first position, (xvii) measuring said fourth current through said third or said fourth contact element, (xviii) measuring a fourth voltage across said first and second contact elements, (xix) calculating a fourth resistance value ($R_{C'}$) based on said fourth current and said fourth voltage, (xx) calculating a second resistance difference ($\Delta R_{CC'}$) based on the difference between said third resistance value and said fourth resistance value, (xxi) defining a first relation (f) including a first, a second, and a third parameter representing said first resistance difference, said second resistance difference, and said distance between said first position and said electrical boundary, respectively, (xxii) determining said distance (y) between said first position and said electrical boundary by using said first and said second resistance differences ($\Delta R_{BB'}$, $\Delta R_{CC'}$) as said first and said second parameter, respectively, in said first relation.

2. The method according to point 1 characterized by said contact points defining a first line intersecting each of said contact points.

3. The method according to point 2 characterized by said electrical boundary having an approximately linear portion and the distance between said first position and a point on said linear portion being smaller than the distance between said first position and any point on said electrical boundary outside said linear portion.

4. The method according to point 3 characterized by further comprising:

(xxxiv) orienting said multi-point probe to position said first line in a parallel relationship with said linear portion.

5. The method according to any of the points 1 to 4 characterized by the spacing between said contact points of said first and second contact elements, said second and third contact elements, and said third and fourth contact elements being approximately equal.

6. The method according to any of the points 1 to 5 characterized by said first relation being equivalent to $\Delta R_{CC'}/\Delta R_{BB'}=f(y,s)$, where $\Delta R_{BB'}$ represents said first resistance difference, $\Delta R_{CC'}$ represents said second resistance difference, and f is a function including said distance y between said first position and said electrical boundary and said spacing s between said contact points as parameters.

7. The method according to point 6 characterized by the first resistance difference $\Delta R_{BB'}$ in the relation $\Delta R_{CC'}/\Delta R_{BB'}=f(y,s)$ being equivalent to $\Delta R_{BB'}=2R_H/\pi*(\arctan(a/2y)+\arctan(b/2y)+\arctan(c/2y)-\arctan((a+b+c)/2y))$, where $\Delta R_{BB'}$ represents said additional first difference ($\Delta R_{BB'}$), y represents said distance (y), a represents the spacing between the contact points of said first and second contact elements, b represents the spacing between the contact points of said second and third contact elements, and c represents the spacing between the contact points of said third and fourth contact elements; and said second resistance difference $\Delta R_{CC'}$ in the relation $\Delta R_{CC'}/\Delta R_{BB'}=f(y,s)$ being equivalent to $\Delta R_{CC'}=2R_H/\pi*(\arctan((a+b+c)/2y)+\arctan(b/2y)-\arctan((a+b)/2y)-\arctan((b+c)/2y))$ where $\Delta R_{CC'}$ represents said additional second difference ($\Delta R_{CC'}$), y represents said distance (y), a represents the spacing between the contact points of said first and second contact elements, b represents the spacing between the contact points of said second and third contact elements, and c represents the spacing between the contact points of said third and fourth contact elements.

8. The method according to any of the points 1 to 4 characterized by further comprising:

(xxiii) applying a fifth electrical potential across said first and fourth contact elements for generating a fifth current in said surface portion at said first position, (xxiv) measuring said fifth current through said first or said fourth contact element, (xxv) measuring a fifth voltage across said second and third contact elements, (xxvi) calculating a fifth resistance value ($R_A$) based on said fifth current and said fifth voltage, (xxvii) applying a sixth electrical potential across said second and third contact elements for generating a sixth current in said surface portion at said first position, (xxviii) measuring said sixth current through said second or said third contact element, (xxix) measuring a sixth voltage across said first and fourth contact elements, (xxx) calculating a sixth resistance value ($R_{A'}$) based on said sixth current and said sixth voltage, (xxxi) calculating a third resistance difference ($\Delta R_{AA'}$) based on the difference between said fifth resistance value and said sixth resistance value, (xxxii) in defining said first relation (f) said first relation (f) further includes a fourth parameter representing said third resistance difference ($\Delta R_{AA'}$), and (xxxiii) in determining said distance (y) between said first position and said electrical boundary, said third resistance difference ($\Delta R_{AA'}$) is used as said fourth parameter in said first relation in addition to said first and said second resistance differences ($\Delta R_{BB'}$, $\Delta R_{CC'}$) being used as said first and said second parameter, respectively.

9. The method according to point 8 characterized by said contact points being positioned in-line and the spacing between said contact points of said first and second contact elements and the spacing between said contact points of said second and third contact elements being approximately equal.

10. The method according to any of the points 8 to 9 characterized by said contact points being positioned in-line and the spacing between said contact points of said third and fourth contact elements being different from the spacing between said contact points of said first and second contact.

11. The method according to point 10 characterized by the spacing between said contact points of said third and fourth contact element being greater than the spacing between said contact points of said first and second contact element by a factor in one or more of the ranges 1.1-3.7, 1.2-3.3, 1.3-2.9, 1.4-2.5, 1.5-2.1, and 1.6-1.7, and/or in one of the ranges 1.2-1.3, 1.3-1.4, 1.4-1.5, 1.5-1.6, 1.6-1.7, 1.7-1.8, 1.8-1.9, 1.9-2.0, 2.0-2.2, 2.2-2.4, 2.4-2.6, 2.6-2.8, 2.8-3.0, 3.0-3.3, 3.3-3.6, 3.6-3.9, and/or approximately five divided by three, or by a factor in one or more of the ranges 1.2-3.8, 1.6-3.4, 1.8-3.2, 2.0-3.0, 2.2-2.8, and 2.4-2.6, and/or in one of the ranges 1.2-1.3, 1.3-1.4, 1.4-1.5, 1.5-1.6, 1.6-1.7, 1.7-1.8, 1.8-1.9, 1.9-2.0, 2.0-2.2, 2.2-2.4, 2.4-2.6, 2.6-2.8, 2.8-3.0, 3.0-3.3, 3.3-3.6, 3.6-3.9, and/or approximately five divided by two.

12. The method according to any of the points 8 to 11 characterized by the spacing between said contact points of said first and second contact elements being in one of the ranges 1-5 μm, 5-10 μm, 10-15 μm, 15-20 μm, 20-25 μm, 25-30 μm, 30-40 μm, 40-50 μm, 50-500 μm, and/or in one or more of the ranges 1-50 μm, 5-40 μm, 10-30 μm, 15-25 μm.

13. The method according to any of the points 8 to 12 characterized by said first relation being equivalent to $(\Delta R_{AA'}+\alpha\Delta R_{CC'})/\Delta R_{BB'}=f(y,a,b,c)$, where $\Delta R_{BB'}$ is said first resistance difference, $\Delta R_{CC'}$ is said second resistance difference, $\Delta R_{AA'}$ is said third resistance difference, α is a tuning factor in the range −10 to 10; and f is a function including said distance y between said first position and said electrical boundary and a said spacing between said contact points of said first and second contact elements, b said spacing between said contact points of said second and third contact elements, and c said spacing between said contact points of said third and fourth contact elements.

14. The method according to point 13 characterized by said tuning factor α being approximately 1 or approximately −1.

15. The method according to any of the points 13 to 14 characterized by the first resistance difference $\Delta R_{BB'}$ in the relation $(\Delta R_{AA'}+\alpha\Delta R_{CC'})/\Delta R_{BB'}=f(y,a,b,c)$ being equivalent to $\Delta R_{BB'}=2R_H/\pi*(\arctan(a/2y)+\arctan(b/2y)+\arctan(c/2y)-\arctan((a+b+c)/2y))$, where $\Delta R_{BB'}$ represents said additional first difference ($\Delta R_{AA'}$), y represents said distance (y), a represents the spacing between the contact points of said first and second contact elements, b represents the spacing between the contact points of said second and third contact elements, and c represents the spacing between the contact points of said third and fourth contact elements; said second resistance difference $\Delta R_{CC'}$ in the relation ($\Delta R_{AA'}+\alpha\Delta R_{CC'}$)/$\Delta R_{BB'}$=f(y,a,b,c) being equivalent to $\Delta R_{CC'}$=$2R_H/\pi$*(arctan((a+b+c)/2y)+arctan(b/2y)−arctan((a+b)/2y)−arctan((b+c)/2y)), where $\Delta R_{CC'}$ represents said additional second difference ($\Delta R_{CC'}$), y represents said distance (y), a represents the spacing between the contact points of said first and second contact elements, b represents the spacing between the contact points of said second and third contact elements, and c represents the spacing between the contact points of said third and fourth contact elements; and said third resistance difference $\Delta R_{AA'}$ in the relation ($\Delta R_{AA'}+\alpha\Delta R_{CC'}$)/$\Delta R_{BB'}$=f(y,a,b,c) being equivalent to $\Delta R_{AA'}$=$2R_H/\pi$*(arctan((a+b)/2y)−arctan(a/2y)−arctan((b+c)/2y)+arctan(c/2y)), where $\Delta R_{AA'}$ represents said additional third resistance difference ($\Delta R_{AA'}$), y represents said distance (y), a represents the spacing between the contact points of said first and second contact elements, b represents the spacing between the contact points of said second and third contact elements, and c represents the spacing between the contact points of said third and fourth contact elements.

16. The method according to any of the points 1 to 15 characterized by said spacing between said contact points of said first and second contact elements being in one or more of the ranges 0.1-100 μm, 1-90 μm, 10-80 μm, 20-70 μm, 30-60 μm, and 40-50 μm; and/or in one of the ranges 0.1-1 μm, 1-10 μm, 10-20 μm, 20-30 μm, 30-40 μm, 40-50 μm, 50-60 μm, 60-70 μm, 70-80 μm, 80-90 μm, 90-100 μm, or 100-500 μm.

17. A method for determining an electrical property at a first position on an electrically conducting surface portion of a test sample, said electrically conducting surface portion having an electrical boundary and said method comprising:
(a) determining a distance (y) between said first position on said electrically conducting surface portion of said test sample and said electrical boundary of said electrically conducting surface portion according to any of the points 1 to 16,
(b) defining a second relation including said electrical property and a fifth parameter representing said distance (y), and
(c) determining said electrical property from said second relation by using said distance (y) as said fifth parameter.

18. The method according to point 17 characterized by said second relation further including said spacing between the contact points of said first contact element, said second contact element, said third contact element, and/or said fourth contact element, and:
(b') in defining said second relation, said second relation further includes a ninth parameter representing the spacing between the contact points of said first contact element, said second contact element, said third contact element, and/or said fourth contact element, and
(c') in determining said electrical property, said spacing is used as said ninth parameter in said second relation in addition to said first distance (y).

19. The method according to any of the points 17 to 18 characterized by said electrical property being the Hall sheet resistance ($R_H$) and said second relation ($f_1,f_2$) further including a sixth parameter representing an additional first resistance difference ($\Delta R_{BB'}$), said method further comprising:

(d) applying an additional first electrical potential across said first and third contact elements for generating an additional first current in said surface portion at said first position,
(e) measuring said additional first current through said first or said third contact element,
(f) measuring an additional first voltage across said second and fourth contact elements,
(g) calculating an additional first resistance value ($R_B$) based on said additional first current and said additional first voltage, or
(g') retaining said first resistance value ($R_B$) from said determining of said distance as an additional first resistance value ($R_B$), and
(h) applying an additional second electrical potential across said second and fourth contact elements for generating an additional second current in said surface portion at said first position,
(i) measuring said additional second current through said second or said fourth contact element,
(j) measuring an additional second voltage across said first and third contact elements,
(k) calculating an additional second resistance value ($R_{B'}$) based on said additional second current and said additional second voltage, or
(k') retaining said second resistance value ($R_{B'}$) from said determining of said distance as an additional second resistance value ($R_{B'}$), and
(l) calculating said additional first resistance difference ($\Delta R_{BB'}$) based on the difference between said additional first resistance value and said additional second resistance value, or
(l') retaining said first resistance difference ($\Delta R_{BB'}$) from said determining of said distance as said additional first resistance difference ($\Delta R_{BB'}$).

20. The method according to point 19 characterized by said second relation being equivalent to $\Delta R_{BB'}$=$2R_H/\pi$*(arctan(a/2y)+arctan(b/2y)+arctan(c/2y)−arctan((a+b+c)/2y)) where $\Delta R_{BB'}$ represents said additional first difference ($\Delta R_{BB'}$), y represents said distance (y), a represents the spacing between the contact points of said first and second contact elements, b represents the spacing between the contact points of said second and third contact elements, and c represents the spacing between the contact points of said third and fourth contact elements.

21. The method according to any of the points 17 to 18 characterized by said electrical property being the Hall sheet resistance ($R_H$) and said second relation ($f_2,f_3$) further including a sixth parameter representing an additional second resistance difference ($\Delta R_{CC'}$), said method further comprising:
(d) applying an additional third electrical potential across said first and second contact elements for generating an additional third current in said surface portion at said first position,
(e) measuring said additional third current through said first or said second contact element,
(f) measuring an additional third voltage across said third and fourth contact elements,
(g) calculating an additional third resistance value ($R_C$) based on said additional third current and said additional third voltage, or
(g') retaining said second resistance value ($R_C$) from said determining of said distance as an additional first resistance value ($R_C$), and (h) applying an additional fourth electrical potential across said third and fourth contact elements for generating an additional fourth current in said surface portion at said first position, (i) measuring said additional fourth current through said third or said fourth contact element, (j) measuring an additional fourth voltage across said first and second contact elements, (k) calculating an additional fourth resistance value ($R_{C'}$) based on said additional fourth current and said additional fourth voltage, or (k') retaining said second resistance value ($R_{C'}$) from said determining of said distance as an additional first resistance value ($R_{C'}$), and (l) calculating said additional second resistance difference ($\Delta R_{CC'}$) based on the difference between said additional third resistance value and said additional forth resistance value, or (l') retaining said second resistance difference ($\Delta R_{CC'}$) from said determining of said distance as said additional second resistance difference ($\Delta R_{CC'}$).

22. The method according to point 21 characterized by said second relation being equivalent to $\Delta R_{CC'}=2R_H/\pi^*$(arctan((a+b+c)/2y)+arctan(b/2y)−arctan((a+b)/2y)−arctan((b+c)/2y)), where $\Delta R_{CC'}$ represents said additional second difference ($\Delta R_{CC'}$), y represents said distance (y), a represents the spacing between the contact points of said first and second contact elements, b represents the spacing between the contact points of said second and third contact elements, and c represents the spacing between the contact points of said third and fourth contact elements.

23. The method according to any of the points 17 to 18 characterized by said electrical property being the Hall sheet resistance ($R_H$) and said second relation ($f_1$) further including a sixth parameter representing an additional third resistance difference ($\Delta R_{AA'}$), said method further comprising:

(d) applying an additional fifth electrical potential across said first and fourth contact elements for generating an additional fifth current in said surface portion at said first position, (e) measuring said additional fifth current through said first or said fourth contact element, (f) measuring an additional fifth voltage across said second and third contact elements, (g) calculating an additional fifth resistance value ($R_A$) based on said additional fifth current and said additional fifth voltage, or (g') retaining said fifth resistance value ($R_A$) from said determining of said distance as an additional fifth resistance value ($R_A$), and (h) applying an additional sixth electrical potential across said second and third contact elements for generating an additional sixth current in said surface portion at said first position, (i) measuring said additional sixth current through said second or said third contact element, (j) measuring an additional sixth voltage across said first and fourth contact elements, (k) calculating an additional sixth resistance value ($R_{A'}$) based on said additional sixth current and said additional sixth voltage, or (k') retaining said sixth resistance value ($R_{A'}$) from said determining of said distance as an additional fifth resistance value ($R_{A'}$), and (l) calculating said additional third resistance difference ($\Delta R_{AA'}$) based on the difference between said additional fifth resistance value and said additional sixth resistance value, or (l') retaining said third resistance difference ($\Delta R_{AA'}$) from said determining of said distance as said additional third resistance difference ($\Delta R_{AA'}$).

24. The method according to point 23 characterized by said second relation being equivalent to $\Delta R_{AA'}=2R_H/\pi^*$(arctan((a+b)/2y)−arctan(a/2y)−arctan((b+c)/2y)+arctan(c/2y)), where $\Delta R_{AA'}$ represents said additional third resistance difference ($\Delta R_{AA'}$), y represents said distance (y), a represents the spacing between the contact points of said first and second contact elements, b represents the spacing between the contact points of said second and third contact elements, and c represents the spacing between the contact points of said third and fourth contact elements.

25. The method according to any of the points 17 to 18 characterized by said electrical property being the sheet resistance ($R_0$) and said second relation (g) further including a sixth parameter representing a pseudo sheet resistance ($R_P$), said method further comprising:

(d) applying an additional fifth electrical potential across said first and fourth contact elements for generating an additional fifth current in said surface portion at said first position, (e) measuring said additional fifth current through said first or said fourth contact element, (f) measuring an additional fifth voltage across said second and third contact elements, (g) calculating an additional fifth resistance value ($R_A$) based on said additional fifth current and said additional fifth voltage, or (g') retaining said fifth resistance value ($R_A$) from said determining of said distance as an additional fifth resistance value ($R_A$), and (h) applying an additional sixth electrical potential across said second and third contact elements for generating an additional sixth current in said surface portion at said first position, (i) measuring said additional sixth current through said second or said third contact element, (j) measuring an additional sixth voltage across said first and fourth contact elements, (k) calculating an additional sixth resistance value ($R_{A'}$) based on said additional sixth current and said additional sixth voltage, or (k') retaining said sixth resistance value ($R_{A'}$) from said determining of said distance as an additional fifth resistance value ($R_{A'}$), and (l) calculating a first resistance mean ($\overline{R_{AA'}}$) of said additional fifth resistance value ($R_A$) and said additional sixth resistance value ($R_{A'}$), and (d") applying an additional first electrical potential across said first and third contact elements for generating an additional first current in said surface portion at said first position, (e") measuring said additional first current through said first or said third contact element, (f") measuring an additional first voltage across said second and fourth contact elements, (g") calculating an additional first resistance value ($R_B$) based on said additional first current and said additional first voltage, or (g'") retaining said first resistance value ($R_B$) from said determining of said distance as an additional first resistance value ($R_B$), and (h") applying an additional second electrical potential across said second and fourth contact elements for generating an additional second current in said surface portion at said first position, (i'') measuring said additional second current through said second or said fourth contact element, (j'') measuring an additional second voltage across said first and third contact elements, (k'') calculating an additional second resistance value ($R_{B'}$) based on said additional second current and said additional second voltage, or (k''') retaining said second resistance value ($R_{B'}$) from said determining of said distance as an additional second resistance value ($R'_{B'}$), and (l'') calculating a second resistance mean ($\overline{R_{BB'}}$) of said additional first resistance value ($R_B$) and said additional second resistance value ($R_{B'}$), and (m) defining a third relation including a seventh, eighth, and ninth parameter representing said first resistance mean ($\overline{R_{AA'}}$), said second resistance mean ($\overline{R_{BB'}}$), and said pseudo sheet resistance ($R_P$), respectively, (n) determining said pseudo sheet resistance ($R_P$) by using said first resistance mean ($\overline{R_{AA'}}$) and said second resistance mean ($\overline{R_{BB'}}$) as said seventh parameter and said eighth parameter, respectively, in said third relation.

26. The method according to point 25 characterized by said third relation being equivalent to $\exp(2\pi \cdot \overline{R_{AA'}}/R_P) - \exp(2\pi \cdot \overline{R_{BB'}}/R_P) = 1$, where $R_P$ is said pseudo sheet resistance, $\overline{R_{AA'}}$ is said first resistance mean, and $\overline{R_{BB'}}$ is said second resistance mean.

27. An apparatus for determining a distance between a first position on an electrically conducting surface portion of a test sample and an electrical boundary of said electrically conducting surface portion, said apparatus comprising:

a multi-point probe comprising a first contact element, a second contact element, a third contact element, and a fourth contact element, each contact element defining a contact point for establishing an electrical contact with said test sample, and a control unit adapted for performing the method for determining a distance according to any of the points 1 to 16.

28. An apparatus for determining an electrical property at a first position on an electrically conducting surface portion of a test sample comprising:

a multi-point probe comprising a first contact element, a second contact element, a third contact element, and a fourth contact element, each contact element defining a contact point for establishing an electrical contact with said test sample, and a control unit adapted for performing the method for determining an electrical property at a first position on an electrically conducting surface portion of a test sample according to any of the points 17 to 26.

Additional Points Characterizing the Invention:

1. A method for determining a distance between a first position on an electrically conducting surface portion of a test sample and an electrical boundary of said electrically conducting surface portion by a multi-additional point probe comprising a first contact element, a second contact element, a third contact element, and a fourth contact element, each contact element defining a contact point for establishing an electrical contact with said test sample, said method comprising:

(i.i) contacting said test sample with said first contact element, said second contact element, said third contact element, and said fourth contact element at said first position on said electrically conducting surface portion, (i.ii) applying a magnetic field having a major field component perpendicular to said electrically conducting surface portion at said first position, (i.iii) applying a first electrical potential across said first and third contact elements for generating a first current in said surface portion at said first position, (i.iv) measuring said first current through said first or said third contact element, (i.v) measuring a first voltage across said second and fourth contact elements, (i.vi) calculating a first resistance value ($R_B$) based on said first current and said first voltage, (i.vii) applying a second electrical potential across said second and fourth contact elements for generating a second current in said surface portion at said first position, (i.viii) measuring said second current through said second or said fourth contact element, (i.ix) measuring a second voltage across said first and third contact elements, (i.x) calculating a second resistance value ($R_{B'}$) based on said second current and said second voltage, (i.xi) calculating a first resistance difference ($\Delta R_{BB'}$) based on the difference between said first resistance value and said second resistance value, (i.xii) applying a third electrical potential across said first and second contact elements for generating a third current in said surface portion at said first position, (i.xiii) measuring said third current through said first or said second contact element, (i.xiv) measuring a third voltage across said third and fourth contact elements, (i.xv) calculating a third resistance value ($R_C$) based on said third current and said third voltage, (i.xvi) applying a fourth electrical potential across said third and fourth contact elements for generating a fourth current in said surface portion at said first position, (i.xvii) measuring said fourth current through said third or said fourth contact element, (i.xviii) measuring a fourth voltage across said first and second contact elements, (i.xix) calculating a fourth resistance value ($R_{C'}$) based on said fourth current and said fourth voltage, and (i.xx) calculating a second resistance difference ($\Delta R_{CC'}$) based on the difference between said third resistance value and said fourth resistance value, or in an alternative replacing steps (i.xii) to (i.xx) with:

said multi-additional point probe comprising a plurality of contact elements, each contact element defining a contact point for establishing an electrical contact with said test sample, said plurality of contact elements comprising said first contact element, said second contact element, said third contact element, said fourth contact element and one or more additional contact elements, (ii.xii) defining a first configuration of contact elements of said plurality of contact elements, said first configuration of contact elements being composed of said first contact element, said second contact element, said third contact element, and said fourth contact element, (ii.xiii) defining a second configuration of contact elements of said plurality of contact elements, said second configuration of contact elements being composed of a fifth contact element, a sixth contact element, a seventh contact element, and an eighth contact element, at least one contact element of said second configuration of contact elements being a contact element of said one or more additional contact elements, (ii.xiv) contacting said test sample with said contact elements of said second configuration of contact elements at said first position on said electrically conducting surface portion at the same time as contacting said test sample with said contact elements of said first configuration of contact elements, (ii.xv) applying a third electrical potential across said fifth and seventh contact elements for generating a third current in said surface portion at said first position, (ii.xvi) measuring said third current through said fifth or said seventh contact element, (ii.xvii) measuring a third voltage across said sixth and eighth contact elements, (ii.xviii) calculating a third resistance value ($R_{B,2}$) based on said third current and said third voltage, (ii.xix) applying a fourth electrical potential across said sixth and eighth contact elements for generating a fourth current in said surface portion at said first position, (ii.xx) measuring said fourth current through said sixth or said eighth contact element, (ii.xxi) measuring a fourth voltage across said fifth and seventh contact elements, (ii.xxii) calculating a fourth resistance value ($R_{B',2}$) based on said fourth current and said fourth voltage, and (ii.xxiii) calculating a second resistance difference ($\Delta R_{BB',2}$) based on the difference between said third resistance value and said fourth resistance value, and both the alternative including the steps (i.xii) to (i.xx) and the alternative including the steps (ii.xii) to (ii.xxiii) further comprising:

(i.xxi) defining a first relation (f) including a first, a second, and a third parameter representing said first resistance difference, said second resistance difference, and said distance between said first position and said electrical boundary, respectively, and (i.xxii) employing said first and second resistance differences ($\Delta R_{BB'}$, $\Delta R_{CC'}$, $\Delta R_{BB',2}$) as said first and second parameters, respectively, in said first relation for determining said third parameter representing said distance (y) between said first position and said electrical boundary.

2. The method according to additional point 1 and said alternative replacing steps (i.xii) to (i.xx) characterized by:

(iii.xxiv) calculating a first resistance mean ($\overline{R_{BB',1}}$) of said first resistance value ($R_B$) and said second resistance value ($R_{B'}$), (iii.xxv) calculating a second resistance mean ($\overline{R_{BB',2}}$) of said third resistance value ($R_{B,2}$) and said fourth resistance value ($R_{B',2}$), and (iii.xxvi) applying a fifth electrical potential across said first and fourth contact elements for generating a fifth current in said surface portion at said first position, (iii.xxvii) measuring said fifth current through said first or said fourth contact element, (iii.xxviii) measuring a fifth voltage across said second and third contact elements, (iii.xxix) calculating a fifth resistance value ($R_{A,1}$) based on said fifth current and said fifth voltage, (iii.xxx) applying a sixth electrical potential across said second and third contact elements for generating a sixth current in said surface portion at said first position, (iii.xxxi) measuring said sixth current through said second or said third contact element, (iii.xxxii) measuring a sixth voltage across said first and fourth contact elements, (iii.xxxiii) calculating a sixth resistance value ($R_{A',1}$) based on said sixth current and said sixth voltage, (iii.xxxiv) calculating a third resistance mean ($\overline{R_{AA',1}}$) of said fifth resistance value ($R_{A,1}$) and said sixth resistance value ($R_{A',1}$), and (iii.xxxv) applying a seventh electrical potential across said fifth and eighth contact elements for generating a seventh current in said surface portion at said first position, (iii.xxxvi) measuring said seventh current through said fifth or said eighth contact element, (iii.xxxvii) measuring a seventh voltage across said sixth and seventh contact elements, (iii.xxxviii) calculating a seventh resistance value ($R_{A,2}$) based on said seventh current and said seventh voltage, (iii.xxxix) applying an eighth electrical potential across said sixth and seventh contact elements for generating an eighth current in said surface portion at said first position, (iii.xl) measuring said eighth current through said sixth or said seventh contact element, (iii.xli) measuring an eighth voltage across said fifth and eighth contact elements, (iii.xlii) calculating an eighth resistance value ($R_{A',2}$) based on said eighth current and said eighth voltage, (iii.xliii) calculating a fourth resistance mean ($\overline{R_{AA',2}}$) of said seventh resistance value ($R_{A,2}$) and said eighth resistance value ($R_{A',2}$), (iii.xliv) defining a second relation including a fourth, fifth, and sixth parameter representing said first resistance mean ($\overline{R_{BB',1}}$), said third resistance mean ($\overline{R_{AA',1}}$), and a first pseudo sheet resistance ($R_{P,1}$), respectively, (iii.xlv) employing said first resistance mean ($\overline{R_{BB',1}}$) and said third resistance mean ($\overline{R_{AA',1}}$) as said fourth parameter and said fifth parameter, respectively, in said second relation for determining said sixth parameter representing said first pseudo sheet resistance ($R_{P,1}$), (iii.xlvi) defining a third relation including a seventh, eighth, and ninth parameter representing said second resistance mean ($\overline{R_{BB',2}}$), said fourth resistance mean ($\overline{R_{AA',1}}$), and a second pseudo sheet resistance ($R_{P,2}$), respectively, (iii.xlvii) employing said second resistance mean ($\overline{R_{BB',2}}$) and said fourth resistance mean ($\overline{R_{AA',2}}$) as said seventh parameter and said eighth parameter, respectively, in said third relation for determining said ninth parameter representing said second pseudo sheet resistance ($R_{P,2}$), (iii.xlviii) defining a fourth relation ($g_D$) including a tenth, an eleventh, and a twelfth parameter representing said first pseudo sheet resistance ($R_{P,1}$), said second pseudo sheet resistance ($R_{P,2}$), and said distance between said first position and said electrical boundary, respectively, and (iii.xlix) employing said first and said second pseudo sheet resistances ($R_{P,1}$, $R_{P,2}$) as said tenth and eleventh parameter, respectively, in said fourth relation ($g_D$) for determining said twelfth parameter representing an additional distance (y) between said first position and said electrical boundary, or in an alternative replacing step (iii.xlix) with:

said contact elements of said second configuration representing an additional distance ($y_2$) between said first position on said electrically conducting surface portion of said test sample and said electrical boundary of said electrically conducting surface portion, said first relation ($f_D$) further including a thirteenth parameter representing said additional distance between said first position and said electrical boundary, said fourth relation ($g_D$) further including a fourteenth parameter representing said additional distance between said first position and said electrical boundary, and said method further comprising:

(iv.xlix) employing said first and said second pseudo sheet resistances ($R_{P,1}$, $R_{P,2}$) as said tenth and eleventh parameter, respectively, in said fourth relation ($g_D$) for simultaneously determining said thirteenth parameter and said fourteenth parameter representing said distance (y) and said additional distance (y₂) between said first position and said electrical boundary, respectively.

3. The method according to additional points 2 and said alternative including step (iii.xlix) characterized by said fourth relation being equivalent to $R_{P,1}/R_{P,2}=g_D(y)$, where $R_{P,1}$ represents said first pseudo sheet resistance, $R_{P,2}$ represents said second pseudo sheet resistance, and $g_D$ represents a function including said distance y as a parameter, said function $g_D$ defining a peak value at a specific distance, and said function $g_D$ increasing as a function of said distance below said specific distance and decreasing as a function of said distance above said specific distance, said method further comprising:

(iii.xlx) comparing said distance and said specific distance to determine if said additional distance is below or above said specific distance in said fourth relation.

4. A method for determining a distance between a first position on an electrically conducting surface portion of a test sample and an electrical boundary of said electrically conducting surface portion by a multi-additional point probe comprising a plurality of contact elements, each contact element defining a contact point for establishing an electrical contact with said test sample, said plurality of contact elements comprising a first contact element, a second contact element, a third contact element, a fourth contact element and one or more additional contact elements, said method comprising:

(v.i) defining a first configuration of contact elements of said plurality of contact elements, said first configuration of contact elements being composed of said first contact element, said second contact element, said third contact element, and said fourth contact element, (v.ii) defining a second configuration of contact elements of said plurality of contact elements, said second configuration of contact elements being composed of a fifth contact element, a sixth contact element, a seventh contact element, and an eighth contact element, at least one contact element of said second configuration of contact elements being a contact element of said one or more additional contact elements, (v.iii-iv) contacting said test sample with said contact elements of said first and second configurations of contact elements at said first position on said electrically conducting surface portion, (v.v) applying a magnetic field having a major field component perpendicular to said electrically conducting surface portion at said first position (v.vi) applying a first electrical potential across said first and third contact elements for generating a first current in said surface portion at said first position, (v.vii) measuring said first current through said first or said third contact element, (v.viii) measuring a first voltage across said second and fourth contact elements, (v.ix) calculating a first resistance value ($R_B$) based on said first current and said first voltage, (v.x) applying a second electrical potential across said second and fourth contact elements for generating a second current in said surface portion at said first position, (v.xi) measuring said second current through said second or said fourth contact element, (v.xii) measuring a second voltage across said first and third contact elements, (v.xiii) calculating a second resistance value ($R_{B'}$) based on said second current and said second voltage, (v.xiv) calculating a first resistance mean ($\overline{R_{BB',1}}$) of said first resistance value ($R_B$) and said second resistance value ($R_{B'}$), (v.xv) applying a third electrical potential across said fifth and seventh contact elements for generating a third current in said surface portion at said first position, (v.xvi) measuring said third current through said fifth or said seventh contact element, (v.xvii) measuring a third voltage across said sixth and eighth contact elements, (v.xviii) calculating a third resistance value ($R_{B,2}$) based on said third current and said third voltage, (v.xix) applying a fourth electrical potential across said sixth and eighth contact elements for generating a fourth current in said surface portion at said first position, (v.xx) measuring said fourth current through said sixth or said eighth contact element, (v.xxi) measuring a fourth voltage across said fifth and seventh contact elements, (v.xxii) calculating a fourth resistance value ($R_{B',2}$) based on said fourth current and said fourth voltage, (v.xxv) calculating a second resistance mean ($\overline{R_{BB',2}}$) of said third resistance value ($R_{B,2}$) and said fourth resistance value ($R_{B',2}$), and (v.xxvi) applying a fifth electrical potential across said first and fourth contact elements for generating a fifth current in said surface portion at said first position, (v.xxvii) measuring said fifth current through said first or said fourth contact element, (v.xxviii) measuring a fifth voltage across said second and third contact elements, (v.xxix) calculating a fifth resistance value ($R_{A,1}$) based on said fifth current and said fifth voltage, (v.xxx) applying a sixth electrical potential across said second and third contact elements for generating a sixth current in said surface portion at said first position, (v.xxxi) measuring said sixth current through said second or said third contact element, (v.xxxii) measuring a sixth voltage across said first and fourth contact elements, (v.xxxiii) calculating a sixth resistance value ($R_{A',1}$) based on said sixth current and said sixth voltage, (v.xxxiv) calculating a third resistance mean ($\overline{R_{AA',1}}$) of said fifth resistance value ($R_{A,1}$) and said sixth resistance value ($R_{A',1}$), and (v.xxxv) applying a seventh electrical potential across said fifth and eighth contact elements for generating a seventh current in said surface portion at said first position, (v.xxxvi) measuring said seventh current through said fifth or said eighth contact element, (v.xxxvii) measuring a seventh voltage across said sixth and seventh contact elements, (v.xxxviii) calculating a seventh resistance value ($R_{A,2}$) based on said seventh current and said seventh voltage, (v.xxxix) applying an eighth electrical potential across said sixth and seventh contact elements for generating an eighth current in said surface portion at said first position, (v.xl) measuring said eighth current through said sixth or said seventh contact element, (v.xli) measuring an eighth voltage across said fifth and eighth contact elements, (v.xlii) calculating an eighth resistance value ($R_{A',2}$) based on said eighth current and said eighth voltage, (v.xliii) calculating a fourth resistance mean ($\overline{R_{AA',2}}$) of said seventh resistance value ($R_{A,2}$) and said eighth resistance value ($R_{A',2}$), (v.xliv) defining a second relation including a fourth, fifth, and sixth parameter representing said first resistance mean ($\overline{R_{BB',1}}$), said third resistance mean ($\overline{R_{AA',1}}$), and a first pseudo sheet resistance ($R_{P,1}$), respectively, (v.xlv) employing said first resistance mean ($\overline{R_{BB',1}}$) and said third resistance mean ($\overline{R_{AA',1}}$) as said fourth parameter and said fifth parameter, respectively, in said second relation for determining said sixth parameter representing said first pseudo sheet resistance ($R_{P,1}$), (v.xlvi) defining a third relation including a seventh, eighth, and ninth parameter representing said second resistance mean ($\overline{R_{BB',2}}$), said fourth resistance mean ($\overline{R_{AA',2}}$), and a second pseudo sheet resistance ($R_{P,2}$), respectively, (v.xlvii) employing said second resistance mean ($\overline{R_{BB',2}}$) and said fourth resistance mean ($\overline{R_{AA',2}}$) as said seventh parameter and said eighth parameter, respectively, in said third relation for determining said ninth parameter representing said second pseudo sheet resistance ($R_{P,2}$), (v.xlviii) defining a fourth relation ($g_D$) including a tenth, an eleventh, and a twelfth parameter representing said first pseudo sheet resistance ($R_{P,1}$), said second pseudo sheet resistance ($R_{P,2}$), and said distance between said first position and said electrical boundary, respectively, and (v.xlix) employing said first and said second pseudo sheet resistances ($R_{P,1}$, $R_{P,2}$) as said tenth and eleventh parameter, respectively, in said fourth relation ($g_D$) for determining said twelfth parameter representing a value of said distance ($y$) between said first position and said electrical boundary.

5. The method according to additional point 4 characterized by said fourth relation being equivalent to $R_{P,1}/R_{P,2}=g_D(y)$, where $R_{P,1}$ represents said first pseudo sheet resistance, $R_{P,2}$ represents said second pseudo sheet resistance, and $g_D$ represents a function including said distance $y$ as a parameter, said function $g_D$ defining a peak value at a specific distance, and said function $g_D$ increasing as a function of said distance below said specific distance and decreasing as a function of said distance above said specific distance, and the method further comprising:

(v.xlx) determining a distance by the method according to any of the additional points 1 to 3 for representing an auxiliary distance, and (v.xlxi) comparing said auxiliary distance and said specific distance to determine if said distance is below or above said specific distance in said fourth relation.

6. The method according to any of the additional points 1 to 5 characterized by said contact points defining a first line intersecting each of said contact points.

7. The method according to any of the additional points 1 to 6 characterized by said contact points of said first contact element, said second contact element, said third contact element, said fourth contact element, and said one or more additional contact elements defining a first line intersecting each of said contact points prior to said contact points contacting said test sample.

8. The method according to additional point 7 characterised by said contact points of said first contact element, said second contact element, said third contact element, and said fourth contact element, being located in the given order along said first line.

9. The method according to additional point 8 characterised by said contact points of said fifth contact element, said sixth contact element, said seventh contact element, and said eighth contact element, being located in the given order along said first line.

10. The method according to any of the additional points 8 to 9 characterized the spacing between said contact points of said first and second contact elements, said second and third contact elements, and said third and fourth contact elements being approximately equal to a first spacing value ($s_1$).

11. The method according to any of the additional points 8 to 10 characterized the spacing between said contact points of said fifth and sixth contact elements, said sixth and seventh contact elements, and said seventh and eighth contact elements being approximately equal to a second spacing value ($s_2$).

12. The method according to additional point 11 and said alternative replacing steps (i.xii) to (i.xx) characterized by said first relation being equivalent to $\Delta R_{BB}/\Delta R_{BB',2}=f_D(y,s_1,s_2)$, where $\Delta R_{BB'}$ represents said first resistance difference, $\Delta R_{BB',2}$ represents said second resistance difference, and $f_D$ is a function including said distance $y$ between said first position and said electrical boundary, said first spacing value $s_1$, and said second spacing value $s_2$.

13. The method according to additional point 12 characterized by the function $f_D(y,s_1,s_2)$ in said first relation $\Delta R_{BB}/\Delta R_{BB',2}=f_D(y,s_1,s_2)$ being equivalent to $(3*\arctan(s_1/2y)-\arctan(3s_1/2y))/(3*\arctan(s_2/2y)-\arctan(3s_2/2y))$.

14. The method according to any of the additional points 2 to 13 characterized by said second relation being equivalent to $\exp(2\pi \cdot \overline{R_{AA',1}}/R_{P,1})-\exp(2\pi \cdot \overline{R_{BB',1}}/R_{P,1})=1$, where $R_{P,1}$ is said first pseudo sheet resistance, $\overline{R_{BB',1}}$ is said first resistance mean, and $\overline{R_{AA',1}}$ is said third resistance mean; and said third relation being equivalent to $\exp(2\pi \cdot \overline{R_{AA',2}}/R_{P,2})-\exp(2\pi \cdot \overline{R_{BB',2}}/R_{P,2})=1$, where $R_{P,2}$ is said second pseudo sheet resistance, $\overline{R_{BB',2}}$ is said second resistance mean, and $\overline{R_{AA',2}}$ is said fourth resistance mean.

15. The method according to any of the additional points 2 to 14 and said alternative including step (iii.xlix) characterized by said fourth relation being equivalent to $R_{P,1}/R_{P,2}=g_D(y,s_1,s_2)$, where $R_{P,1}$ represents said first pseudo sheet resistance, $R_{P,2}$ represents said second pseudo sheet resistance, and $g_D$ represents a function including said distance $y$ between said first position and said electrical boundary, said first spacing value $s_1$, and said second spacing value $s_2$.

16. The method according to any of the additional points 2 to 14 and said alternative replacing step (iii.xlix) characterized by said first relation being equivalent to $\Delta R_{BB}/\Delta R_{BB',2}=f_D(y,y_2,s_1,s_2)$, where $\Delta R_{BB'}$ represents said first resistance difference, $\Delta R_{BB',2}$ represents said second resistance difference, and $f_D$ is a function including said distance $y$ and said additional distance $y_2$ between said first position and said electrical boundary, said first spacing value $s_1$, and said second spacing value $s_2$.

17. The method according to additional point 12 characterized by the function $f_D(y,y_2,s_1,s_2)$ in said first relation $\Delta R_{BB}/\Delta R_{BB',2}=f_D(y,y_2,s_1,s_2)$ being equivalent to $(3*\arctan(s_1/2y)-\arctan(3s_1/2y))/(3*\arctan(s_2/2y_2)-\arctan(3s_2/2y_2))$.

18. The method according to any of the additional points 2 to 14 and said alternative replacing step (iii.xlix) characterized by said fourth relation being equivalent to $R_{P,1}/R_{P,2}=g_D(y,y_2,s_1,s_2)$, $R_{P,1}$ represents said first pseudo sheet resistance, $R_{P,2}$ represents said second pseudo sheet resistance, and $g_D$ represents a function including said distance $y$ and said additional distance $y_2$ between said first position and said electrical boundary, said first spacing value $s_1$, and said second spacing value $s_2$.

19. The method according to any of the additional points 6 to 18 characterized by said electrical boundary having an approximately linear portion and the distance between said first position and a additional point on said linear portion being smaller than the distance between said first position and any additional point on said electrical boundary outside said linear portion.

20. The method according to additional point 19 characterized by further comprising:

(vi.i) orienting said multi-additional point probe to position said first line in a parallel relationship with said linear portion.

21. The method according to any of the additional points 1 to 20 characterized by the spacing between said contact points of said first and second contact elements, said second and third contact elements, and said third and fourth contact elements being approximately equal.

22. The method according to any of the additional points 1 to 21 and said alternative including steps (i.xii) to (i.xx) characterized by said first relation being equivalent to $\Delta R_{CC'}/\Delta R_{BB'}=f(y,s)$, where $\Delta R_{BB'}$ represents said first resistance difference, $\Delta R_{CC'}$ represents said second resistance difference, and f is a function including said distance y between said first position and said electrical boundary and said spacing s between said contact points as parameters.

23. The method according to additional point 22 characterized by the first resistance difference $\Delta R_{BB'}$ in the relation $\Delta R_{CC'}/\Delta R_{BB'}=f(y,s)$ being equivalent to $\Delta R_{BB'}=2R_H/\pi*(\arctan(a/2y)+\arctan(b/2y)+\arctan(c/2y)-\arctan((a+b+c)/2y))$, where $\Delta R_{BB'}$ represents said additional first difference ($\Delta R_{BB'}$), y represents said distance (y), a represents the spacing between the contact points of said first and second contact elements, b represents the spacing between the contact points of said second and third contact elements, and c represents the spacing between the contact points of said third and fourth contact elements; and said second resistance difference $\Delta R_{CC'}$, in the relation $\Delta R_{CC'}/\Delta R_{BB'}=f(y,s)$ being equivalent to $\Delta R_{CC'}=2R_H/\pi*(\arctan((a+b+c)/2y)+\arctan(b/2y)-\arctan((a+b)/2y)-\arctan((b+c)/2y))$ where $\Delta R_{CC'}$ represents said additional second difference ($\Delta R_{CC'}$), y represents said distance (y), a represents the spacing between the contact points of said first and second contact elements, b represents the spacing between the contact points of said second and third contact elements, and c represents the spacing between the contact points of said third and fourth contact elements.

24. The method according to any of the additional points 1 to 23 and said alternative including steps (i.xii) to (i.xx) characterized by further comprising:

(i.xxiii) applying a fifth electrical potential across said first and fourth contact elements for generating a fifth current in said surface portion at said first position, (i.xxiv) measuring said fifth current through said first or said fourth contact element, (i.xxv) measuring a fifth voltage across said second and third contact elements, (i.xxvi) calculating a fifth resistance value ($R_A$) based on said fifth current and said fifth voltage, (i.xxvii) applying a sixth electrical potential across said second and third contact elements for generating a sixth current in said surface portion at said first position, (i.xxviii) measuring said sixth current through said second or said third contact element, (i.xxix) measuring a sixth voltage across said first and fourth contact elements, (i.xxx) calculating a sixth resistance value ($R_{A'}$) based on said sixth current and said sixth voltage, (i.xxxi) calculating a third resistance difference ($\Delta R_{AA'}$) based on the difference between said fifth resistance value and said sixth resistance value, (i.xxxii) in defining said first relation (f) said first relation (f) further includes a fourth parameter representing said third resistance difference ($\Delta R_{AA'}$), and (i.xxxiii) in determining said distance (y) between said first position and said electrical boundary, said third resistance difference ($\Delta R_{AA'}$) is used as said fourth parameter in said first relation in addition to said first and said second resistance differences ($\Delta R_{BB'}$, $\Delta R_{CC'}$) being used as said first and said second parameter, respectively.

25. The method according to any of the additional points 1 to 24 characterized by said contact points being positioned in-line and the spacing between said contact points of said first and second contact elements and the spacing between said contact points of said second and third contact elements being approximately equal.

26. The method according to any of the additional points 1 to 25 characterized by said contact points being positioned in-line and the spacing between said contact points of said third and fourth contact elements being different from the spacing between said contact points of said first and second contact elements.

27. The method according to additional point 26 characterized by the spacing between said contact points of said third and fourth contact element being greater than the spacing between said contact points of said first and second contact element by a factor in one or more of the ranges 1.1-3.7, 1.2-3.3, 1.3-2.9, 1.4-2.5, 1.5-2.1, and 1.6-1.7, and/or in one of the ranges 1.2-1.3, 1.3-1.4, 1.4-1.5, 1.5-1.6, 1.6-1.7, 1.7-1.8, 1.8-1.9, 1.9-2.0, 2.0-2.2, 2.2-2.4, 2.4-2.6, 2.6-2.8, 2.8-3.0, 3.0-3.3, 3.3-3.6, 3.6-3.9, and/or approximately five divided by three, or by a factor in one or more of the ranges 1.2-3.8, 1.6-3.4, 1.8-3.2, 2.0-3.0, 2.2-2.8, and 2.4-2.6, and/or in one of the ranges 1.2-1.3, 1.3-1.4, 1.4-1.5, 1.5-1.6, 1.6-1.7, 1.7-1.8, 1.8-1.9, 1.9-2.0, 2.0-2.2, 2.2-2.4, 2.4-2.6, 2.6-2.8, 2.8-3.0, 3.0-3.3, 3.3-3.6, 3.6-3.9, and/or approximately five divided by two.

28. The method according to any of the additional points 1 to 27 characterized by the spacing between said contact points of said first and second contact elements being in one of the ranges 1-5 μm, 5-10 μm, 10-15 μm, 15-20 μm, 20-25 μm, 25-30 μm, 30-40 μm, 40-50 μm, 50-500 μm, and/or in one or more of the ranges 1-50 μm, 5-40 μm, 10-30 μm, 15-25 μm.

29. The method according to any of the additional points 24 to 28 characterized by said first relation being equivalent to $(\Delta R_{AA'}+\Delta R_{CC'})/\Delta R_{BB'}=f(y,a,b,c)$, where $\Delta R_{BB'}$ is said first resistance difference, $\Delta R_{CC'}$ is said second resistance difference, $\Delta R_{AA'}$ is said third resistance difference, α is a tuning factor in the range −10 to 10; and f is a function including said distance y between said first position and said electrical boundary and a said spacing between said contact points of said first and second contact elements, b said spacing between said contact points of said second and third contact elements, and c said spacing between said contact points of said third and fourth contact elements.

30. The method according to additional point 29 characterized by said tuning factor α being approximately 1 or approximately −1.

31. The method according to any of the additional points 29 to 30 characterized by the first resistance difference $\Delta R_{BB'}$ in the relation $(\Delta R_{AA'}+\alpha\Delta R_{CC'})/\Delta R_{BB'}=f(y,a,b,c)$ being equivalent to $\Delta R_{BB'}=2R_H/\pi*(\arctan(a/2y)+\arctan(b/2y)+\arctan(c/2y)-\arctan((a+b+c)/2y))$, where $\Delta R_{BB'}$ represents said additional first difference ($\Delta R_{AA'}$), y represents said distance (y), a represents the spacing between the contact points of said first and second contact elements, b represents the spacing between the contact points of said second and third contact elements, and c represents the spacing between the contact points of said third and fourth contact elements; said second resistance difference $\Delta R_{CC'}$ in the relation $(\Delta R_{AA'}+\alpha\Delta R_{CC'})/\Delta R_{BB'}=f(y,a,b,c)$ being equivalent to $\Delta R_{CC'}=2R_H/\pi^*(\arctan((a+b+c)/2y)+\arctan(b/2y)-\arctan((a+b)/2y)-\arctan((b+c)/2y))$, where $\Delta R_{CC'}$ represents said additional second difference ($\Delta R_{CC'}$), y represents said distance (y), a represents the spacing between the contact points of said first and second contact elements, b represents the spacing between the contact points of said second and third contact elements, and c represents the spacing between the contact points of said third and fourth contact elements; and said third resistance difference $\Delta R_{AA'}$ in the relation $(\Delta R_{AA'}+\alpha\Delta R_{CC'})/\Delta R_{BB'}=f(y,a,b,c)$ being equivalent to $\Delta R_{AA'}=2R_H/\pi^*(\arctan((a+b)/2y)-\arctan(a/2y)-\arctan((b+c)/2y)+\arctan(c/2y))$, where $\Delta R_{AA'}$ represents said additional third resistance difference ($\Delta R_{AA'}$), y represents said distance (y), a represents the spacing between the contact points of said first and second contact elements, b represents the spacing between the contact points of said second and third contact elements, and c represents the spacing between the contact points of said third and fourth contact elements.

32. The method according to any of the additional points 1 to 31 characterized by said spacing between said contact points of said first and second contact elements being in one or more of the ranges 0.1-100 µm, 1-90 µm, 10-80 µm, 20-70 µm, 30-60 µm, and 40-50 µm; and/or in one of the ranges 0.1-1 µm, 1-10 µm, 10-20 µm, 20-30 µm, 30-40 µm, 40-50 µm, 50-60 µm, 60-70 µm, 70-80 µm, 80-90 µm, 90-100 µm, or 100-500 µm.

33. A method for determining an electrical property at a first position on an electrically conducting surface portion of a test sample, said electrically conducting surface portion having an electrical boundary and said method comprising:
(a) determining a distance (y) between said first position on said electrically conducting surface portion of said test sample and said electrical boundary of said electrically conducting surface portion according to any of the additional points 1 to 32,
(b) defining a fifth relation including said electrical property and a fifteenth parameter representing said distance (y), and
(c) employing said distance (y) as said fifteenth parameter in said fifth relation for determining said electrical property, or alternatively said method comprising:
(a) determining an additional distance ($y_2$) between said first position on said electrically conducting surface portion of said test sample and said electrical boundary of said electrically conducting surface portion according to any of the additional points 2 to 32,
(b) defining a fifth relation including said electrical property and a fifteenth parameter representing said additional distance ($y_2$), and
(c) employing said additional distance ($y_2$) as said fifteenth parameter in said fifth relation for determining said electrical property.

34. The method according to additional point 33 characterized by said fifth relation further including said spacing between the contact points of said first contact element, said second contact element, said third contact element, and/or said fourth contact element, and:
(b') in defining said fifth relation, said fifth relation further includes a sixteenth parameter representing the spacing between the contact points of said first contact element, said second contact element, said third contact element, and/or said fourth contact element, and
(c') in determining said electrical property, said spacing is used as said sixteenth parameter in said fifth relation in addition to said first distance (y) or said additional distance ($y_2$).

35. The method according to any of the additional points 33 to 34 characterized by said electrical property being the Hall sheet resistance ($R_H$) and said fifth relation ($f_1,f_2$) further including a seventeenth parameter representing an additional first resistance difference ($\Delta R_{BB'}$), said method further comprising:
(d) applying an additional first electrical potential across said first and third contact elements for generating an additional first current in said surface portion at said first position,
(e) measuring said additional first current through said first or said third contact element,
(f) measuring an additional first voltage across said second and fourth contact elements, and
(g) calculating an additional first resistance value ($R_B$) based on said additional first current and said additional first voltage, or
(g') retaining said first resistance value ($R_B$) from said determining of said distance as an additional first resistance value ($R_B$), and
(h) applying an additional second electrical potential across said second and fourth contact elements for generating an additional second current in said surface portion at said first position,
(i) measuring said additional second current through said second or said fourth contact element,
(j) measuring an additional second voltage across said first and third contact elements, and
(k) calculating an additional second resistance value ($R_{B'}$) based on said additional second current and said additional second voltage, or
(k') retaining said second resistance value ($R_{B'}$) from said determining of said distance as an additional second resistance value ($R_{B'}$), and
(l) calculating said additional first resistance difference ($\Delta R_{BB'}$) based on the difference between said additional first resistance value and said additional second resistance value, or
(l') retaining said first resistance difference ($\Delta R_{BB'}$) from said determining of said distance as said additional first resistance difference ($\Delta R_{BB'}$).

36. The method according to additional point 35 characterized by said fifth relation being equivalent to $\Delta R_{BB'}=2R_H/\pi^*(\arctan(a/2y)+\arctan(b/2y)+\arctan(c/2y)-\arctan((a+b+c)/2y))$ where $\Delta R_{BB'}$ represents said additional first difference ($\Delta R_{BB'}$), y represents said distance (y) or said additional distance, a represents the spacing between the contact points of said first and second contact elements, b represents the spacing between the contact points of said second and third contact elements, and c represents the spacing between the contact points of said third and fourth contact elements.

37. The method according to any of the additional points 35 to 36 characterized by said electrical property being the Hall sheet resistance ($R_H$) and said fifth relation ($f_2,f_3$) further including a seventeenth parameter representing an additional second resistance difference ($\Delta R_{CC'}$), said method further comprising:
(d) applying an additional third electrical potential across said first and second contact elements for generating an additional third current in said surface portion at said first position,
(e) measuring said additional third current through said first or said second contact element,
(f) measuring an additional third voltage across said third and fourth contact elements, and (g) calculating an additional third resistance value ($R_C$) based on said additional third current and said additional third voltage, or in said alternative including steps (i.xii) to (i.xx):

(g') retaining said third resistance value ($R_C$) from said determining of said distance as an additional third resistance value ($R_C$), and (h) applying an additional fourth electrical potential across said third and fourth contact elements for generating an additional fourth current in said surface portion at said first position, (i) measuring said additional fourth current through said third or said fourth contact element, (j) measuring an additional fourth voltage across said first and second contact elements, and (k) calculating an additional fourth resistance value ($R_C$) based on said additional fourth current and said additional fourth voltage, or in said alternative including steps (i.xii) to (i.xx):

(k') retaining said fourth resistance value ($R_{C'}$) from said determining of said distance as an additional fourth resistance value ($R_{C'}$), and (l) calculating said additional second resistance difference ($\Delta R_{CC'}$) based on the difference between said additional third resistance value and said additional forth resistance value, or in said alternative including steps (i.xii) to (i.xx):

(l') retaining said second resistance difference ($\Delta R_{CC'}$) from said determining of said distance as said additional second resistance difference ($\Delta R_{CC'}$).

38. The method according to additional point 37 characterized by said fifth relation being equivalent to $\Delta R_{CC'}=2R_H/\pi^*(\arctan((a+b+c)/2y)+\arctan(b/2y)-\arctan((a+b)/2y)-\arctan((b+c)/2y))$, where $\Delta R_{CC'}$ represents said additional second difference ($\Delta R_{CC'}$), y represents said distance (y) or said additional distance, a represents the spacing between the contact points of said first and second contact elements, b represents the spacing between the contact points of said second and third contact elements, and c represents the spacing between the contact points of said third and fourth contact elements.

39. The method according to any of the additional points 33 to 34 characterized by said electrical property being the Hall sheet resistance ($R_H$) and said fifth relation ($f_1$) further including a seventeenth parameter representing an additional third resistance difference ($\Delta R_{AA'}$), said method further comprising:

(d) applying an additional fifth electrical potential across said first and fourth contact elements for generating an additional fifth current in said surface portion at said first position, (e) measuring said additional fifth current through said first or said fourth contact element, (f) measuring an additional fifth voltage across said second and third contact elements, and (g) calculating an additional fifth resistance value ($R_A$) based on said additional fifth current and said additional fifth voltage, or (g') retaining said fifth resistance value ($R_A$) from said determining of said distance as an additional fifth resistance value ($R_A$), and (h) applying an additional sixth electrical potential across said second and third contact elements for generating an additional sixth current in said surface portion at said first position, (i) measuring said additional sixth current through said second or said third contact element, (j) measuring an additional sixth voltage across said first and fourth contact elements, and (k) calculating an additional sixth resistance value ($R_{A'}$) based on said additional sixth current and said additional sixth voltage, or (k') retaining said sixth resistance value ($R_{A'}$) from said determining of said distance as an additional fifth resistance value ($R_{A'}$), and (l) calculating said additional third resistance difference ($\Delta R_{AA'}$) based on the difference between said additional fifth resistance value and said additional sixth resistance value, or (l') retaining said third resistance difference ($\Delta R_{AA'}$) from said determining of said distance as said additional third resistance difference ($\Delta R_{AA'}$).

40. The method according to additional point 39 characterized by said fifth relation being equivalent to $\Delta R_{AA'}=2R_H/\pi^*(\arctan((a+b)/2y)-\arctan(a/2y)-\arctan((b+c)/2y)+\arctan(c/2y))$, where $\Delta R_{AA'}$ represents said additional third resistance difference ($\Delta R_{AA'}$), y represents said distance (y) or said additional distance, a represents the spacing between the contact points of said first and second contact elements, b represents the spacing between the contact points of said second and third contact elements, and c represents the spacing between the contact points of said third and fourth contact elements.

41. The method according to any of the additional points 33 to 34 characterized by said electrical property being the sheet resistance ($R_0$) and said fifth relation (g) further including a seventeenth parameter representing a pseudo sheet resistance ($R_P$), said method further comprising:

(d) applying an additional fifth electrical potential across said first and fourth contact elements for generating an additional fifth current in said surface portion at said first position, (e) measuring said additional fifth current through said first or said fourth contact element, (f) measuring an additional fifth voltage across said second and third contact elements, (g) calculating an additional fifth resistance value ($R_A$) based on said additional fifth current and said additional fifth voltage, or (g') retaining said fifth resistance value ($R_A$) from said determining of said distance as an additional fifth resistance value ($R_A$), and (h) applying an additional sixth electrical potential across said second and third contact elements for generating an additional sixth current in said surface portion at said first position, (i) measuring said additional sixth current through said second or said third contact element, (j) measuring an additional sixth voltage across said first and fourth contact elements, (k) calculating an additional sixth resistance value ($R_{A'}$) based on said additional sixth current and said additional sixth voltage, or (k') retaining said sixth resistance value ($R_{A'}$) from said determining of said distance as an additional fifth resistance value ($R_{A'}$), and (l) calculating a fifth resistance mean ($\overline{R_{AA'}}$) of said additional fifth resistance value ($R_A$) and said additional sixth resistance value ($R_{A'}$), and (d") applying an additional first electrical potential across said first and third contact elements for generating an additional first current in said surface portion at said first position, (e") measuring said additional first current through said first or said third contact element, (f″) measuring an additional first voltage across said second and fourth contact elements, (g″) calculating an additional first resistance value ($R_B$) based on said additional first current and said additional first voltage, or (g‴) retaining said first resistance value ($R_B$) from said determining of said distance as an additional first resistance value ($R_B$), and (h″) applying an additional second electrical potential across said second and fourth contact elements for generating an additional second current in said surface portion at said first position, (i″) measuring said additional second current through said second or said fourth contact element, (j″) measuring an additional second voltage across said first and third contact elements, (k″) calculating an additional second resistance value ($R_{B'}$) based on said additional second current and said additional second voltage, or (k‴) retaining said second resistance value ($R_{B'}$) from said determining of said distance as an additional second resistance value ($R'_B$), and (l″) calculating a sixth resistance mean ($\overline{R_{BB'}}$) of said additional first resistance value ($R_B$) and said additional second resistance value ($R_{B'}$), and (m) defining a sixth relation including a eighteenth, nineteenth, and twentieth parameter representing said fifth resistance mean ($\overline{R_{AA'}}$), said sixth resistance mean ($\overline{R_{BB'}}$), and said pseudo sheet resistance ($R_P$), respectively, (n) determining said pseudo sheet resistance ($R_P$) by using said fifth resistance mean ($\overline{R_{AA'}}$) and said sixth resistance mean ($\overline{R_{BB'}}$) as said eighteenth parameter and said nineteenth parameter, respectively, in said sixth relation.

42. The method according to additional point 41 characterized by said sixth relation being equivalent to $\exp(2\pi \cdot \overline{R_{AA'}}/R_P) - \exp(2\pi \cdot \overline{R_{BB'}}/R_P) = 1$, where $R_P$ is said pseudo sheet resistance, $\overline{R_{AA'}}$ is said first resistance mean, and $\overline{R_{BB'}}$ is said second resistance mean.

43. An apparatus for determining a distance between a first position on an electrically conducting surface portion of a test sample and an electrical boundary of said electrically conducting surface portion, said apparatus comprising:
   a multi-additional point probe comprising a first contact element, a second contact element, a third contact element, and a fourth contact element, each contact element defining a contact point for establishing an electrical contact with said test sample, and
   a control unit adapted for performing the method for determining a distance or additional distance according to any of the additional points 1 to 32.

44. An apparatus for determining an electrical property at a first position on an electrically conducting surface portion of a test sample comprising:
   a multi-additional point probe comprising a first contact element, a second contact element, a third contact element, and a fourth contact element, each contact element defining a contact point for establishing an electrical contact with said test sample, and
   a control unit adapted for performing the method for determining an electrical property at a first position on an electrically conducting surface portion of a test sample according to any of the additional points 33 to 42.

ITEM LIST 12 second contact element
14 third contact element
16 fourth contact element
18 probe body
20 contact point of the first contact element
22 contact point of the second contact element
24 contact point of the third contact element
26 contact point of the fourth contact element
30 test sample
32 surface portion
33 side surface
34 electrical boundary
36 multi-point probe
40 common line
42 linear portion
44 electrically non-conducting surface portion
50-62 contact elements
70-82 contact points
90 common line

The invention claimed is:

1. A method for determining an electrical property at a single position on an electrically conducting surface portion of a test sample, said electrically conducting surface portion having an electrical boundary, said method comprising the steps of:
   (a) determining a first distance (y) between the single position on the electrically conducting surface portion of the test sample and the electrical boundary of said electrically conducting surface portion by a multi-point probe comprising at least first, second, third, fourth, fifth, sixth, seventh, and eighth contact elements, each contact element defining a contact point for establishing an electrical contact with said test sample, said step of determining the first distance (y) comprising the sub-steps of:
      (1) contacting said test sample with said first contact element, said second contact element, said third contact element, and said fourth contact element at said single position on said electrically conducting surface portion;
      (2) applying a magnetic field having a major field component perpendicular to said electrically conducting surface portion at said single position;
      (3) applying a first electrical potential across said first and third contact elements for generating a first current in said electrically conducting surface portion at said single position;
      (4) measuring said first current through one of said first and third contact elements;
      (5) measuring a first voltage across said second and fourth contact elements;
      (6) calculating a first resistance value ($R_B$) based on said first current and said first voltage;
      (7) without moving any of said contact elements relative to said test sample, applying a second electrical potential across said second and fourth contact elements for generating a second current in said electrically conducting surface portion at said single position;
      (8) measuring said second current through one of said second and fourth contact elements;
      (9) measuring a second voltage across said first and third contact elements;
      (10) calculating a second resistance value ($R_{B'}$) based on said second current and said second voltage;
      (11) calculating a first resistance difference ($\Delta R_{BB'}$) based on the difference between said first resistance value and said second resistance value;

(12) defining a first configuration of contact elements comprising said first, second, third, and fourth contact elements;
(13) defining a second configuration of contact elements comprising said fifth, sixth, seventh, and eighth contact elements;
(14) contacting said test sample with said contact elements of said second configuration of contact elements at said single position on said electrically conducting surface portion at the same time as contacting said test sample with said contact elements of said first configuration of contact elements at said single position;
(15) applying a third electrical potential across said fifth and seventh contact elements for generating a third current in said electrically conducting surface portion at said single position;
(16) measuring said third current through one of said fifth and seventh contact elements;
(17) measuring a third voltage across said sixth and eighth contact elements;
(18) calculating a third resistance value ($R_{B,2}$) based on said third current and said third voltage;
(19) applying a fourth electrical potential across said sixth and eighth contact elements for generating a fourth current in said electrically conducting surface portion at said single position;
(21) measuring said fourth current through one of said sixth and eighth contact elements;
(22) measuring a fourth voltage across said fifth and seventh contact elements;
(23) calculating a fourth resistance value ($R_{B',2}$) based on said fourth current and said fourth voltage;
(24) calculating a second resistance difference ($\Delta R_{BB',2}$) based on the difference between said third resistance value and said fourth resistance value;
(25) defining a first relation (f) including a first, second, and third parameters representing said first resistance difference, said second resistance difference, and said first distance (y) between said single position and said electrical boundary, respectively; and
(26) employing said first and second resistance differences ($\Delta R_{BB'}$, $\Delta R_{BB',2}$) as said first and second parameters, respectively, in said first relation for determining said third parameter representing said first distance (y) between said single position and said electrical boundary;
(b) determining an additional distance ($y_2$) between said single position on said electrically conducting surface portion of said test sample and said electrical boundary of said electrically conducting surface portion according to step (a);
(c) defining a second relation ($f_2$) including said electrical property and a fourth parameter representing said additional distance ($y_2$); and
(d) employing said additional distance ($y_2$) as said fourth parameter in said second relation ($f_2$) for determining said electrical property.

2. The method according to claim 1, wherein said electrical property is Hall sheet resistance ($R_H$), and wherein said second relation ($f_2$) further includes a fifth parameter representing an additional second resistance difference ($\Delta R_{CC'}$), said method further comprising:
(e) without moving any of said contact elements relative to said test sample, applying an additional third electrical potential across said first and second contact elements for generating an additional third current in said electrically conducting surface portion at said single position;
(f) measuring said additional third current through said one of first and second contact elements;
(g) measuring an additional third voltage across said third and fourth contact elements;
(h) calculating an additional third resistance value ($R_C$) based on said additional third current and said additional third voltage;
(i) without moving any of said contact elements relative to said test sample, applying an additional fourth electrical potential across said third and fourth contact elements for generating an additional fourth current in said electrically conducting surface portion at said single position;
(j) measuring said additional fourth current through one of said third and fourth contact elements;
(k) measuring an additional fourth voltage across said first and second contact elements;
(l) calculating an additional fourth resistance value ($R_{C'}$) based on said additional fourth current and said additional fourth voltage; and
(m) calculating said additional second resistance difference ($\Delta R_{CC'}$) based on the difference between said additional third resistance value and said additional fourth resistance value.

3. The method according to claim 1, wherein said second relation ($f_2$) further includes a spacing between any two adjacent contact points of said first, second, third, and fourth contact elements; wherein said second relation ($f_2$) further includes a fifth parameter representing the spacing between any two adjacent contact points of said first, second, third, and fourth contact elements; and wherein, in determining said electrical property, said spacing is used as said fifth parameter in said second relation ($f_2$) in addition to one of said first distance (y) and said additional distance ($y_2$).

4. The method according claim 1, wherein said electrical property is Hall sheet resistance ($R_H$), and wherein said second relation ($f_2$) further includes a fifth parameter representing an additional first resistance difference ($\Delta R_{BB'}$), said method further comprising:
(e) without moving any of said contact elements relative to said test sample, applying an additional first electrical potential across said first and third contact elements for generating an additional first current in said electrically conducting surface portion at said single position;
(f) measuring said additional first current through one of said first and third contact elements;
(g) measuring an additional first voltage across said second and fourth contact elements;
(h) calculating an additional first resistance value ($R_B$) based on said additional first current and said additional first voltage;
(i) without moving any of said contact elements relative to said test sample, applying an additional second electrical potential across said second and fourth contact elements for generating an additional second current in said electrically conducting surface portion at said single position;
(j) measuring said additional second current through one of said second and fourth contact elements;
(k) measuring an additional second voltage across said first and third contact elements;

(l) calculating an additional second resistance value ($R_{B'}$) based on said additional second current and said additional second voltage; and (m) calculating said additional first resistance difference ($\Delta R_{BB'}$) based on the difference between said additional first resistance value and said additional second resistance value.

5. The method according to claim 1, wherein said electrical property is Hall sheet resistance ($R_H$), and wherein said second relation ($f_2$) further includes a fifth parameter representing an additional first resistance difference ($\Delta R_{BB'}$), said method further comprising:

(e) without moving any of said contact elements relative to said test sample, applying an additional first electrical potential across said first and third contact elements for generating an additional first current in said electrically conducting surface portion at said single position;

(f) measuring said additional first current through one of said first and third contact elements;

(g) measuring an additional first voltage across said second and fourth contact elements;

(h) retaining said first resistance value ($R_B$) as an additional first resistance value ($R_B$);

(i) without moving any of said contact elements relative to said test sample, applying an additional second electrical potential across said second and fourth contact elements for generating an additional second current in said electrically conducting surface portion at said single position;

(j) measuring said additional second current through one of said second and fourth contact elements;

(k) measuring an additional second voltage across said first and third contact elements; and (l) retaining said second resistance value ($R_{B'}$) as an additional second resistance value ($R_{B'}$); and (m) retaining said first resistance difference ($\Delta R_{BB'}$) as said additional first resistance difference ($\Delta R_{BB'}$).

6. The method according to claim 1, wherein said electrical property is Hall sheet resistance ($R_H$), and wherein said second relation ($f_2$) further includes a fifth parameter representing an additional a third resistance difference ($\Delta R_{AA'}$), said method further comprising:

(e) without moving any of said contact elements relative to said test sample, applying a fifth electrical potential across said first and fourth contact elements for generating a fifth current in said electrically conducting surface portion at said single position;

(f) measuring said fifth current through one of said first and fourth contact elements;

(g) measuring a fifth voltage across said second and third contact elements;

(h) calculating a fifth resistance value ($R_A$) based on said fifth current and said fifth voltage;

(i) without moving any of said contact elements relative to said test sample, applying a sixth electrical potential across said second and third contact elements for generating a sixth current in said surface portion at said single position;

(j) measuring said additional sixth current through one of said second and third contact elements;

(k) measuring a sixth voltage across said first and fourth contact elements;

(l) calculating a sixth resistance value ($R_{A'}$) based on said sixth current and said additional sixth voltage; and (m) calculating said third resistance difference ($\Delta R_{AA'}$) based on the difference between said fifth resistance value and said sixth resistance value.

7. The method according to claim 1, wherein said electrical property is Hall sheet resistance ($R_H$), and wherein said second relation ($f_2$) further includes a fifth parameter representing an additional third resistance difference ($\Delta R_{AA'}$), said method further comprising:

(e) without moving any of said contact elements relative to said test sample, applying a fifth electrical potential across said first and fourth contact elements for generating a fifth current in said electrically conducting surface portion at said single position;

(f) measuring said fifth current through one of said first and fourth contact elements;

(g) measuring a fifth voltage across said second and third contact elements, and calculating a fifth resistance value ($R_A$) based on said fifth current and said fifth voltage;

(h) retaining said fifth resistance value ($R_A$) as an additional fifth resistance value ($R_A$);

(i) without moving any of said contact elements relative to said test sample, applying a sixth electrical potential across said second and third contact elements for generating a sixth current in said electrically conducting surface portion at said single position;

(j) measuring said sixth current through one of said second and third contact elements;

(k) measuring a sixth voltage across said first and fourth contact elements, and calculating a sixth resistance value ($R_{A'}$) based on said sixth current and said sixth voltage;

(l) retaining said sixth resistance value ($R_{A'}$) as an additional sixth resistance value ($R_{A'}$); and (m) retaining said third resistance difference ($\Delta R_{AA'}$) as said additional third resistance difference ($\Delta R_{AA'}$).

8. The method according to claim 1, wherein said electrical property is sheet resistance ($R_0$), and wherein said second relation ($f_2$) further includes a fifth parameter representing a pseudo sheet resistance ($R_P$), said method further comprising:

(e) without moving any of said contact elements relative to said test sample, applying a fifth electrical potential across said first and fourth contact elements for generating a fifth current in said electrically conducting surface portion at said single position;

(f) measuring said fifth current through one of said first and fourth contact elements;

(g) measuring a fifth voltage across said second and third contact elements, and calculating a fifth resistance value ($R_A$) based on said fifth current and said fifth voltage;

(h) retaining said fifth resistance value ($R_A$) as an additional fifth resistance value ($R_A$);

(i) without moving any of said contact elements relative to said test sample, applying a sixth electrical potential across said second and third contact elements for generating a sixth current in said electrically conducting surface portion at said single position;

(j) measuring said sixth current through one of said second and third contact elements;

(k) measuring a sixth voltage across said first and fourth contact elements, and calculating a sixth resistance value ($R_{A'}$) based on said sixth current and said sixth voltage;

(l) retaining said sixth resistance value ($R_{A'}$) as an additional fifth resistance value ($R_{A'}$);

(m) calculating a fifth resistance mean ($\overline{R_{AA'}}$) of said additional fifth resistance value ($R_A$) and said additional sixth resistance value ($R_{A'}$);

(n) without moving any of said contact elements relative to said test sample, applying an additional first electrical potential across said first and third contact elements for generating an additional first current in said electrically conducting surface portion at said single position;

(o) measuring said additional first current through one of said first and third contact elements;

(p) measuring an additional first voltage across said second and fourth contact elements;

(q) calculating an additional first resistance value ($R_B$) based on said additional first current and said additional first voltage;

(r) without moving any of said contact elements relative to said test sample, applying an additional second electrical potential across said second and fourth contact elements for generating an additional second current in said electrically conducting surface portion at said single position;

(s) measuring said additional second current through one of said second and fourth contact elements;

(t) measuring an additional second voltage across said first and third contact elements;

(u) calculating an additional second resistance value ($R_{B'}$) based on said additional second current and said additional second voltage;

(v) calculating a sixth resistance mean ($\overline{R_{BB'}}$) of said additional first resistance value ($R_B$) and said additional second resistance value ($R_{B'}$);

(w) defining a third relation including fifth, six, and seventh parameters representing said fifth resistance mean ($\overline{R_{AA'}}$), said sixth resistance mean ($\overline{R_{BB'}}$), and said pseudo sheet resistance ($R_P$), respectively; and (x) determining said pseudo sheet resistance ($R_P$) by using said fifth resistance mean ($\overline{R_{AA'}}$) and said sixth resistance mean ($\overline{R_{BB'}}$) as said fifth parameter and said sixth parameter, respectively, in said third relation.

9. The method according to claim 1, wherein said electrical property is sheet resistance ($R_0$), and wherein said second relation ($f_2$) further includes a fifth parameter representing a pseudo sheet resistance ($R_P$), said method further comprising:

(e) without moving any of said contact elements relative to said test sample, applying a fifth electrical potential across said first and fourth contact elements for generating an additional fifth current in said electrically conducting surface portion at said single position;

(f) measuring said fifth current through said one of first and fourth contact elements;

(g) measuring a fifth voltage across said second and third contact elements, and calculating a fifth resistance value ($R_A$) based on said fifth current and said fifth voltage;

(h) retaining said fifth resistance value ($R_A$) as an additional fifth resistance value ($R_A$);

(i) without moving any of said contact elements relative to said test sample, applying a sixth electrical potential across said second and third contact elements for generating a sixth current in said electrically conducting surface portion at said single position;

(j) measuring said sixth current through one of said second and third contact elements;

(k) measuring a sixth voltage across said first and fourth contact elements, and calculating a sixth resistance ($R_{A'}$) value based on said sixth current and said sixth voltage;

(l) retaining said sixth resistance value ($R_{A'}$) as an additional fifth resistance value ($R_{A'}$);

(m) calculating a fifth resistance mean ($\overline{R_{AA'}}$) of said additional fifth resistance value ($R_A$) and said additional sixth resistance value ($R_{A'}$);

(n) without moving any of said contact elements relative to said test sample, applying an additional first electrical potential across said first and third contact elements for generating an additional first current in said electrically conducting surface portion at said single position;

(o) measuring said additional first current through one of said first and third contact elements;

(p) measuring an additional first voltage across said second and fourth contact elements;

(q) retaining said first resistance value ($R_B$) from said determining of said first distance as an additional first resistance value ($R_B$);

(r) without moving any of said contact elements relative to said test sample, applying an additional second electrical potential across said second and fourth contact elements for generating an additional second current in said electrically conducting surface portion at said single position;

(s) measuring said additional second current through one of said second and fourth contact elements;

(t) measuring an additional second voltage across said first and third contact elements;

(u) retaining said second resistance value ($R_{B'}$) as an additional second resistance value ($R_{B'}$);

(v) calculating a sixth resistance mean ($\overline{R_{BB'}}$) of said additional first resistance value ($R_B$) and said additional second resistance value ($R_{B'}$);

(w) defining a third relation including fifth, sixth, and seventh parameters representing said fifth resistance mean ($\overline{R_{AA'}}$), said sixth resistance mean ($\overline{R_{BB'}}$), and said pseudo sheet resistance ($R_P$), respectively; and (x) determining said pseudo sheet resistance ($R_P$) by using said fifth resistance mean ($\overline{R_{AA'}}$) and said sixth resistance mean ($\overline{R_{BB'}}$) as said fifth parameter and said sixth parameter, respectively, in said third relation.

10. A method for determining an electrical property at a single position on an electrically conducting surface portion of a test sample, said electrically conducting surface portion having an electrical boundary, said method comprising the steps of:

(a) determining a first distance between the single position on the electrically conducting surface portion of a test sample and the electrical boundary of said electrically conducting surface portion by a multi-point probe comprising a plurality of contact elements and one or more additional contact elements, each contact element defining a contact point for establishing an electrical contact with said test sample, said step of determining the first distance comprising the sub-steps of:

(1) defining a first configuration of contact elements of said plurality of contact elements, said first configuration of contact elements comprising first, second, third, and fourth contact elements;

(2) defining a second configuration of contact elements of said plurality of contact elements, said second configuration of contact elements comprising fifth, sixth, seventh, and eighth contact elements, at least one contact element of said second configuration of contact elements being a contact element of said one or more additional contact elements;

(3) contacting said test sample with said contact elements of said first and second configurations of contact elements at said single position on said electrically conducting surface portion;

(4) applying a magnetic field having a major field component perpendicular to said electrically conducting surface portion at said single position;

(5) applying a first electrical potential across said first and third contact elements for generating a first current in said electrically conducting surface portion at said single position;

(6) measuring said first current through one of said first and third contact elements;

(7) measuring a first voltage across said second and fourth contact elements;

(8) calculating a first resistance value ($R_B$) based on said first current and said first voltage;

(9) without moving any of said contact elements relative to said test sample, applying a second electrical potential across said second and fourth contact elements for generating a second current in said electrically conducting surface portion at said single position;

(10) measuring said second current through one of said second and fourth contact elements;

(11) measuring a second voltage across said first and third contact elements;

(12) calculating a second resistance value ($R_{B'}$) based on said second current and said second voltage;

(13) calculating a first resistance mean ($\overline{R_{BB',1}}$) of said first resistance value ($R_B$) and said second resistance value ($R_{B'}$);

(14) without moving any of said contact elements relative to said test sample, applying a third electrical potential across said fifth and seventh contact elements for generating a third current in said electrically conducting surface portion at said single position;

(15) measuring said third current through one of said fifth and seventh contact elements;

(16) measuring a third voltage across said sixth and eighth contact elements;

(17) calculating a third resistance value ($R_{B,2}$) based on said third current and said third voltage;

(18) without moving any of said contact elements relative to said test sample, applying a fourth electrical potential across said sixth and eighth contact elements for generating a fourth current in said electrically conducting surface portion at said single position;

(19) measuring said fourth current through one of said sixth and eighth contact elements;

(20) measuring a fourth voltage across said fifth and seventh contact elements;

(21) calculating a fourth resistance value ($R_{B',2}$) based on said fourth current and said fourth voltage;

(22) calculating a second resistance mean ($\overline{R_{BB',2}}$) of said third resistance value ($R_{B,2}$) and said fourth resistance value ($R_{B',2}$);

(23) without moving any of said contact elements relative to said test sample, applying a fifth electrical potential across said first and fourth contact elements for generating a fifth current in said electrically conducting surface portion at said single position;

(24) measuring said fifth current through one of said first and fourth contact elements;

(25) measuring a fifth voltage across said second and third contact elements;

(26) calculating a fifth resistance value ($R_{A,1}$) based on said fifth current and said fifth voltage;

(27) without moving any of said contact elements relative to said test sample, applying a sixth electrical potential across said second and third contact elements for generating a sixth current in said electrically conducting surface portion at said single position;

(28) measuring said sixth current through one of said second and third contact elements;

(29) measuring a sixth voltage across said first and fourth contact elements;

(30) calculating a sixth resistance value ($R_{A',1}$) based on said sixth current and said sixth voltage;

(31) calculating a third resistance mean ($\overline{R_{AA',1}}$) of said fifth resistance value ($R_{A,1}$) and said sixth resistance value ($R_{A',1}$);

(32) without moving any of said contact elements relative to said test sample, applying a seventh electrical potential across said fifth and eighth contact elements for generating a seventh current in said electrically conducting surface portion at said single position;

(33) measuring said seventh current through one of said fifth and eighth contact elements;

(34) measuring a seventh voltage across said sixth and seventh contact elements;

(35) calculating a seventh resistance value ($R_{A,2}$) based on said seventh current and said seventh voltage;

(36) without moving any of said contact elements relative to said test sample, applying an eighth electrical potential across said sixth and seventh contact elements for generating an eighth current in said electrically conducting surface portion at said single position;

(37) measuring said eighth current through one of said sixth and seventh contact elements;

(38) measuring an eighth voltage across said fifth and eighth contact elements;

(39) calculating an eighth resistance value ($R_{A',2}$) based on said eighth current and said eighth voltage;

(40) calculating a fourth resistance mean ($\overline{R_{AA',2}}$) of said seventh resistance value ($R_{A,2}$) and said eighth resistance value ($R_{A',2}$);

(41) defining a first relation including fourth, fifth, and sixth parameters representing said first resistance mean ($\overline{R_{BB',1}}$), said third resistance mean ($\overline{R_{AA',1}}$), and a first pseudo sheet resistance ($R_{P,1}$), respectively;

(42) employing said first resistance mean ($\overline{R_{BB',1}}$) and said third resistance mean ($\overline{R_{AA',2}}$) as said fourth parameter and said fifth parameter, respectively, in said first relation for determining said sixth parameter representing said first pseudo sheet resistance ($R_{P,1}$);

(43) defining a second relation including seventh, eighth, and ninth parameters representing said second resistance mean ($\overline{R_{BB',2}}$), said fourth resistance mean ($\overline{R_{AA',2}}$), and a second pseudo sheet resistance ($R_{P,2}$), respectively;

(44) employing said second resistance mean ($\overline{R_{BB',2}}$) and said fourth resistance mean ($\overline{R_{AA',2}}$) as said seventh parameter and said eighth parameter, respectively, in said second relation for determining said ninth parameter representing said second pseudo sheet resistance ($R_{P,2}$);

(45) defining a third relation ($g_D$) including tenth, eleventh, and twelfth parameters representing said first pseudo sheet resistance ($R_{P,1}$), said second pseudo sheet resistance ($R_{P,2}$), and said distance between said single position and said electrical boundary, respectively; and

(46) employing said first and said second pseudo sheet resistances ($R_{P,1}$, $R_{P,2}$) as said tenth and eleventh parameter, respectively, in said third relation ($g_D$) for determining said twelfth parameter representing a value of said first distance (y) between said single position and said electrical boundary;

(b) determining an additional distance ($y_2$) between said single position on said electrically conducting surface portion of said test sample and said electrical boundary of said electrically conducting surface portion according to step (a);

(c) defining a fourth relation including said electrical property and a thirteenth parameter representing said additional distance ($y_2$); and (d) employing said additional distance ($y_2$) as said thirteenth parameter in said fourth relation for determining said electrical property.

\* \* \* \* \*